(12) United States Patent
Yukinobu et al.

(10) Patent No.: US 9,701,849 B2
(45) Date of Patent: *Jul. 11, 2017

(54) METHOD OF MANUFACTURING TRANSPARENT CONDUCTIVE FILM, THE TRANSPARENT CONDUCTIVE FILM, ELEMENT AND TRANSPARENT CONDUCTIVE SUBSTRATE USING THE FILM, AS WELL AS DEVICE USING THE SUBSTRATE

(75) Inventors: Masaya Yukinobu, Chiba (JP); Takahito Nagano, Chiba (JP); Yoshihiro Otsuka, Chiba (JP)

(73) Assignee: SUMITOMO METAL MINING CO., LTD., Tokyo (JP)

( * ) Notice: Subject to any disclaimer, the term of this patent is extended or adjusted under 35 U.S.C. 154(b) by 347 days.

This patent is subject to a terminal disclaimer.

(21) Appl. No.: 13/579,380

(22) PCT Filed: Feb. 15, 2011

(86) PCT No.: PCT/JP2011/053171
§ 371 (c)(1),
(2), (4) Date: Aug. 16, 2012

(87) PCT Pub. No.: WO2011/102350
PCT Pub. Date: Aug. 25, 2011

(65) Prior Publication Data
US 2012/0313055 A1    Dec. 13, 2012

(30) Foreign Application Priority Data

Feb. 17, 2010  (JP) ................................. 2010-032426
Jun. 8, 2010   (JP) ................................. 2010-131190

(51) Int. Cl.
B05D 3/06   (2006.01)
B05D 3/04   (2006.01)
(Continued)

(52) U.S. Cl.
CPC .............. *C09D 5/24* (2013.01); *C09D 11/101* (2013.01); *C23C 18/1216* (2013.01);
(Continued)

(58) Field of Classification Search
CPC ............ C23C 18/1208; C23C 18/1216; C23C 18/125–18/1266; C23C 18/1275;
(Continued)

(56) References Cited

U.S. PATENT DOCUMENTS 4,369,208 A   1/1983  Okunaka et al.
4,420,500 A  12/1983  Nakatani et al.
(Continued)

FOREIGN PATENT DOCUMENTS

JP    57-13870    1/1982
JP    57-36714    2/1982
(Continued)

OTHER PUBLICATIONS

Brian McNoldy, "Temperature, Dew point, and Relative Humidity Calculator" from website ://Andrew.rsmass.Miami.Edu/bmcnoldy/humidity.HTML; 15 one-page calculations therefrom (no website date, printed Dec. 8, 2014).*

(Continued)

*Primary Examiner* — Marianne L Padgett
(74) *Attorney, Agent, or Firm* — Gerald E. Hespos; Michael J. Porco; Matthew T. Hespos

(57) ABSTRACT

By using a coating method, which is a simple method of manufacturing a transparent conductive film at low cost, a transparent conductive film formed with heating at a low temperature, in particular, lower than 300° C. with both of excellent transparency and conductivity and also with excellent film strength and a method of manufacturing this transparent conductive film are provided.

14 Claims, 9 Drawing Sheets

(51) Int. Cl.
| | | |
|---|---|---|
| *B05D 5/06* | (2006.01) | |
| *B05D 5/12* | (2006.01) | |
| *C09D 5/24* | (2006.01) | |
| *C23C 18/14* | (2006.01) | |
| *H01L 31/18* | (2006.01) | |
| *C23C 18/12* | (2006.01) | |
| *C09D 11/101* | (2014.01) | |

(52) U.S. Cl.
CPC ...... *C23C 18/1275* (2013.01); *C23C 18/1279* (2013.01); *C23C 18/1295* (2013.01); *C23C 18/14* (2013.01); *H01L 31/1884* (2013.01); *Y02E 10/50* (2013.01)

(58) Field of Classification Search
CPC ............ C23C 18/1279; C23C 18/1283; C23C 18/1291; C23C 18/1295; C23C 18/14; C23C 18/1608; C23C 18/161; C23C 18/1612; C23C 18/1692–18/1698; G02F 1/13439; H01L 31/1884; H01L 31/022466; Y02E 10/50; C03C 2217/211; C03C 2217/212; C03C 2217/215; C03C 2217/216; C03C 2217/218; C03C 2217/219; C03C 2217/22; C03C 2217/228; C03C 2217/23–2217/24; C09D 5/24; C09D 11/101
USPC .... 427/553, 554, 555, 557, 558, 559, 126.3, 427/168, 170, 226
See application file for complete search history.

(56) References Cited

U.S. PATENT DOCUMENTS

| | | | |
|---|---|---|---|
| 4,450,100 A | | 5/1984 | Kano et al. |
| 4,460,496 A | | 7/1984 | Kano et al. |
| 5,277,986 A | * | 1/1994 | Cronin .................... B32B 17/06 427/108 |
| 5,306,522 A | * | 4/1994 | Clough et al. ............. 427/126.3 |
| 6,951,666 B2 | * | 10/2005 | Kodas et al. .............. 427/376.6 |
| 7,906,780 B2 | | 3/2011 | Iwasaki |
| 8,581,297 B2 | * | 11/2013 | Obana ................. H01L 27/3211 257/103 |
| 8,753,987 B2 | * | 6/2014 | Yukinobu et al. ............ 438/785 |
| 8,932,495 B1 | * | 1/2015 | Nguyen .............. H01L 31/1884 136/252 |
| 8,963,146 B2 | * | 2/2015 | Yukinobu et al. .............. 257/43 |
| 9,040,119 B2 | * | 5/2015 | Yukinobu ............ C23C 18/1216 427/126.3 |
| 9,412,852 B2 | * | 8/2016 | Facchetti ............ C23C 18/1216 |
| 2005/0202162 A1 | * | 9/2005 | Xu ...................... C23C 14/0057 427/157 |
| 2006/0239902 A1 | * | 10/2006 | Kimura et al. .......... 423/594.17 |
| 2007/0212486 A1 | * | 9/2007 | Dinega ................. C23C 16/401 427/250 |
| 2011/0068334 A1 | * | 3/2011 | Yamazaki et al. .............. 257/43 |
| 2011/0229737 A1 | | 9/2011 | Yukinobu et al. |
| 2012/0223302 A1 | * | 9/2012 | Yukinobu et al. .............. 257/43 |
| 2015/0122334 A1 | * | 5/2015 | Otsubo ............ H01L 21/02422 136/263 |
| 2015/0153478 A1 | * | 6/2015 | Takeda ...................... G02B 1/02 428/332 |
| 2015/0206957 A1 | * | 7/2015 | Facchetti ............ C23C 18/1216 438/104 |
| 2015/0232674 A1 | * | 8/2015 | Yukinobu ................ C09D 5/24 252/519.21 |

FOREIGN PATENT DOCUMENTS

| | | |
|---|---|---|
| JP | 57-212268 | 12/1982 |
| JP | 60-19610 | 5/1985 |
| JP | 61-266789 | 11/1986 |
| JP | 63-19046 | 4/1988 |
| JP | 63-25448 | 5/1988 |
| JP | 63-314714 | 12/1988 |
| JP | 2-20706 | 5/1990 |
| JP | 4-255768 | 9/1992 |
| JP | 6-203658 | 7/1994 |
| JP | 6-325637 | 11/1994 |
| JP | 11-60278 | 3/1999 |
| JP | 2001-106567 | 4/2001 |
| JP | 2001106567 | 4/2001 |
| JP | 2011-244464 | 9/2001 |
| JP | 2002-76356 | 3/2002 |
| JP | 2003249132 | 9/2003 |
| JP | 2004-349105 | 12/2004 |
| JP | 2007-123698 | 5/2007 |
| JP | 2007-123699 | 5/2007 |
| JP | 2007-123700 | 5/2007 |
| JP | 2007-201366 | 8/2007 |
| JP | 2009266500 | 11/2009 |
| JP | 2010-30824 | 2/2010 |
| WO | 2010/064719 | 6/2010 |

OTHER PUBLICATIONS

"Dew Point Calculator"; Image Permanence Institute, Rochester Institute of technology, New York; from website ://www.dpcalc.org/; 2 two-page calculations therefrom (no website date available, printed Dec. 8, 2014).*

Don Colbert; How Products Are Made, vol. 4, "Oxygen", 6 pages, online at ://www.madehow.com/volume-4/oxygen.HTML (no website date found, printed Dec. 8, 2014).*

S. Peter Pappas, PhD, editor; UV Curing: Science and Technology, "Light Sources" (by Vincent D. McGinnis); technology marketing Corporation, Stamford, Connecticut, USA; 1978 (no month), excerpt pp. 96-129.*

Machine translation of JP 2009-266500 A by Otsuka Yoshihiro et al., published Nov. 12, 2009.*

K. Nomura et al., Nature "Room-temperature fabrication of transparent flexible thin-film transistors using amorphous oxide semiconductors" 2004, vol. 432, pp. 488-492.

Japanese Patent Application No. 2012-500604 Office Action—Oct. 27, 2014, no English translation.

* cited by examiner

METHOD OF MANUFACTURING TRANSPARENT CONDUCTIVE FILM, THE TRANSPARENT CONDUCTIVE FILM, ELEMENT AND TRANSPARENT CONDUCTIVE SUBSTRATE USING THE FILM, AS WELL AS DEVICE USING THE SUBSTRATE

BACKGROUND OF THE INVENTION

Field of the Invention

The present invention relates to a transparent conductive film and a method of manufacturing the transparent conductive film.

In detail, the present invention relates to a method of manufacturing a transparent conductive film formed on a substrate made of such as glass or plastic by using a coating method (a wet coating method) with heating at a low temperature, in particular, lower than 300° C., the transparent conductive film having both of excellent transparency and high conductivity and also being excellent in film strength, and to the transparent conductive film obtained by the method of manufacturing the transparent conductive film. Furthermore, the present invention relates to an element and a transparent conductive substrate using the transparent conductive film, and to a device using the transparent conductive substrate.

Description of the Related Art

As a material for forming a transparent conductive film for use in a transparent electrode for a display element such as a liquid-crystal display, electroluminescent display and a plasma display, in a transparent electrode such as a touch panel and a solar panel, or for functional coating for such as reflecting heat rays, shielding electromagnetic waves, preventing charging and defogging, a tin-doped indium oxide (Indium Tin Oxide, which may be hereinafter referred to as "ITO"), which is a conductive oxide, is known.

As methods of manufacturing this transparent conductive film made of ITO (ITO film), a vapor deposition method) vapor phase method) are widely used, such as a vacuum deposition method, a sputtering method, and a chemical vapor deposition method. By these methods, a uniform ITO transparent conductive film being excellent in transparency and conductivity can be formed on a substrate.

However, a film forming apparatus to be used in these methods takes a vacuum container as a base, which is very expensive. Also, the component gas pressure in the manufacturing apparatus is required to be precisely controlled for each substrate film formation, thereby posing a problem in manufacturing cost and mass producibility.

As a manufacturing method to solve these problems, a method has been studied in which a coating liquid for forming transparent conductive film obtained by dissolving an indium compound and a tin compound in a solvent is used for coating a substrate (this method may be hereinafter referred to as a "coating method" or a "wet coating method").

In this coating method, a transparent conductive film (ITO film) is formed with a simple manufacturing process of coating of a substrate with the coating liquid for forming transparent conductive film, drying, and baking. Known methods of coating of the substrate with the coating liquid include an inkjet printing method, a screen printing method, a gravure printing method, an offset printing method, a flexor printing method, a dispenser printing method, a slit coating method, a die coating method, a doctor blade coating method, a wire bar coating method, a spin coating method, a dip coating method, and a spray coating method.

As coating liquids for use in these coating methods, various coating liquids containing an indium compound and a tin compound have been conventionally developed. For example, an mixture of indium nitrate and alkyl tin nitrate containing halogen ions or a carboxyl group (for example, refer to Japanese Unexamined Patent Application Publication No. 57-138708), a mixture of an organic indium compound and an organic tin compound containing an alkoxyl group or the like (for example, refer to Japanese Unexamined Patent Application Publication No. 61-26679), a mixture of indium nitrate and an organic tin compound (for example, refer to Japanese Unexamined Patent Application Publication No. 4-255768), an inorganic compound mixture of indium nitrate, tin nitrate, and others (for example, refer to Japanese Unexamined Patent Application Publication No. 57-36714), a mixture of an organic indium nitrate such as dicarboxylate indium nitrate and an organic tin nitrate such as alkyl tin nitrate (for example, refer to Japanese Unexamined Patent Application Publication No. 57-212268), and an organic compound mixture solution made of an organic indium complex and a tin complex with coordination of acetylacetonate (for example, refer to Japanese Examined Patent Application Publication No. 63-25448, Japanese Examined Patent Application Publication No. 2-20706, and Japanese Examined Patent Application Publication No. 63-19046) are disclosed.

In most of these conventionally-known coating liquids, a nitrate of indium or tin, an organic or inorganic compound made of a halide, an organometallic compound such as a metal alkoxide, and others are used.

However, since the coating liquid using a nitrate or a halide generates corrosive gas such as a nitrogen oxide or chlorine at the time of baking, there is a problem of causing corrosion of facilities and environmental pollution. As for the coating liquid using a metal alkoxide, the material is prone to hydrolytic degradation, thereby posing a problem in stability of the coating liquid. Moreover, most of the coating liquids using an organometallic compound described in the patent documents described above has poor wettability with respect to a substrate, and there is also a problem in which a non-uniform film tends to be formed.

To get around this, as an improved coating liquid with these problems mitigated, a coating liquid for forming transparent conductive film containing indium acetylacetonate (standard nomenclature: tris(acetylacetonato)indium: $In(C_5H_7O_2)_3$), tin acetylacetonate (standard nomenclature: di-n-butyl bis(2,4-pentanedionato) tin: $[Sn(C_4H_9)_2 (C_5H_7O_2)_2]$), hydroxypropylcellulose, alkylphenol and/or alkenylphenol, and dibasic acid ester and/or benzyl acetate is disclosed (for example, refer to Japanese Unexamined Patent Application Publication No. 6-203658).

In this coating liquid, with hydroxypropylcellulose being contained in a mixture solution of indium acetylacetonate and tin acetylacetonate, wettability of the coating liquid with respect to the substrate is improved. At the same time, the viscosity of the coating liquid is adjusted based on the content of hydroxypropylcellulose, which is a viscosity-adjusting agent, thereby making it possible to adopt various coating methods such as spin coating, spray coating, dip coating, screen printing, and wire bar coating.

Also, as an improved coating liquid for spin coating, a coating liquid for forming transparent conductive film is suggested (for example, refer to Japanese Unexamined Patent Application Publication No. 6-325637) containing an organic indium compound such as indium acetylacetonate or indium octylate, an organic tin such as tin acetylacetonate or tin octylate, and an organic solvent, in which as the organic solvent, an acetylacetonate solution with alkylphenol and/or alkenylphenol dissolved therein or the acetylacetonate solution with alkylphenol and/or alkenylphenol dissolved therein being diluted with alcohol is used.

This coating liquid has a low viscosity, and can be used not only in spin coating but also spray coating and dip coating.

Furthermore, for the purpose of improving performance of a transparent conductive film to be obtained, irradiation of ultraviolet rays has been tried to be combined with a simple film forming process of coating of a substrate with a coating liquid for forming transparent conductive film as described above, drying, and baking. Examples of methods suggested include a method (refer to Japanese Examined Patent Application Publication No. 60-19610) in which at the time of coating with a coating liquid for forming transparent conductive film, the film is irradiated with ultraviolet rays from a high-pressure mercury lamp or a metal halide lamp to obtain a uniform and dense dried coating film and then the dried coating film is baked at a high temperature on the order of 500° C. and a method (refer to Japanese Unexamined Patent Application Publication No. 63-314714) in which the transparent conductive film obtained by baking at a high temperature equal to or higher than 500° C. (thermal decomposition) is irradiated with ultraviolet rays. However, even with these methods, the resistance of the film is not sufficiently decreased. Also, the resistance once decreased with irradiation of the transparent conductive film obtained by baking with ultraviolet rays tends to be increased again due to storage in the atmosphere.

Thus, in order to obtain a transparent conductive film with low resistance and excellent in resistance stability, a method is suggested (refer to Japanese Unexamined Patent Application Publication No. 11-60278) in which a substrate is coated with a coating liquid for forming transparent conductive film containing an indium compound and a tin compound, then, during or after drying by preliminary heating at a temperature equal to or lower than 300° C., irradiation with ultraviolet rays having a wavelength equal to or smaller than 200 nm using, for example, a low-pressure mercury lamp is performed, and baking is further performed at a temperature equal to or higher than 300° C. (preferably, equal to or higher than 400° C.) under a non-oxidizing atmosphere.

Also a method is suggested (refer to Japanese Unexamined Patent Application Publication No. 2001-106567) in which after a transparent substrate is coated with a coating liquid for forming transparent conductive film and is dried, it is baked in an oxygen atmosphere and is further baked in vacuum to obtain a transparent conductive film. According to this, by baking in the oxygen atmosphere, the baking temperature can be decreased to 180° C. Also, with irradiation with ultraviolet rays of a mercury lamp during baking in the oxygen atmosphere, decrease in resistance can be achieved. However, the wavelength of ultraviolet rays indicated by "ultraviolet rays of the mercury lamp" is not clear. Also, the effect of the irradiation is not described and thus unclear. Moreover, grounds for allowing the baking temperature to be decreased to 180° C. or specific examples are not shown. In addition, film characteristics (transmittance and resistance value) of the transparent conductive film obtained at the baking temperature of 180° C. are not described at all. Therefore, conditions and effects to be obtained are both unknown in the irradiation with ultraviolet rays during baking at a low temperature in this method, and this method seems to have a problem in actual use and also have many problems in practicability.

Meanwhile, a conductive oxide film having a conductive oxide such as indium oxide as a main component has been used for a transparent electrode typified by this ITO film, and additionally in recent years, has attracted attention as a channel active layer of a thin-film transistor and has been actively studied.

As a channel active layer of a field-effect thin-film transistor (TFT), a thin film made of amorphous silicon or the like formed on a glass substrate has been generally used so far. However, amorphous silicon has a low carrier mobility and does not sufficiently have characteristics as a thin-film transistor element.

Thus, many suggestions have been made in which various conductive oxide films are used as a channel active layer to improve the characteristics of a thin-film transistor element. Disclosed examples include a transparent thin-film transistor in which a transparent conductive oxide polycrystalline thin film using ZnO as a main component is used as a channel layer (Japanese Unexamined Patent Application Publication No. 2002-76356 and Japanese Unexamined Patent Application Publication No. 2001-244464), a thin-film transistor in which an In—Ga—Zn—O-based transparent amorphous oxide semiconductor film (a-IGZO) is used as a channel active layer (K. Nomura et. al., Nature, 2004, Vol. 432, pp. 488-492), a thin-film transistor in which a Ga—Zn—O-based or Ga—Sn—O-based non-monocrystalline oxide semiconductor is used as an active layer (Japanese Unexamined Patent Application Publication No. 2007-123698), a thin-film transistor in which an In—Ga—Zn—O-based (InGaZnO$_4$) non-monocrystalline oxide semiconductor is used as a channel active layer (Japanese Unexamined Patent Application Publication No. 2007-123700), a thin-film transistor in which an In—Ga—Zn—Sn—O-based (InGaZnO$_4$ doped with Sn) non-monocrystalline oxide semiconductor is used as a channel active layer (Japanese Unexamined Patent Application Publication No. 2007-123699), and a thin-film transistor in which an amorphous oxide semiconductor made of any one or more of ZnO, SnO$_2$, and In$_2$O$_3$ is used as a channel active layer (Japanese Unexamined Patent Application Publication No. 2007-201366).

However, the conductive oxide films in the thin-film transistors described above (Japanese Unexamined Patent Application Publication No. 2002-76356, No. 2007-123698, No. 2007-123700, No. 2007-123699, No. 2007-201366, and K. Nomura et. al., Nature, 2004, Vol. 432, pp. 488-492, except Japanese Unexamined Patent Application Publication No. 2001-244464) are all formed by using a vapor deposition method (a vapor phase method) such as a sputtering method, a pulsed laser deposition method (a PLD method), or an electron beam deposition method, and not by using a coating method. Moreover, in Japanese Unexamined Patent Application Publication No. 2007-123698, a coating liquid with zinc acetate being suspended in isopropanol is used to form a channel active layer made of ZnO, and after coating with the coating liquid, baking at a high temperature of 600° C. to 900° C. in air or in an oxygen atmosphere is required.

As described above, it is difficult to obtain a high-quality conductive oxide film (an oxide semiconductor film) suitable for a channel active layer of a thin-film transistor with a coating method using baking at a relatively low temperature.

SUMMARY OF THE INVENTION

Problems to be Solved by the Invention

However, most of the methods of manufacturing a transparent conductive film to be formed by coating a substrate with any of various coating liquids for forming transparent conductive film|[o1], drying, and baking require baking at a high temperature (for example, a temperature equal to or higher than 400° C.) after coating with the coating liquid for forming transparent conductive film and drying, and do not allow a transparent conductive film having excellent film characteristics to be obtained with a heating process at a low temperature lower than 300° C. Moreover, even a transparent conductive film obtained by baking at a high temperature (for example, 400° C. or higher) is not sufficiently excellent in conductivity and resistance stability with time.

Meanwhile, in the above-described method in which a transparent conductive film can be obtained with baking at a low temperature lower than 300° C., baking in an oxygen atmosphere is required, thereby posing a problem of a large restriction on a heating apparatus also in view of a material. At the same time, there are doubts in actual use, and many problems in practicability can be assumed. Therefore, for the use to form a transparent electrode in various devices (for example, a liquid-crystal display and a touch panel) only allowing heating at a low temperature (lower than 300° C.) in manufacturing process, a method is desired in which a transparent conductive film excellent in transparency and conductivity is formed with a heating process at a low temperature lower than 300° C.

Furthermore, for the use to form a conductive oxide film (an oxide semiconductor film) as a channel active layer of a thin-film transistor element, a method is desired in which a transparent conductive film (an oxide semiconductor film) with a high density is formed with a heating process at a low temperature lower than 300° C. so as to achieve high carrier mobility.

In view of these circumstances, an object of the present invention is to provide a transparent conductive film to be formed by using a coating method, which is a transparent conductive film manufacturing method at low cost with a simple manner, with heating at a low temperature lower than 300° C., the transparent conductive film having both of excellent transparency and high conductivity and also being excellent in film strength; a transparent conductive film having excellent transparency, high conductivity, and excellent in film strength and resistance stability even when formed with heating at a high temperature equal to or higher than 300° C.; a method of manufacturing these transparent conductive films; an element and a transparent conductive substrate using any of these films; and a device using the transparent conductive substrate.

Means of Solving the Problems

To address these problems, as a result of diligent studies about a method of manufacturing a transparent conductive film having any one or more types of indium oxide, tin oxide, and zinc oxide as a main component to be obtained by coating a heat-resistant substrate with a coating liquid for forming transparent conductive film containing any one or more types of an organic indium compound, an organic tin compound, and an organic zinc compound as a main component, drying, and heating, the inventors have founded that, when the dried coating film after coating and drying is subjected to energy ray irradiation while being heated under an oxygen-containing atmosphere at a dew-point temperature equal to or lower than −10° C. (that is, under an oxygen-containing atmosphere with a small water vapor content)|[o2], decomposition and burning occur in the dried coating film even at a low heating temperature lower than 300° C. to promote mineralization of the film and, at the same time, significantly promote densification of the film, thereby obtaining a film structure of a conductive oxide fine-particle layer densely packed with conductive oxide fine particles and obtaining a transparent conductive film having both of excellent transparency and high conductivity and also being excellent in film strength.

Furthermore, the inventors have founded that, when the dried coating film after coating and drying is subjected to energy ray irradiation while being heated under an oxygen-containing atmosphere at a dew-point temperature equal to or lower than −10° C. (that is, under an oxygen-containing atmosphere with a small water vapor content), decomposition and burning occur in the dried coating film even if formation is performed by heating at a high temperature equal to or higher than 300° C. and equal to or lower than 600° C. to promote mineralization of the film and, at the same time, significantly promote densification of the film, thereby obtaining a film structure of a conductive oxide fine-particle layer densely packed with conductive oxide fine particles and obtaining a transparent conductive film having both of good transparency and excellent film strength and also having higher conductivity and also being excellent in resistance stability, leading to completion of the present invention.

That is, a first aspect of the present invention is directed to a method of manufacturing a transparent conductive film to be formed through following processes: a coating process of coating a substrate with a coating liquid for forming transparent conductive film containing an organometallic compound as a main component to form a coating film; a drying process of drying the coating film to form a dried coating film; and a heat energy ray irradiating process of irradiating the dried coating film with energy rays while heating the dried coating film to form an inorganic film having an inorganic component, which is a metal oxide, as a main component, wherein the heat energy ray irradiating process is a process of irradiating the dried coating film having the organometallic compound as the main component formed in the drying process with the energy rays while heating the dried coating film under an oxygen-containing atmosphere having a dew-point temperature equal to or lower than −10° C. to a heating temperature lower than 300° C. to remove an organic component contained in the dried coating film by decomposition or burning, or decomposition and burning, thereby forming a conductive oxide fine-particle layer densely packed with conductive oxide fine particles having the metal oxide as a main component. Furthermore, the organometallic compound is formed from any one or more types of an organic indium compound, an organic tin compound, and an organic zinc compound, and the metal oxide is any one or more types of indium oxide, tin oxide, and zinc oxide.

A second aspect of the present invention is directed to a method of manufacturing a transparent conductive film to be formed through following processes: a coating process of coating a substrate with a coating liquid for forming transparent conductive film containing an organometallic compound and a dopant organometallic compound as main components to form a coating film; a drying process of drying the coating film to form a dried coating film; and a heat energy ray irradiating process of irradiating the dried coating film with energy rays while heating the dried coating film to form an inorganic film having an inorganic component, which is a metal oxide containing a dopant metal compound, as a main component, wherein the heat energy ray irradiating process is a process of irradiating the dried coating film having the organometallic compound and the dopant organometallic compound as the main components formed in the drying process with the energy rays while heating the dried coating film under an oxygen-containing atmosphere having a dew-point temperature equal to or lower than −10° C. to a heating temperature lower than 300° C. to remove an organic component contained in the dried coating film by decomposition or burning, or decomposition and burning, thereby forming a conductive oxide fine-particle layer densely packed with conductive oxide fine particles having the metal oxide containing the dopant metal compound as a main component. Furthermore, the organometallic compound is formed from any one or more types of an organic indium compound, an organic tin compound, and an organic zinc compound, and the metal oxide is any one or more types of indium oxide, tin oxide, and zinc oxide.

A third aspect of the present invention is directed to the method of manufacturing the transparent conductive film, wherein a content ratio between the organometallic compound and the dopant organometallic compound in the second aspect is in a range of 99.9:0.1 to 66.7:33.3 in terms of a molar ratio of the organometallic compound:the dopant organometallic compound.

A fourth aspect of the present invention is directed to the method of manufacturing the transparent conductive film in the second and third aspects, wherein the organometallic compound is made of an organic indium compound, and the dopant organometallic compound is any one or more types of an organic tin compound, an organic titanium compound, an organic germanium compound, an organic zinc compound, an organic tungsten compound, an organic zirconium compound, an organic tantalum compound, an organic niobium compound, an organic hafnium compound, and an organic vanadium compound, and the dopant metal compound is any one or more types of tin oxide, titanium oxide, germanium oxide, zinc oxide, tungsten oxide, zirconium oxide, tantalum oxide, niobium oxide, hafnium oxide, and vanadium oxide.

Also, a fifth aspect of the present invention is directed to the method of manufacturing the transparent conductive film in the second and third aspects, wherein the organometallic compound is made of an organic tin compound, and the dopant organometallic compound is any one or more types of an organic indium compound, an organic antimony compound, and an organic phosphorus compound.

A sixth aspect of the present invention is directed to the method of manufacturing the transparent conductive film in the second and third aspects, wherein the organometallic compound is made of an organic zinc compound, and the dopant organometallic compound is anyone or more of an organic aluminum compound, an organic indium compound, and an organic gallium compound.

A seventh aspect of the present invention is directed to the method of manufacturing the transparent conductive film, wherein the heat energy ray irradiating process in the first and second aspects is a process of performing irradiation with energy rays in a pattern shape to forma conductive oxide fine-particle layer having the pattern shape.

Also, an eighth aspect of the present invention is directed to the method of manufacturing the transparent conductive film, wherein subsequently to the energy ray irradiation under the oxygen-containing atmosphere while heating to the heating temperature lower than 300° C. in the first to seventh aspects, heating under a neutral atmosphere or a reducing atmosphere at a heating temperature equal to or lower than 600° C. is performed.

A ninth aspect of the present invention is directed to the method of manufacturing the transparent conductive film, wherein subsequently to the energy ray irradiation under the oxygen-containing atmosphere while heating to the heating temperature lower than 300° C. in the first to seventh aspects, heating under a neutral atmosphere or a reducing atmosphere at a heating temperature lower than 300° C. is performed.

A tenth aspect of the present invention is directed to the method of manufacturing the transparent conductive film in the eighth and ninth aspects, wherein the neutral atmosphere is an atmosphere containing any one or more types of nitrogen gas or inert gas, or the reducing atmosphere is a hydrogen gas atmosphere or an atmosphere containing at least one or more types of hydrogen gas or organic solvent vapor in the neutral atmosphere.

An eleventh aspect of the present invention is directed to the method of manufacturing the transparent conductive film in the eighth and ninth aspects, wherein the energy ray irradiation is performed when a reducing treatment of heating under the neutral atmosphere or the reducing atmosphere at a heating temperature lower than 300° C. is performed.

A twelfth aspect of the present invention is directed to the method of manufacturing the transparent conductive film, wherein the energy ray irradiation under the oxygen-containing atmosphere while heating to the heating temperature lower than 300° C. in the first to eleventh aspects is energy ray irradiation under the oxygen-containing atmosphere while heating to a heating temperature of 100° C. to 250° C.

A thirteen aspect of the present invention is directed to the method of manufacturing the transparent conductive film in the first to twelfth aspects, wherein the oxygen-containing atmosphere has a dew-point temperature equal to or lower than −30° C.

A fourteenth aspect of the present invention is directed to the method of manufacturing the transparent conductive film, wherein the energy ray irradiation in the first to thirteenth aspects is irradiation of ultraviolet rays containing at least a component having a wavelength equal to or smaller than 200 nm as a main component.

A fifteenth aspect of the present invention is directed to the method of manufacturing the transparent conductive film, wherein the irradiation of the ultraviolet rays containing at least the component having the wavelength equal to or smaller than 200 nm as the main component in the fourteenth aspect is irradiation of ultraviolet rays emitted from any of a low-pressure mercury lamp, an amalgam lamp, or an excimer lamp.

A sixteenth aspect of the present invention is directed to the method of manufacturing the transparent conductive film, wherein the organic indium compound in the first to fifteenth aspects is indium acetylacetonate.

A seventeenth aspect of the present invention is directed to the method of manufacturing the transparent conductive film, wherein the coating of the substrate with the coating liquid for forming transparent conductive film in the coating process in the first and second aspects is performed by a method which is any of an inkjet printing method, a screen printing method, a gravure printing method, an offset printing method, a flexor printing method, a dispenser printing method, a slit coating method, a die coating method, a doctor blade coating method, a wire bar coating method, a spin coating method, a dip coating method, or a spray coating method.

An eighteenth aspect of the present invention is directed to a transparent conductive film obtained by the method of manufacturing the transparent conductive film according to any one of the first to seventeenth aspects.

A nineteenth aspect of the present invention is directed to an element including a conductive oxide fine-particle layer, wherein the conductive oxide fine-particle layer is the transparent conductive film according to the eighteenth aspect.

A twentieth aspect of the present invention is directed to the element in the eighteenth aspect, wherein the element is a thin-film transistor using the conductive oxide fine-particle layer as a channel active layer of a thin-film transistor.

A twenty-first aspect of the present invention is directed to a transparent conductive substrate including a transparent conductive film on a substrate, wherein the transparent conductive film is the transparent conductive film according to the eighteenth aspect.

A twenty-second aspect of the present invention is directed to a device including a transparent electrode, wherein the transparent electrode is the transparent conductive substrate according to the twenty-first aspect.

A twenty-third aspect of the present invention is directed to the device in the twenty-second aspect, wherein the device is of one type selected from among a light-emitting device, an electric power generating device, a display device, and an input device.

Effects of the Invention

According to the method of manufacturing the transparent conductive film of the present invention, the conductive oxide fine-particle layer densely packed with conductive oxide fine particles having a metal oxide as a main component can be formed by using a coating method with heating at a low temperature lower than 300° C. with a simple manner at low cost. And, the obtained transparent conductive film has both of excellent transparency and high conductivity, and is also excellent in film strength.

Also, in the present invention, even when formed by using the coating method with heating at a high temperature equal to or higher than 300° C. and equal to or lower than 600° C., the conductive oxide fine-particle layer densely packed with conductive oxide fine particles having a metal oxide as a main component can be formed with a simple manner at low cost. And, the obtained transparent conductive film has both of good transparency and high film strength, and also has both of higher conductivity and excellent resistance stability.

For this reason, the transparent conductive substrate having this transparent conductive film formed on the substrate is suitable for light-emitting devices such as an LED element, an electroluminescent lamp (an electroluminescent element), and a field emission lamp; electric power generating devices such as a solar cell; display devices such as a liquid-crystal display (a liquid-crystal element), an electroluminescent display (an electroluminescent element), a plasma display, and an electronic paper element; and input devices such as a touch panel.

In addition, since the conductive oxide fine-particle layer densely packed with conductive oxide fine particles having the metal oxide as the main component has a high degree of density, carrier mobility can be increased, and the film is also suitable for a conductive oxide film (a so-called oxide semiconductor film) as a channel active layer of a thin-film transistor.

DESCRIPTION OF THE EMBODIMENTS

Figure 1:
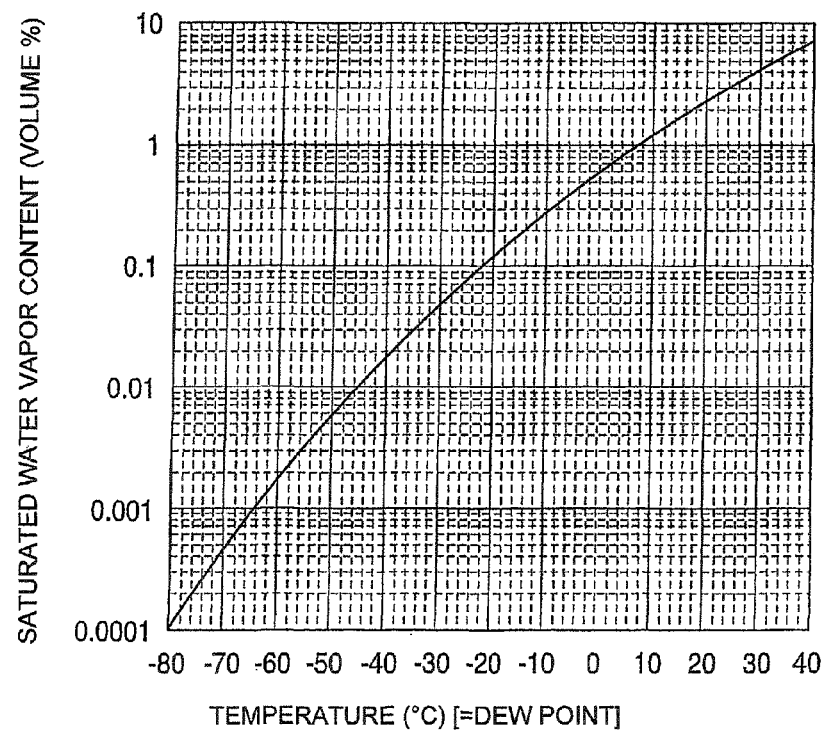
FIG. 1 is a drawing that shows a relation between a saturated water vapor content (volume %) in the air and a dew-point temperature (° C.).

Embodiments of the present invention are described in detail below.

In the present invention, in a method of manufacturing a transparent conductive film to be formed by coating a substrate with a coating liquid for forming transparent conductive film having an organometallic compound as a main component, drying, and irradiating with heat energy rays, decomposition and burning of the film occur even at a low heating temperature lower than 300° C. to cause mineralization to proceed to form a conductive oxide fine-particle layer densely packed with conductive oxide fine particles having a metal compound as a main component, thereby obtaining a transparent conductive film excellent in transparency and conductivity.

Furthermore, in the present invention, in the method of manufacturing a transparent conductive film similar to the described above, even if heating is performed at a high temperature equal to or higher than 300° C., a conductive oxide fine-particle layer more densely packed with conductive oxide fine particles having a metal oxide as a main component can be formed, and a transparent conductive film having good transparency and excellent film strength and having both of higher conductive and excellent resistance stability can be obtained.

[Structure of the Transparent Conductive Film]

First, the structure of the transparent conductive film is described.

In the following, description is made by taking a transparent conductive film made of tin-doped indium oxide (ITO) as an example. The same goes for a transparent conductive film having tin oxide or zinc oxide other than indium oxide as a main component. Furthermore, the same goes for various amorphous conductive oxide films (oxide semiconductor films) made of $InGaZnO_4$ or others having any one or more types of indium oxide, tin oxide, and zinc oxide.

For example, when a vapor deposition method such as a sputtering method is used to forma transparent conductive film made of ITO, a polycrystalline ITO film structure with ITO crystal particles arranged via a grain boundary is normally formed. In this film structure, ITO fine particles are hardly observed.

Also, it is known that a transparent conductive film made of ITO formed by a coating method in which a substrate is coated with a coating liquid for forming transparent conductive film having an organic indium compound and an organic tin compound as main components, dried, and baked at a high temperature, for example, equal to or higher than 400° C. normally has a film structure with ITO fine particles binding to each other and, although the particle diameter of each of the ITO fine particles and the size of a void present between the ITO fine particles vary according to the heating process condition, the transparent conductive film is configured of ITO fine particles having not little open pores.

And, in the transparent conductive film with the ITO fine particles binding to each other formed with this coating method of baking at the high temperature equal to or higher than 400° C., its conductive mechanism intervenes in a contact portion (a binding portion) of the ITO fine particles. This causes a decrease in conductivity in the contact portion occurring possibly because the ITO fine particles make contact with each other in a subtle area, degradation of conductivity with time in atmospheric exposure occurring possibly because oxygen or water vapor in the atmosphere enters the film through open pores to degrade the contacts between the ITO fine particles, a decrease in film strength occurring possibly because the film is roughly packed with the ITO fine particles, and other problems.

Therefore, it is important to densely pack the film with the conductive oxide fine particles described above and, at the same time, promote crystal growth of the conductive oxide fine particles to forma dense film structure with less open pores and having a conductive oxide fine-particle layer having anyone or more types of indium oxide, tin oxide, and zinc oxide with reinforced contacts between the conductive oxide fine particles to achieve an improvement in conductivity of the transparent conductive film and also an improvement in film strength and, at the same time, to significantly suppress degradation of conductivity with time.

Therefore, in the present invention, in the coating method using the coating liquid for forming transparent conductive film described above, the dried coating film is irradiated with heat energy rays under the oxygen-containing atmosphere at a dew-point temperature equal to or lower than −10° C. to forma dense conductive oxide fine-particle layer having anyone or more types of indium oxide, tine oxide, and zinc oxide as a main component.

[Coating Liquid for Forming Transparent Conductive Film]

Next, the coating liquid for forming transparent conductive film for use in the present invention is described in detail.

In the present invention, by using a coating liquid for forming transparent conductive film having an organometallic compound of any one or more types of an organic indium compound, an organic tin compound, and an organic zinc compound, as a main component (which may be hereinafter referred to as a "main organometallic component), a transparent conductive film having one or more types of indium oxide, tin oxide, and zinc oxide as a main component is formed. In general, the transparent conductive film preferably has high conductivity and, in that case, the conductivity is improved by doping an oxide such as indium oxide, tin oxide, and zinc oxide, with a metal compound other than these, mainly a metal oxide. That is, if any one or more types of indium oxide, tin oxide, and zinc oxide containing a dopant metal compound are used as a conductive oxide, the conductivity of the transparent conductive film is improved.

This is because the dopant metal compound has a function of increasing concentration (carrier density) of electrons as carriers in a conductive oxide.

In a specific doping method, a predetermined amount of a dopant organometallic compound is mixed in the coating liquid for forming transparent conductive film having any one or more types of organometallic compounds among an organic indium compound, an organic tin compound, and an organic zinc compound as a main component.

First, the coating liquid for forming transparent conductive film having an organic indium compound as a main component is described below.

Examples of the organic indium compound for use in the present invention include indium acetylacetonate (standard nomenclature: tris(acetylacetonato)indium) $[In(C_5H_7O_2)_3]$, indium 2-ethylhexanoate, indium formate, and indium alkoxide. Basically, however, any organic indium compound can be used as long as it is dissolved in a solvent and is decomposed to an oxide without generating harmful gas such as chlorine gas or nitrogen oxide gas at the time of heat energy ray irradiation or heating process thereafter. Among these, indium acetylacetonate is preferable because it has a high degree of solubility in an organic solvent, becomes an oxide by being decomposed and baked (oxidized) at a temperature of 200° C. to 250° C. even in simple atmospheric heating and, if irradiation of energy rays (irradiation of ultraviolet rays having a wavelength equal to or smaller than 200 nm) is used together, becomes an oxide by being decomposed and burnt (oxidized) at a temperature further lower than the temperature above.

Next, as the dopant organometallic compound to improve conductivity, one or more types of an organic tin compound, an organic titanium compound, an organic germanium compound, an organic zinc compound, an organic tungsten compound, an organic zirconium compound, an organic tantalum compound, an organic niobium compound, an organic hafnium compound, and an organic vanadium compound are preferable.

Note that since low conductivity to some extent (high resistivity value) may be required depending on the device to which the transparent conductive film is to be applied, addition of the dopant organometallic compound to the coating liquid for forming transparent conductive film is performed as appropriate when necessary.

Examples of the organic tin compound (the valence of tin in the compound may be 2 or 4) as the dopant organometallic compound include tin acetylacetonate (standard nomenclature: di-n-butyl bis(2,4-pentanedionato) tin, [Sn$(C_4H_9)_2(C_5H_7O_2)_2$], tin octylate, tin 2-ethylhexanoate, tin acetate(II) [Sn$(CH_3COO)_2$], tin acetate(IV) [Sn$(CH_3COO)_4$], di-n-butyl tin diacetate [Sn$(C_4H_9)_2(CH_3COO)_2$], tin formate, and tin-tert-butoxide [Sn$(C_4H_9O)_4$] as a tin alkoxide. Basically, however, any organic tin compound can be used as long as it is dissolved in a solvent and is decomposed to an oxide without generating harmful gas such as chlorine gas or nitrogen oxide gas at the time of heat energy ray irradiation or heating process thereafter. Among these, tin acetylacetonate is preferable because it is relatively inexpensive and easily available.

Examples of the organic titanium compound as the dopant organometallic compound include titanium acetylacetonate (standard nomenclature: titanium-di-n-butoxide bis(2,4-pentanedionate) [Ti$(C_4H_9O)_2(C_5H_7O_2)_2$]), titanyl (IV) acetylacetonate [$C_5H_7O_2)_4$TiO], titanium diisopropoxide bis(2,4-pentanedionate) [$C_{16}H_{36}O_4$Ti], and others as titanium acetylacetonate complexes; and titanium tetraethoxide [Ti$(C_2H_5O)_2$], titanium(IV)-tert-butoxide [Ti$(C_4H_9O)_4$], titanium tetra-n-butoxide [Ti$(C_4H_9O)_4$], titanium tetraisopropoxide [Ti$(C_3H_7O)_4$], and others as titanium alkoxides. Basically, however, any organic titanium compound can be used as long as it is dissolved in a solvent and is decomposed to an oxide without generating harmful gas such as chlorine gas or nitrogen oxide gas at the time of heat energy ray irradiation or heating process thereafter. Among these, titanium acetylacetonate, titanium tetra-n-butoxide, and titanium tetraisopropoxide are preferable because they are inexpensive and easily available.

Examples of the organic germanium compound as the dopant organometallic compound include germanium tetraethoxide [Ge$(C_2H_5O)_4$], germanium tetra-n-butoxide [Ge$(C_4H_9O)$], germanium tetraisopropoxide [Ge$(C_3H_7O)_4$], and others as germanium alkoxides; β-carboxyethylgermaniumoxide [$(GeCH_2CH_2COOH)_2O_3$], tetraethylgermanium [Ge$(C_2H_5)_4$], tetrabutylgermanium [Ge$(CH_9)_4$], tributylgermanium [Ge$(C_4H_9)_3$], and others. Basically, however, any organic germanium compound can be used as long as it is dissolved in a solvent and is decomposed to an oxide without generating harmful gas such as chlorine gas or nitrogen oxide gas at the time of heat energy ray irradiation or heating process thereafter. Among these, germanium tetraethoxide, germanium tetra-n-butoxide, and germanium tetraisopropoxide are preferable because they are relatively inexpensive and easily available.

Examples of the organic zinc compound as the dopant organometallic compound include zinc acetylacetonate (standard nomenclature: zinc-2,4-pentanedionate) [Zn$(C_5H_7O_2)_2$], zinc-2,2,6,6-tetramethyl-3,5-heptanedionate [Zn$(C_{11}H_{19}O_2)_2$], and others as zinc acetylacetonate complexes. Basically, however, any organic zinc compound can be used as long as it is dissolved in a solvent and is decomposed to an oxide without generating harmful gas such as chlorine gas or nitrogen oxide gas at the time of heat energy ray irradiation or heating process thereafter. Among these, zinc acetylacetonate is preferable because it is inexpensive and easily available.

Examples of the organic tungsten compound as the dopant organometallic compound include tungsten (V) ethoxide [W$(C_2H_5O)_5$], tungsten (VI) ethoxide [W$(C_2H_5O)_6$], and others as tungsten alkoxides. Basically, however, any organic tungsten compound can be used as long as it is dissolved in a solvent and is decomposed to an oxide without generating harmful gas such as chlorine gas or nitrogen oxide gas at the time of heat energy ray irradiation or heating process thereafter.

Examples of the organic zirconium compound as the dopant organometallic compound include zirconium di-n-butoxide bis(2,4-pentanedionate) [Zr$(C_4H_9O)_2(C_5H_7O_2)_2$], zirconium acetylacetonate (standard nomenclature: zirconium-2,4-pentanedionate) [Zr$(C_5H_7O_2)_4$], and others as zirconium acetylacetonate complexes; and zirconium ethoxide [Zr$(C_2H_5O)_4$], zirconium-n-propoxide [Zr$(C_3H_7O)_4$], zirconium isopropoxide [Zr$(C_3H_7O)_4$], zirconium-n-butoxide [Zr$(C_4H_9O)_4$], zirconium-tert-butoxide [Zr$(C_4H_9O)_4$], zirconium-2-methyl-2-butoxide [Zr$(C_5H_{11}O)_4$], zirconium-2-methoxymethyl-2-propoxide [Zr$(C_5H_{11}O_2)_4$], and others as zirconium alkoxides. Basically, however, any organic zirconium compound can be used as long as it is dissolved in a solvent and is decomposed to an oxide without generating harmful gas such as chlorine gas or nitrogen oxide gas at the time of heat energy ray irradiation or heating process thereafter. Among these, zirconium-n-propoxide and a zirconium-n-butoxide are preferable because they are relatively inexpensive and easily available.

Examples of the organic tantalum compound as the dopant organometallic compound include tantalum(V) tetraethoxide-pentanedionate [Ta$(C_5H_7O_2)(OC_2H_5)_4$] as a tantalum acetylacetonate complex; and tantalum methoxide [Ta$(CH_3O)_5$], tantalum ethoxide [Ta$(C_2H_5O)_5$], tantalum isopropoxide [Ta$(C_3H_7O)_5$], tantalum-n-butoxide [Ta$(C_4H_9O)_5$], tetraethoxyacetylacetonato tantalum [Ta$(C_2H_5O)_4(C_5H_7O_2)$], and others as tantalum alkoxides. Basically, however, any organic tantalum compound can be used as long as it is dissolved in a solvent and is decomposed to an oxide without generating harmful gas such as chlorine gas or nitrogen oxide gas at the time of heat energy ray irradiation or heating process thereafter.

Examples of the organic niobium compound as the dopant organometallic compound include niobium ethoxide [Nb$(C_2H_5O)_5$], niobium-n-butoxide [Nb$(C_4H_9O)_5$], and others as niobium alkoxides. Basically, however, any organic niobium compound can be used as long as it is dissolved in a solvent and is decomposed to an oxide without generating harmful gas such as chlorine gas or nitrogen oxide gas at the time of heat energy ray irradiation or heating process thereafter.

Examples of the organic hafnium compound as the dopant organometallic compound include hafnium di-n-butoxide bis(2,4-pentanedionate) [Hf$(C_4H_9O)_2(C_5H_7O_2)_2$], hafnium acetylacetonate (standard nomenclature: hafnium-2,4-pentanedionate) [Hf$(C_5H_7O_2)_4$], and others as hafnium acetylacetonate complexes; and hafnium ethoxide [Hf(C$_2$H$_5$O)$_4$], hafnium-n-butoxide [Hf(C$_4$H$_9$O)$_4$], hafnium-tert-butoxide [Hf(C$_4$H$_9$O)$_4$], hafnium(VI) isopropoxidemonoisopropylate [Hf(C$_3$H$_7$O)$_4$(C$_3$H$_7$OH)], and others as hafniumalkoxides. Basically, however, any organic hafnium compound can be used as long as it is dissolved in a solvent and is decomposed to an oxide without generating harmful gas such as chlorine gas or nitrogen oxide gas at the time of heat energy ray irradiation or heating process thereafter. Among these, hafnium-n-butoxide is preferable because it is relatively inexpensive and easily available.

Examples of the organic vanadium compound as the dopant organometallic compound include vanadium(IV) oxide bis-2,4-pentanedionate [VO(C$_5$H$_7$O$_2$)$_2$], vanadium acetylacetonate (standard nomenclature: vanadium(III)-2,4-pentanedionate) [V(C$_5$H$_7$O$_2$)$_3$], and others as vanadium acetylacetonate complexes. Basically, however, any organic vanadium compound can be used as long as it is dissolved in a solvent and is decomposed to an oxide without generating harmful gas such as chlorine gas or nitrogen oxide gas at the time of heat energy ray irradiation or heating process thereafter.

Next, the coating liquid for forming transparent conductive film having an organic tin compound as a main component is also described below.

As the organic tin compound for use in the present invention, the organic tin compound described in the description of the coating liquid for forming transparent conductive film having the organic indium compound as a main compound can be used. As a dopant organometallic compound to improve conductivity, one or more types of an organic indium compound, an organic antimony compound, and an organic phosphorous compound are preferable.

As the organic indium compound as the dopant organometallic compound, the organic indium compound described in the description of the coating liquid for forming transparent conductive film having the organic indium compound as a main compound can be used.

Examples of the organic antimony compound as the dopant organometallic compound include antimony(III) acetate [Sb(CH$_3$COO)$_3$]; and antimony(III) ethoxide [Sb(C$_2$H$_5$O)$_3$], antimony(III)-n-butoxide [Sb(C$_4$H$_9$O)$_3$], and others as antimony alkoxides. Basically, however, any organic antimony compound can be used as long as it is dissolved in a solvent and is decomposed to an oxide without generating harmful gas such as chlorine gas or nitrogen oxide gas at the time of baking. Among these, antimony (III)-n-butoxide is preferable because it is relatively inexpensive and easily available.

Examples of the organic phosphorus compound as the dopant organometallic compound include triethylphosphate [PO(C$_2$H$_5$O)$_3$] and others. Basically, however, any organic phosphorus compound can be used as long as it is dissolved in a solvent and is decomposed to an oxide without generating harmful gas such as chlorine gas or nitrogen oxide gas at the time of baking.

Furthermore, the coating liquid for forming transparent conductive film having an organic zinc compound as a main component is also described below.

As the organic zinc compound for use in the present invention, the organic zinc compound described in the description of the coating liquid for forming transparent conductive film having the organic indium compound as a main compound can be used. As a dopant organometallic compound to improve conductivity, one or more types of an organic aluminum compound, an organic indium compound, and an organic gallium compound are preferable.

As the organic indium compound as the dopant organometallic compound, the organic indium compound described in the description of the coating liquid for forming transparent conductive film having the organic indium compound as a main compound can be used.

Examples of the organic aluminum compound as the dopant organometallic compound include aluminum acetylacetonate (aluminum-2,4-pentanedionate) [Al(C$_5$H$_7$O$_2$)$_3$] as an aluminum acetyleacetone complex; and aluminum ethoxide [Al(C$_2$H$_5$O)$_3$], aluminum-n-butoxide [Al(C$_4$H$_9$O)$_3$], aluminum isopropoxide [Al(C$_3$H$_7$O)$_3$], and others as aluminum alkoxides. Basically, however, any organic aluminum compound can be used as long as it is dissolved in a solvent and is decomposed to an oxide without generating harmful gas such as chlorine gas or nitrogen oxide gas at the time of baking. Among these, aluminum acetylacetonate and aluminum-n-butoxide are preferable because they are relatively inexpensive and easily available.

Examples of the organic gallium compound as the dopant organometallic compound include gallium acetylacetonate (gallium-2,4-pentanedionate) [Ga(C$_5$H$_7$O$_2$)$_3$] as a gallium acetyleacetone complex; and gallium ethoxide [Ga(C$_2$H$_5$O)$_3$] and others as gallium alkoxides. Basically, however, any organic gallium compound can be used as long as it is dissolved in a solvent and is decomposed to an oxide without generating harmful gas such as chlorine gas or nitrogen oxide gas at the time of baking.

The organometallic compound (a main organometallic compound) of any one or more types of the organic indium compound, the organic tin compound, and the organic zinc compound in the coating liquid for forming transparent conductive film or the organometallic compound and the dopant organometallic compound are main compound materials for forming a transparent conductive film on the substrate, and a total content is preferably in a range of 1 weight % to 30 weight %, more preferably 5 weight % to 20 weight %. If the total content is smaller than 1 weight %, only a transparent conductive film having a thin film thickness can be obtained, and therefore sufficient conductivity cannot be obtained. Also, if the total content is larger than 30 weight %, the organometallic compound in the coating liquid for forming transparent conductive film is easily precipitated to decrease stability of the coating liquid or to cause a too much increase in the thickness of the transparent conductive film to be obtained to cause a crack to impair conductivity.

Also, when the dopant organometallic compound is mixed in the coating liquid for forming transparent conductive film (when high conductivity is desired to be obtained), the content ratio between the organometallic compound (the main organometallic compound) and the dopant organometallic compound is preferably 99.9:0.1 to 66.7:33.3 in terms of a molar ratio of the organometallic compound (the main organometallic compound):the dopant organometallic compound. In detail, except for the case in which an organic zinc compound is used as the dopant organometallic compound in the coating liquid for forming transparent conductive film having an organic indium compound as a main component, the content ratio is desirably 99.9:0.1 to 87:13 and preferably 99:1 to 91:9, in terms of a molar ratio of the organometallic compound (the main organometallic compound): the dopant organometallic compound.

Note that when an organic zinc compound is used as the organometallic compound for doping in the coating liquid for forming transparent conductive film having an organic indium compound as a main component, the content ratio is desirably 95:5 to 66.7:33.3 and preferably 91:9 to 71:29, in terms of a molar ratio of the organometallic compound (the main organometallic compound):the dopant organometallic compound.

Here, the molar ratio described above indicates a molar ratio of metal components of the organometallic compound (the main organometallic compound) and the dopant organometallic compound. Therefore, when one molecule of the dopant organometallic compound contains two metal elements, a conversion is made as two moles of the dopant metal elements with respect to one mole of the dopant organometallic compound.

Note that, depending on the device to which the transparent conductive film is applied, high conductivity is not necessarily required for the transparent conductive film and, conversely, a high resistivity value may be required. In this case, for the purpose of obtaining a high-resistivity transparent conductive film, the coating liquid for forming transparent conductive film described above can be used without being mixed with a dopant organometallic compound.

On the other hand, even if the amount of the dopant organometallic compound is too small or large from out of the molar ratio range, carrier density of the transparent conductive film may be decreased to abruptly degrade the conductivity of the transparent conductive film. Also, when the dopant organometallic compound is large from out of the molar ratio range described above, crystal growth of the conductive oxide fine particles may become less prone to proceed to degrade conductivity, which is not preferable.

Furthermore, an organic binder can be added, as required, to the coating liquid for forming transparent conductive film. With addition of this organic binder, wettability with respect to the substrate is improved. At the same time, the viscosity of the coating liquid can be adjusted, and therefore film formability of the coating liquid for forming transparent conductive film is significantly improved. The organic binder described above is preferably made of a material that is decomposable or burnable at the time of heat energy ray irradiation or heating process thereafter. As this material, a cellulose complex, an acrylic resin, or the like is effective.

Examples of the cellulose derivative for use as an organic binder include methylcellulose, ethylcellulose, hydroxy methylcellulose, hydroxyethylcellulose, hydroxypropylcellulose, hydroxyethylmethylcellulose, hydroxypropylmethylcellulose, ethylhydroxyethylcellulose, carboxymethylcellulose, carboxyethylcellulose, carboxyethylmethylcellulose, nitrocellulose, and others. Among these, hydroxypropylcellulose (hereinafter may be referred to as "HPC") is preferable.

With the use of HPC, sufficient wettability with a content equal to or smaller than 5 weight % can be obtained, and significant viscosity adjustment can be performed. Furthermore, while a burning start temperature of HPC is approximately 300° C. in simple heating in the atmosphere, with the use of energy ray irradiation together (for example, irradiation of ultraviolet rays having a wavelength equal to or smaller than 200 nm), HPC is decomposed and burnt even at a heating temperature lower than 300° C. Therefore, without inhibiting particle growth of conductive particles to be generated, a transparent conductive film with high conductivity can be fabricated. If the content of HPC is larger than 5 weight %, HPC becomes gelated and tends to be left in the coating liquid, thereby forming an extremely porous transparent conductive film to significantly impair transparency and conductivity.

Here, for example, when ethylcellulose is used as the cellulose derivative in place of HPC, the viscosity of the coating liquid can be set lower than the case of using HPC. However, pattern printability is slightly degraded in screen printing or the like in which a coating liquid with high viscosity is preferable.

Meanwhile, nitrocellulose is excellent in decomposability, but may generate harmful nitrogen oxide gas at the time of heat energy ray irradiation or heating process thereafter, thereby possibly posing degradation of a heating furnace or a problem in exhaust gas processing. As described above, the cellulose derivate for use is required to be selected as appropriate according to the situation.

Also, as the acrylic resin, an acrylic resin burnable at a relatively low temperature is preferable.

As the solvent for use as the coating liquid for forming transparent conductive film, solvents which are capable of dissolving an organometallic compound such as an organic indium compound, an organic tin compound, or an organic zinc compound, and any of various dopant organometallic compounds are suitable. For example, alkylphenol and/or alkenylphenol and dibasic acid ester, alkylphenol and/or alkenylphenol and benzyl acetate, or a solution of mixture thereof, which are capable of dissolving an acetylacetonate complex such as indium acetylacetonate, zinc acetylacetonate, or vanadium acetylacetonate at a high concentration are preferably used. Examples of alkylphenol and/or alkenylphenol include cresols, xylenol, ethylphenol, p-tert-butylphenol, octylphenol, nonylphenol, cashew nut shell liquid [3 pentadecadesylphenol], and others. As the dibasic acid ester (for example, dibasic acid dimethyl, dibasic acid diethyl), any of succinic acid ester, glutaric acid ester, adipic acid ester, malonic acid ester, phthalic acid ester, and others is used.

Furthermore, as a solvent to be mixed in the coating liquid for forming transparent conductive film to decrease viscosity of the coating liquid or improve coatability, any can be used as long as it has compatibility with a solvent in which an organometallic compound such as an organic indium compound, an organic tin compound, or an organic zinc compound, a dopant organometallic compound, and a cellulose derivative and/or acrylic resin as an organic binder is dissolved. Examples, although not restrictive, include water; alcohol-based solvents such as methanol (MA), ethanol (EA), 1-propanol (NPA), isopropanol (IPA), butanol, pentanol, benzil alcohol, and diacetone alcohol (DAA); ketone-based solvents such as acetone, methyl ethyl ketone (MEK), methyl propyl ketone, methyl isobutyl ketone (MIBK), cyclohexanone, acetylacetone (2,4-pentanedione), and isophorone; ester-based solvents such as ethyl acetate, butyl acetate, isobutyl acetate, amyl formate, isoamyl acetate, butyl propionate, isopropyl butyrate, ethyl butyrate, butyl butyrate, methyl lactate, ethyl lactate, methyl oxyacetate, ethyl oxyacetate, butyl oxyacetate, methoxy methyl acetate, methoxy ethyl acetate, methoxy butyl acetate, ethoxy methyl acetate, ethoxy ethyl acetate, 3-oxypropionic acid methyl, 3-oxypropionic acid ethyl, 3-methoxy propionic acid methyl, 3-methoxypropionic acid ethyl, 3-ethoxypropionic acid methyl, 3-ethoxypropionic acid ethyl, 2-oxypropionic acid methyl, 2-oxypropionic acid ethyl, 2-oxypropionic acid propyl, 2-methoxypropionic acid methyl, 2-methoxypropionic acid ethyl, 2-methoxypropionic acid propyl, 2-ethoxypropionic acid methyl, 2-ethoxypropionic acid ethyl, 2-oxy-2-methylpropionic acid methyl, 2-oxy-2-methylpropionic acid ethyl, 2-methoxy-2-methylpropionic acid methyl, 2-ethoxy-2-methylpropionic acid ethyl, methyl pyruvic acid, ethyl pyruvic acid, propyl pyruvic acid, aceto methyl acetate, aceto ethyl acetate, 2-oxobutanoate methyl, and 2-oxobutanoate ethyl; glycol derivatives such as ethylene glycol monomethyl ether (MCS), ethylene glycol monoethyl ether (ECS), ethylene glycol isopropyl ether (IPC), ethylene glycol monobutyl ether (BCS), ethylene glycol monoethyl ether acetate, ethylene glycol monobutyl ether acetate, propylene glycol monomethyl ether (PGM), propylene glycol ethyl ether (PE), propylene glycol monomethyl ether acetate (PGM-AC), propylene glycol ethyl ether acetate (PE-AC), diethylene glycol monomethyl ether, diethylene glycol monoethyl ether, diethylene glycol monobutyl ether, diethylene glycol monomethyl ether acetate, diethylene glycol monoethyl ether acetate, diethylene glycol monobutyl ether acetate, diethylene glycol dimethyl ether, diethylene glycol diethyl ether, diethylene glycol dibutyl ether, dipropylene glycol monomethyl ether, dipropylene glycol monoethyl ether, and dipropylene glycol monobutyl ether; benzene derivatives such as toluene, xylene, mesitylene, and dodecylbenzene; formamide (FA), N-methyl formamide, dimethyl formamide (DMF), dimethyl acetoamide, dimethyl sulfoxide (DMSO), N-methyl-2-pyrrolidone (NMP), γ-butyrolactone, ethylene glycol, diethylene glycol, propylene glycol, dipropylene glycol, 1,3-butylene glycol, pentamethylene glycol, 1,3-octylene glycol, tetrahydrofuran (THF), chloroform, mineral spirits, terpineol, and a solution of mixture of some of these components.

In consideration of stability and film formability of the coating liquid, as the solvent for use, methyl ethyl ketone (MEK), cyclohexanone, propylene glycol monomethyl ether (PGM), N-methyl-2-pyrrolidone (NMP), γ-butyrolactone, and others are preferable.

The coating liquid for forming transparent conductive film for use in the present invention is manufactured by heating and dissolving, in the solvent, a mixture of any one or more types of organometallic compounds of the organic indium compound, the organic tin compound, and the organic zinc compound, any one or more types of the various dopant organometallic compounds as required and, furthermore, the mixture having added thereto a binder as required.

Heating and dissolving are performed normally at a heating temperature of 60° C. to 200° C. and by agitating for 0.5 hour to 12 hours. If the heating temperature is lower than 60° C., sufficient dissolution cannot be achieved. For example, in the case of the coating liquid for forming transparent conductive film having the organic indium compound as a main component, precipitation and separation of the metal compound such as indium acetylacetonate occur to decrease stability of the coating liquid. If the heating temperature is higher than 200° C., evaporation of the solvent becomes apparent to change the composition of the coating liquid. Therefore, such temperatures are not preferable.

Since the viscosity of the transparent conductive film can be adjusted based on the molecular weight and content of the organic binder described above and the type of the solvent, the viscosity can be adjusted for support so as to be suitable for various coating methods such as an inkjet printing method, a screen printing method, a gravure printing method, an offset printing method, a flexor printing method, a dispenser printing method, a slit coating method, a die coating method, a doctor blade coating method, a wire bar coating method, a spin coating method, and a spray coating method.

A coating liquid with a high viscosity (approximately 5000 mPa·s to 50000 mPa·s) can be fabricated by making 5 weight % or smaller, preferably 2 weight % to 4 weight %, of an organic binder with a high molecular weight contained therein. A coating liquid with a low viscosity (approximately 5 mPa·s to 500 mPa·s) can be fabricated by making 5 weight % or smaller, preferably 0.1 weight % to 2 weight %, of an organic binder with a low molecular weight contained therein and diluting the coating liquid with a dilution solvent with a low viscosity. Also, a coating liquid with an intermediate viscosity (approximately 500 mPas to 5000 mPa·s) can be fabricated by mixing the coating liquid with the high viscosity and the coating liquid with the low viscosity together.

[Transparent Conductive Film Manufacturing Method]

The method of manufacturing the transparent conductive film of the present invention is described in detail.

The transparent conductive film of the present invention is formed through a coating process of coating a substrate with a coating liquid for forming transparent conductive film to form a coating film, a drying process of drying the coating film to form a dried coating film, a heat energy ray irradiating process of irradiating the dried coating film while heating the dried coating film to form an inorganic film and, as required, a reducing process.

(a) Coating Process

The substrate is coated with the coating liquid for forming transparent conductive film by using various coating methods such as an inkjet printing method, a screen printing method, a gravure printing method, an offset printing method, a flexor printing method, a dispenser printing method, a slit coating method, a die coating method, a doctor blade coating method, a wire bar coating method, a spin coating method, and a spray coating method. This coating is preferably performed in a clean atmosphere such as a clean room where temperature and humidity are controlled. In general, the temperature is at a room temperature (approximately 25° C.) and the humidity is 40% RH to 60% RH.

As the substrate, an inorganic substrate made of soda lime glass, non-alkali glass, quartz glass, or the like or a resin substrate (a plastic film) made of polyethylene naphthalate (PEN), polyethylene terephthalate (PET), nylon, polyethersulfone (PES), urethane, cycloolefin resin (such as ZEONOR [manufactured by Zeon Corporation] and ARTON [manufactured by JSR Corporation]), fluorine-based resin, polyamide-imide, polyimide (PI), or others can be used.

Note that when a resin substrate (a plastic film) is used as the substrate, the surface of the resin substrate may deteriorate in the heat energy ray irradiating process described below to possibly decrease adhesiveness between the transparent conductive film and the resin substrate. Therefore, it is desirable to apply a thin-film coating (such as a titanium oxide or a cerium oxide) for cutting ultraviolet rays in advance on a surface of the resin substrate where a transparent conductive film is to be formed. The thin-film coating for cutting ultraviolet rays described above may be performed with a wet coating method using a coating liquid or a vapor deposition method (a vapor phase method) such as sputtering.

(b) Drying Process

In this drying process, the substrate coated with the coating liquid for forming transparent conductive film is kept in the atmosphere normally at 80° C. to 180° C. for one minute to thirty minutes, preferably for two minutes to ten minutes, to dry the coating film, thereby fabricating a dried coating film. Drying conditions (temperature and time) can be selected as appropriate according the type of the substrate for use, the coating thickness of the coating liquid for forming transparent conductive film, and others, and are not restricted to the drying conditions described above. However, in consideration of productivity, the drying time is desirably reduced to a minimum with which the film quality of the obtained dried coating film is not deteriorated. Also, the drying temperature is required to be equal to or lower than the heat-resistant temperature of the substrate for use. For example, in the case of the PEN film, the drying temperature is required to be set to be equal to or lower than 200° C. (although it depends on the drying time). Note that drying under reduced pressure (ultimate pressure: normally equal to or lower than 1 kPa) can be applied as required in place of drying in the atmosphere. In drying under reduced pressure, the solvent in the coating liquid for forming transparent conductive film used to coat the substrate is forcibly removed under reduced pressure to cause drying to easily proceed. Therefore, drying at a lower temperature can be performed compared with drying in the atmosphere. Thus, this is useful when a substrate made of a material with poor heat resistance or solvent resistance.

This dried coating film has the organic solvent described above vaporized and removed from the coating liquid for forming transparent conductive film, and is configured of an organic-based component such as an organometallic compound of any one or more types of an organic indium compound, an organic tin compound, and an organic zinc compound, (the dopant organometallic compound), an organic binder, and others.

(c) Heat Energy Ray Irradiating Process

In the heat energy ray irradiating process of the present invention, in place of the conventional method of irradiation with energy rays such as ultraviolet rays while heating in an normal atmosphere (air at a high dew-point temperature and high humidity) (refer to FIG. 2), the dried coating film obtained in the drying process described above is irradiated with energy rays while being heated under an oxygen-containing atmosphere at a dew-point temperature equal to or lower than −10° C. To perform such energy ray irradiation accompanying the control of the atmosphere such as dew-point temperature, as shown in FIG. 3, the structure is required in which an irradiation box having an ultraviolet irradiation window 5 made of a synthetic quartz (with a high ultraviolet-ray transmittance) is placed straight below an energy ray irradiation lamp 4 emitting energy rays (for example, an ultraviolet ray irradiation lamp) and a substrate heating apparatus 1 such as a hot plate is placed in that irradiation box.

Meanwhile, normally, heat rays are also emitted from the energy ray irradiation lamp, in addition to the energy rays such as ultraviolet rays. Therefore, for example, when the heating temperature is low at approximately 40° C. to 50° C., the heating apparatus such as a hot plate is not necessarily required. In other words, even without heating by the heating apparatus such as a hot plate, the substrate is heated to at least approximately 40° C. to 50° C. with heat ray irradiation from the energy ray irradiation lamp.

With the heat energy ray irradiation under the oxygen-containing atmosphere at the dew-point temperature equal to or lower than −10° C., mineralization and densification by decomposition and burning (oxidation) proceeds in the organic-based component of the organometallic compound of any one or more types of an organic indium compound, an organic tin compound, and an organic zinc compound, the above-described organometallic compound containing the dopant organometallic compound, an organic binder, and others. Therefore, a transparent conductive film is obtained as an inorganic component, that is, an inorganic film formed of a conductive oxide, in more detail, a conductive oxide fine-particle layer densely packed with conductive oxide fine particles.

Note that a film having an inorganic component as a main component, the film being subjected to heat energy ray irradiation under the oxygen-containing atmosphere and not being the reducing process described below, may be particularly referred to as an "inorganic film" and be used as being distinguished from a "transparent conductive film".

That is, in the heat energy ray irradiating process, when the amount of irradiation of energy rays is increased in a heating temperature range, for example, lower than 300° C., that is, when the time for irradiating energy rays becomes long, any one or more types of organometallic compounds (including one containing a dopant organometallic compound) of the organic indium compound, the organic tin compound, and the organic zinc compound in the dried coating film are gradually decomposed and burnt (oxidized) to be first converted to a conductive oxide in an amorphous state (here, referring to the state of extremely fine particles having a crystallite size found by X-ray diffraction equal to or smaller than 3 nm). Then, when the heating temperature is further increased in a range lower than 300° C. than the heating temperature in the heat energy ray irradiating process or when the energy ray irradiation time is increased even if the heating temperature in the heat energy ray irradiating process remains the same, crystallization of the above-described conductive oxide occurs, and crystal grow further proceeds to produce conductive oxide fine particles, thereby causing a state of a final conductive film.

On the other hand, similarly, the organic binder is gradually decomposed and burnt (oxidized) with energy ray irradiation under the oxygen-containing atmosphere in the heat energy ray irradiating process. The organic binder is converted mainly to carbon dioxide ($CO_2$) to be vaporized into the atmosphere to disappear from the film. Although it depends on the type of organic binder, the organic binder almost completely disappears with irradiation of energy rays while heating at a temperature lower than 250° C. when, for example, HPC described above is used. Therefore, eventually, the organic binder is hardly left in the transparent conductive film.

Note that the organic binder is uniformly intervened in the conductive oxide in the amorphous state described above to suppress crystallization up to an initial stage of the heat energy ray irradiating process, specifically, although depending on energy ray illuminance, a state in which the energy ray irradiation time is approximately several tens of seconds to three minutes. Furthermore, as described above, when the heating temperature is increased in the range lower than 300° C. or when the energy ray irradiation time is increased, it is considered that organic binder components gradually disappear and crystallization of the conductive oxide described above starts.

As described above, organic components of the dried coating film are gradually decomposed and burnt (oxidized) with irradiation of heat energy rays under the oxygen-containing atmosphere at a dew-point temperature equal to or lower than −10° C. to cause mineralization and densification of the film to proceed, thereby gradually decreasing the thickness of the film. For example, with heat energy ray irradiation under the above-described oxygen-containing atmosphere, a dried coating film having a thickness of 700 nm is eventually changed to be an inorganic film having a thickness on the order of 150 nm.

Here, when the thickness of the inorganic film becomes on the order of several hundreds of nm to 1 μm, if the inorganic film is tried to be formed with a series of coating, drying, and heat energy ray irradiating processes one time, the film thickness is too thick and a crack may occur in the inorganic film and adhesiveness of the inorganic film with the substrate may deteriorate. In this case, these problems can be prevented by repeatedly performing the series of coating, drying, and heat energy ray irradiating processes a plurality of times to obtain a laminated inorganic film, and then the procedure can go to the next plasma processing process. For example, by laminating inorganic films each having a thickness on the order of 150 nm six times as described above, a laminated inorganic film having a thickness of 900 nm can be obtained.

Note that the heating temperature in the heat energy ray irradiating process is desirably lower than 300° C., preferably in a range of 40° C. to 250° C., more preferably in a range of 100° C. to 200° C., and further preferably in a range of 100° C. to 150° C. A temperature equal to or higher than 300° C. is not preferable because thermal decomposition of the dried coating film to be subjected to energy ray irradiation starts before energy ray irradiation, thereby inhibiting film densification. While a temperature lower than 40° C. is not totally impractical, attention is required to be sufficiently paid to a decrease in speed of mineralization and densification of the dried coating film by heat energy ray irradiation.

Here, the energy ray irradiation in the heat energy ray irradiating process may be performed on the entire surface of the dried coating film, or may be performed only on a specific portion of the dried coating film in a pattern shape. In this case, since mineralization and densification of the film described above proceeds only on the portion subjected to the energy ray irradiation, a conductive oxide fine-particle layer having a pattern shape can be formed.

Note that when a portion of the dried coating film where the conductive oxide fine-particle layer is not formed (a portion of the dried coating film not irradiated with energy rays) is required to be removed, since that portion is not mineralized, the portion can be removed by dissolving the portion in an organic solvent capable of dissolving the dried coating film. On the other hand, the mineralized portion of the conductive oxide fine-particle layer is not dissolved in the organic solvent at all, and therefore only the portion of the conductive oxide fine-particle layer can be left on the substrate.

Examples of the organic solvent excellent in solubility of the above-described dried coating film includes methyl ethyl ketone (MEK), methyl propyl ketone, methyl isobutyl ketone (MIBK), cyclohexanone, acetylacetone (2,4-pentanedione), dimethyl formamide (DMF), dimethyl sulfoxide (DMSO), N-methyl-2-pyrrolidone (NMP), and γ-butyrolactone.

Here, the energy ray irradiation for use in the heat energy ray irradiating process is preferably irradiation of ultraviolet rays including at least a wavelength equal to or smaller than 200 nm as a main component and, more specifically, irradiation of ultraviolet rays emitted from any of a low-pressure mercury lamp, an amalgam lamp, and an excimer lamp. A preferable irradiation amount of ultraviolet rays is such that light having a wavelength equal to or smaller than 200 nm has an illuminance equal to or larger than 2 mW/cm$^2$, preferably equal to or larger than 4 mW/cm$^2$, and the irradiation time is desirably one minute or longer, preferably two minutes or longer, and further preferably four minutes or longer. If the irradiation time is too short, the effect of energy ray irradiation (mineralization and densification) is insufficient. Conversely, if the irradiation time is too long (for example, a long time exceeding sixty minutes), productivity (process efficiency) is significantly decreased, and the effect of energy ray irradiation (mineralization and densification) becomes almost saturated halfway, which is not preferable.

The irradiation amount of ultraviolet rays can be adjusted as appropriate depending on a distance between the substrate and the lamp (an irradiation distance), irradiation time, or lamp output. In this energy ray irradiation to the entire surface of the substrate using the lamp, for example, a straight-tube lamp may be arranged in parallel for irradiation, or a surface light source of a grid lamp may be used.

The low-pressure mercury lamp and the excimer lamp capable of emitting light having a wavelength equal to or smaller than 200 nm are described in detail below. In the heat energy ray irradiating process of the present invention, the low-pressure mercury lamp is preferably used, which has less use restrictions and, when a heating process is performed concurrently, can make an influence of heating on the lamp small.

While the low-pressure mercury lamp generally has argon gas and mercury enclosed in a quartz glass tube, the amalgam lamp has an amalgam alloy which is an alloy of mercury and a special rare metal enclosed therein, thereby allowing high output approximately twice to three fold compared with the low-pressure mercury lamp, and the output wavelength characteristics are approximately the same as those of the low-pressure mercury lamp, and therefore detailed description is omitted. As a matter of course, as with the low-pressure mercury lamp, the amalgam lamp is preferably used in the heat energy ray irradiating process of the present invention, because the amalgam lamp has less use restrictions and, when a heating process is performed concurrently, can make an influence of heating on the lamp small.

However, a special apparatus that cools a lamp with nitrogen gas or the like without absorption of ultraviolet rays as cooling gas can be used. In this case, the above does not apply.

The low-pressure mercury lamp emits ultraviolet rays having wavelengths of 185 nm and 254 nm. For example, in the air, as in reaction formulas (1) to (3) shown in Chemical Formula 1, light of 185 nm decomposes oxygen to generate ozone and, furthermore, light of 254 nm decomposes that ozone at a speed in units of ms (milliseconds) to generate high-energy active atomic oxygen O($^1$D). At the same time, light of 185 nm (photon energy: 647 kJ/mol) and light of 254 nm (photon energy: 472 kJ/mol) cut a chemical bond of an organic substance, and ozone and active atomic oxygen act on the organic substance with its chemical bond being cut. With this, the organic substance is considered to be eventually subjected to oxidative destruction and vaporization to water and carbon dioxide, and a relatively long effective irradiation distance of 0 mm to 20 mm can be ensured (its critical irradiation distance is 200 mm).

[Chemical Formula 1]

$$O_2 + h\upsilon(185 \text{ nm}) \rightarrow O(^3P) + O(^3P) \qquad (1)$$

$$O(^3P) + O_2 \rightarrow O_3 \qquad (2)$$

$$O_3 + h\upsilon(254 \text{ nm}) \rightarrow O(^1D) + O_2 \qquad (3)$$

h: Planck constant, υ: optical frequency,
O($^3$P): oxygen atom in a basal state,
O($^1$D): oxygen atom in an excited state On the other hand, the excimer lamp (xenon excimer lamp) emits ultraviolet rays having a wavelength of 172 nm, and has a feature such that, unlike the low-pressure mercury lamp, high-energy active atomic oxygen O($^1$D) can be directly generated for example, in the air, as in reaction formula (4) shown in Chemical Formula 2 below. (Here, for dissociation of an oxygen molecule shown in reaction formula (4), a wavelength equal to or smaller than 175 nm is required, and therefore this dissociation does not occur with light of 185 nm of the low-pressure mercury lamp.) Also, ozone is generated with reaction formula (5), and active atomic oxygen can also be generated also based on reaction formula (6). It is considered that the reaction formula (6) is a secondary reaction and active atomic oxygen is mainly generated based on equation (4).

Furthermore, since photon has a large energy of 696 kJ/mol, the capability of cutting the bond of the organic substance is advantageously higher (since the energy is higher than molecular bond energies of almost all organic substances, the possibility of cutting a molecular bond is high). However, light of 172 nm has an oxygen absorption coefficient approximately 100 times larger compared with light of 185 nm of the low-pressure mercury lamp, and is strongly absorbed to oxygen. Therefore, the ozone and high-energy active atomic oxygen described above can cause an oxidation reaction only near the surface of the lamp and, disadvantageously, the effective irradiation distance in the air is extremely short, 0 mm to 3 mm (its critical irradiation distance is 8 mm).

[Chemical Formula 2]

$$O_2 + h\upsilon(172\ nm) \rightarrow O(^1D) + O^3(P) \quad (4)$$

$$O(^3P) + O_2 \rightarrow O_3 \quad (5)$$

$$O_3 + h\upsilon(172\ nm) \rightarrow O(^1D) + O_2 \quad (6)$$

h: Planck constant, $\upsilon$: optical frequency,
$O(^3P)$: oxygen atom in a basal state,
$O(^1D)$: oxygen atom in an excited state The oxygen-containing atmospheric gas described above may be air or oxygen gas, or mixture gas of oxygen gas and neutral atmospheric gas (nitrogen)/inert gas (such as argon or helium). Air, which is inexpensive and easily available, is preferable.

Furthermore, as its oxygen-containing atmospheric gas, an oxygen-containing atmosphere with a low dew-point temperature, that is, with a small water vapor content (for reference, FIG. 1 shows a relation between a saturated water vapor content (volume %) in the air and a dew-point temperature (° C.) is shown) is preferably used.

When this oxygen-containing atmosphere with a low dew-point temperature is used, in the course of mineralization of the film in the heat energy ray irradiating process, crystallization of the conductive oxide and crystal growth are suppressed, and a film structure of the conductive oxide fine-particle layer densely packed with extremely fine conductive oxide fine particles can be obtained. Note that the mechanism of dense packing of the conductive oxide fine particles can be thought as follows, although not having been necessarily clarified.

That is, it can be assumed that, at least until the time when crystallization of the conductive oxide occurring due to mineralization in the heat energy ray irradiating process starts, the film structure is kept with the organic binder uniformly intervening in the conductive oxide. This film structure has flexibility with the action of the organic binder, which is an organic substance, to allow shrinkage (densification) of the film in a vertical direction to the substrate. Therefore, when the temperature is increased and baking is performed under an air atmosphere with a low dew-point temperature, crystallization of the conductive oxide is suppressed to the full extent possible in which the binder disappears and a shrinkable film structure can be taken, leading to densification of the film.

Here, the temperature at which mineralization occurs in the heat energy ray irradiating process (the heating temperature in the heat energy ray irradiating process) is lower than 300° C. (preferably equal to or lower than 250° C.) which is lower compared with the temperature at which mineralization occurs in the case of only the heating process without energy ray irradiation (normally equal to or higher than 300° C.). This is also effective at suppressing crystallization of the conductive oxide described above, and is thought to further promote densification of the film.

Note that under the air atmosphere with a low dew-point temperature, that is, with a small water vapor content, why crystallization of the conductive oxide and crystal growth are suppressed is not clear. However, for example, it can be thought that, water vapor in the air atmosphere has (1) an action of promoting thermal decomposition and burning (oxidation) of the organic binder components intervening in the conducive oxide, and (2) an action of promoting crystallization of the conductive oxide itself and crystal growth.

This low dew-point temperature of the oxygen-containing atmospheric gas is preferably equal to or lower than −10° C., more preferably equal to or lower than −20° C., further preferably −30° C., and most preferably −40° C.

When the dew-point temperature exceeds −10° C., in the course of formation of the conductive oxide fine-particle layer made of extremely fine conductive oxide fine particles due to mineralization of the film in the heat energy ray irradiating process, water vapor promotes crystallization of the conductive oxide and crystal growth at the stage in which much of the organic binder is still left. Therefore, the film structure with the organic binder uniformly intervening in the conductive oxide and shrinkable in a film vertical direction is destroyed, and the conductive oxide fine particles are adhered to each other and become unable to move, thereby inhibiting densification of the film. With this, the conductivity, film strength, resistance stability, and others of the transparent conductive film to be eventually obtained are degraded. Thus, this situation is not preferable.

Next, when the heating apparatus is used as required in the heat energy ray irradiating process, examples of the heating apparatus include a hotplate and a far-infrared heating apparatus, although not restrictive. However, as described above, in addition to the case where an atmosphere such as air with a low humidity, that is, a low dew-point temperature in the heat energy ray irradiating process, even in the case of using a neutral atmosphere or a reducing atmosphere in the present invention, which will be described below, the heating apparatus described above is required to be able to control the atmosphere for the heating process. Also in that case, the structure is required such that the heating apparatus 1 for the substrate, such as a hot plate, is placed in a box where the atmosphere can be controlled as being cut off from the outside world. As a matter course, even in this case, the apparatus having the structure shown in FIG. 3 described above can be used as it is.

(d) Reducing Process

The reducing process is a process subsequently to the heat energy ray irradiation under the oxygen-containing atmosphere described above, the process of performing a heating process under a neutral atmosphere or a reducing atmosphere as required to form oxygen vacancies in conductive oxide fine particles by reducing treatment|$_{[o3]}$ the conductive oxide fine particles. The reducing treatment described above is not so strong as to reduce the conductive oxide fine particles to metal components, but is a relatively weak reducing treatment to the extent in which oxygen deficiency (oxygen vacancies) is formed in the conductive oxide. The reducing treatment is a preferable treatment, because, in this treatment, the oxygen vacancies occurring in the conductive oxide fine particles generate carrier electrons to increase carrier concentration and improve conductivity of the transparent conductive film.

Note that since the oxygen vacancies formed in the film make the constituent elements (such as indium and oxygen) of the conductive oxide fine particles easily diffuse, the reducing treatment described above has a promoting effect stronger than promotion of crystal growth among the conductive oxide fine particles by heat energy ray irradiation in the oxygen-containing atmospheric gas. Thus, the reducing treatment is preferable because the reducing treatment is effective at not only improving conductivity of the transparent conductive film but also stabilizing conductivity and suppressing conductivity changes with time.

This neutral atmosphere is formed from one or more types of nitrogen gas and inert gas such as argon and helium. On the other hand, an example of the reducing atmosphere is an atmosphere containing at least one or more types of hydrogen or organic solvent vapor (for example, organic gas such as methanol) in a hydrogen gas or its neutral atmosphere. These atmospheres are not restrictive to the above, however, as long as they allow removal of oxygen atoms from the densely-packed conductive oxide fine particles to form oxygen vacancies to increase conductive carrier concentration. However, if the reduction property of the atmosphere is too strong, reduction proceeds too much to increase conductive carrier concentration too much to cause absorption in a visible light region and blacken the film, thereby possibly decreasing visible light transmittance. This is not preferable.

In the reducing process described above, there is no danger that an atmosphere containing nitrogen gas or inert gas mixed with 0.1% to 7% (volume %) does not explode even if leaking to the air, and therefore this atmosphere is preferable. In particular, an atmosphere containing nitrogen gas or inert gas mixed with 1% to 3% (volume %) of hydrogen gas is a preferable atmosphere because blackening of the film described above tends not to occur when the heating temperature in the reducing process is high (for example, on the order of 500° C. to 600° C.).

Note that when the heating process (the reducing process) under the neutral atmosphere or the reducing atmosphere described above is performed, energy rays such as ultraviolet rays used in the heat energy ray irradiating process described above may be used for irradiation. For example, when a low-pressure mercury lamp is used for energy ray irradiation, irradiation is performed with ultraviolet rays having wavelengths of 185 nm (photon energy: 647 kJ/mol) and 254 nm (photon energy: 472 kJ/mol) of the low-pressure mercury lamp on the inorganic film formed of conductive oxide fine particles obtained in the heat energy ray irradiating process. Therefore, compared with the case of a simple heating process under the neutral atmosphere or the reducing atmosphere, crystal growth among the conductive oxide fine particles can be promoted. Also, oxygen vacancies are easily formed in the conductive oxide fine particles. Therefore, the above-described process is effective at improving conductivity of the transparent conductive film.

Heating conditions of the reducing process are such that, if energy ray irradiation is not performed simultaneously, heating is performed at a heating temperature equal to or higher than 150° C. and equal to or lower than 600° C., more preferably within 300° C. to 550° C., for 5 minutes to 120 minutes, more preferably 15 minutes to 60 minutes. Note that in view of further promotion of crystal growth between the conductive oxide fine particles described above, the heating temperature is desirably 350° C. to 550° C.

If the heating temperature is lower than 150° C., oxygen vacancies are not sufficiently formed in the conductive oxide fine particles, and an improvement in conductivity of the transparent conductive film with an increase in carrier concentration cannot be expected. If the heating temperature exceeds 600° C., a general inorganic substrate made of soda lime glass, non-alkali glass, or the like is distorted due to high temperature, which is not preferable.

On the other hand, heating conditions of the reducing process when energy ray irradiation is performed simultaneously are such that heating is performed at a heating temperature equal to or higher than 120° C. and lower than 300° C., more preferably within equal to or higher than 150° C. and lower than 300° C., for 5 minutes to 120 minutes, more preferably 15 minutes to 60 minutes. Note that in view of further promotion of crystal growth between the conductive oxide fine particles described above, the heating temperature is desirably equal to or higher than 200° C. and lower than 300° C.

If the heating temperature is lower than 120° C., oxygen vacancies are not sufficiently formed in the conductive oxide fine particles, and an improvement in conductivity of the transparent conductive film with an increase in carrier concentration cannot be expected. If the heating temperature exceeds 300° C., the effect of promoting crystal growth between the conductive oxide fine particles by heating becomes larger than the effect of promoting crystal growth by energy ray irradiation, and therefore performing energy ray irradiation and the heating process at the same time becomes meaningless itself.

Note that heat energy ray irradiation under the oxygen-containing atmosphere (the heat energy ray irradiating process) and the heating process under the neutral atmosphere or the reducing atmosphere (the reducing process) can be successively performed. That is, in heat energy ray irradiation of the substrate having the dried coating film formed thereon, for example, after energy ray irradiation is performed in the air with a substrate temperature being lower than 300° C., the temperature is adjusted to the heating temperature for the reducing treatment while energy ray irradiation is stopped or continues as it is, thereby switching only the atmosphere from the air to the neutral atmosphere or the reducing atmosphere.

As described above, in addition to a function of forming oxygen vacancies in the conductive oxide to increase the carrier concentration, the reducing process also has a function of make the constituent element of the transparent conductive film easily move with the presence of the oxygen vacancies to promote crystal growth. Therefore, depending on the condition to be applied, the strength and conductivity of the transparent conductive film may be further improved.

Figure 4:
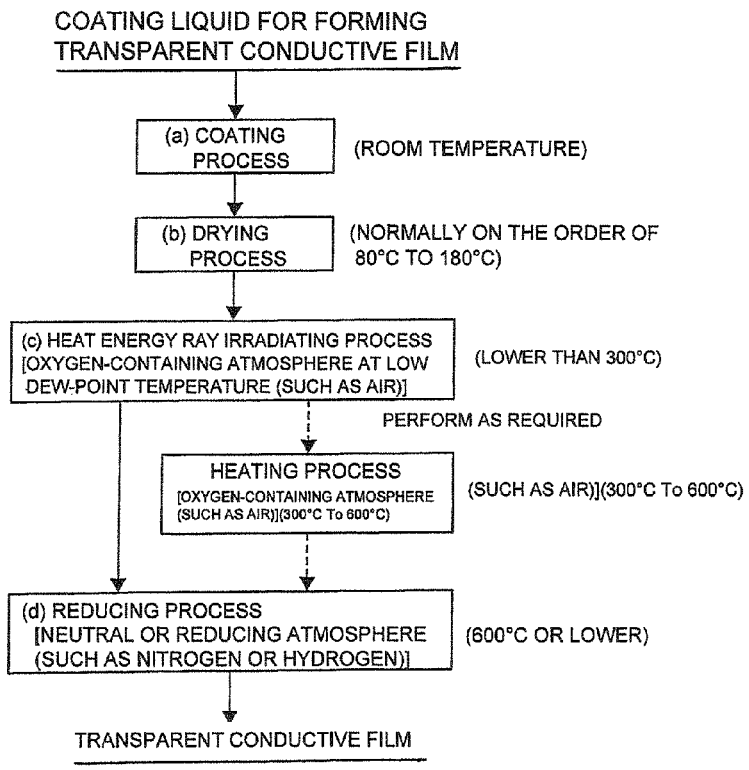
FIG. 4 is a drawing that shows an example of a transparent conductive film manufacturing process flow (a heat energy ray irradiating process is performed under an oxygen-containing atmosphere at a low dew-point temperature) with the coating method according to the present invention.
Figure 5:
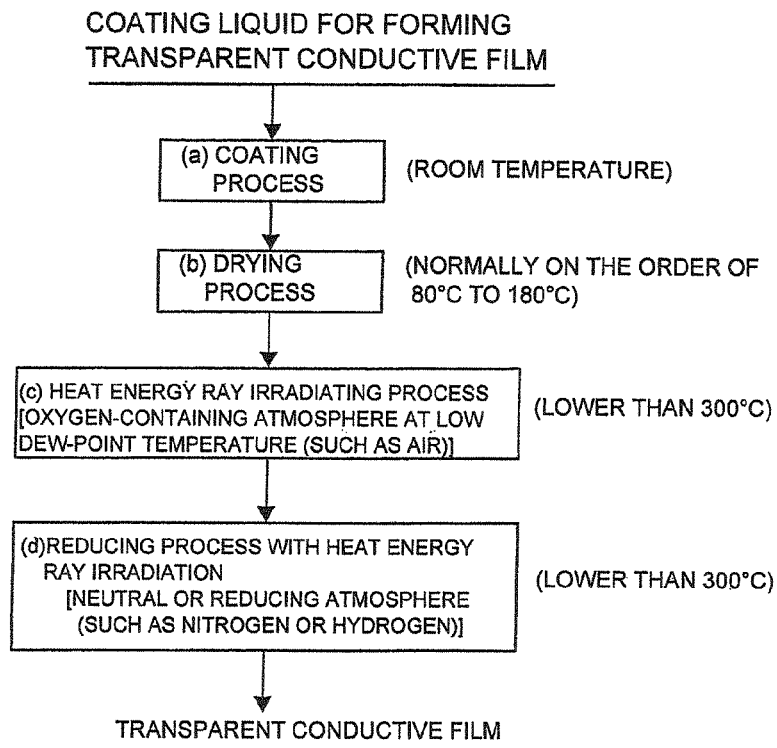
FIG. 5 is a drawing that shows another example of the transparent conductive film manufacturing process flow (the heat energy ray irradiating process is performed under the oxygen-containing atmosphere at the low dew-point temperature) with the coating method according to the present invention.

Here, the process of manufacturing the transparent conductive film of the present invention is shown in FIG. 4 and FIG. 5 for ease of understanding. FIG. 4 shows a method of performing a reducing treatment subsequently to the heat energy ray irradiating process under the oxygen-containing atmosphere at a dew-point temperature equal to or lower than −10° C. while heating under the neutral atmosphere or the reducing atmosphere, and FIG. 5 shows a method of performing a reducing treatment subsequently to the heat energy ray irradiating process under the oxygen-containing atmosphere at a dew-point temperature equal to or lower than −10° C., together with performing heat energy ray irradiation under the neutral atmosphere or the reducing atmosphere.

Next, a thin-film transistor element to which the transparent conductive film of the present invention is applied is described.

An example of the thin-film transistor element (TFT element) is a field-effect transistor element having a coplanar-type structure or a staggered-type structure. In either structure, although details are omitted, the element is provided with a source/drain electrode, a gate insulating film, a channel active layer, and a gate electrode on a substrate.

The thin-film transistor element is used as a driver element in displays such as a liquid-crystal display of an active matrix type and an electroluminescent display, which will be described further below, and in an image sensor.

As described above, amorphous silicon has been widely used so far as a channel active layer of the thin-film transistor. However, amorphous silicon has a disadvantage of low carrier mobility and instability in characteristics at the time of continuous driving. Thus, with the aim of achieving better element characteristics (such as high mobility, low threshold voltage, high ON/OFF ratio, low S value, and normally off) than amorphous silicon, attempts have been made such that an amorphous conductive oxide (an oxide semiconductor) such as In—Ga—Zn—O base (InGaZnO$_4$) is applied to the channel active layer.

In the transparent conductive film obtained by the present invention, a (amorphous) conductive oxide fine-particle layer extremely densely packed with conductive oxide fine particles having a metal oxide as a main component is formed. Therefore, for example, an amorphous conductive oxide layer (an oxide semiconductor layer) such as InGaZnO$_4$ described above applicable to a channel active layer of a thin-film transistor can be formed with heating at a low temperature lower than 300° C.

Next, the transparent conductive film and the device to which the transparent conductive film is applied of the present invention are described.

Examples of this device include light-emitting devices such as an LED element, an electroluminescent lamp (an electroluminescent element), and a field emission lamp; electric power generating devices such as a solar cell; display devices such as a liquid-crystal display (a liquid-crystal element), an electroluminescent display (an electroluminescent element), a plasma display, and an electronic paper element; and input devices such as a touch panel. The transparent conductive film and the transparent conductive substrate of the present invention are suitable for these transparent electrodes.

Several devices are described below.

Here, electroluminescent elements as light-emitting devices include an organic EL element using an organic light-emitting material and an inorganic EL element using an inorganic light-emitting material. In recent years, the organic EL element has attracted attention.

This organic EL element is a self-emitting element, unlike a liquid-crystal display element, and high luminance can be obtained with low voltage driving, and therefore is expected as a display apparatus such as a display. The organic EL element is classified into a low-molecular type and a high-molecular type. An example of structure of the high-molecular type is such that a positive-hole injection layer formed of a conductive polymer such as a polythiophene derivative (hole injection layer), an organic light-emitting layer (a polymer light-emitting layer formed by coating), a cathode electrode layer [a metal layer with excellent electron injectability to the light-emitting layer and low work function, such as magnesium (Mg), calcium (Ca), or aluminum (Al)], and then a gas barrier coating layer (or a process of sealing with a metal or glass) are sequentially formed on a transparent conductive film as an anode electrode layer. The gas barrier coating layer described above is required to prevent degradation of the organic EL element, and oxygen barrier and water vapor barrier are desired. For example, as for water vapor, extremely high barrier performance with a water vapor transmission rate being approximately equal to or lower than $10^{-5}$ g/m$^2$/day is required, and the inside of the organic EL element (device) is configured to be completely sealed from outside.

Here, for the transparent conductive film as a transparent electrode of the organic EL element, high film flatness (for example, center line average roughness (Ra: Roughness average) is equal to or smaller than 2 nm to 3 nm and the maximum height (Rmax: Roughness maximum) is equal to or smaller than 20 nm to 30 nm) is desired. The transparent conductive film of the preset invention is formed in the manner such that an extremely flat liquid surface of the coating liquid for forming transparent conductive film applied onto the substrate becomes a surface of the dried coating film and then eventually becomes a surface of an inorganic film, and therefore has an extremely high film flatness (for example, center line average roughness Ra=0.5 nm to 1.0 nm and the maximum height Rmax=5 nm to 10 nm)

The solar cell as an electric power generating device is an electric power generating element that converts sunbeams to electric energy. Examples of the solar cell include a silicon solar cell (of a thin film type, a fine crystal type, and a crystal type), a CIS solar cell (a copper-indium-selenium thin film), a CIGS solar cell (a copper-indium-gallium-selenium thin film), and a dye-sensitized solar cell. For example, in the silicon solar cell, a transparent electrode, a semiconductor electric power generating layer (silicon), and then a metal electrode are sequentially formed on a transparent substrate.

The liquid-crystal element as a display device is an electronic display element of a non-light-emitting type widely used in displays of portable phones, PDAs (Personal Digital Assistants), PCs (Personal Computers), and others, and is classified into a simple matrix type (a passive matrix type) and an active matrix type. In view of image quality and response speed, the active matrix type is superior. The basic structure is such that a liquid crystal is interposed between transparent electrodes (each corresponding to the transparent conductive film of the present invention), and liquid-crystal molecules are oriented by voltage driving for display. In an actual element, in addition to the transparent electrodes, a color filter, a retardation film, a polarizing film, and others are further laminated for use.

Also, liquid-crystal elements of another type also include a polymer dispersed liquid crystal element (hereinafter abbreviated as a PDLC element) used for an optical shutter such as a window or others and a polymer network liquid crystal element (hereinafter abbreviated as a PNLC element). In either liquid crystal, the basic structure is as described above, such that a liquid crystal layer is interposed between electrodes (at least one is a transparent electrode, which corresponds to the transparent conductive film of the present invention), and liquid-crystal molecules are oriented by voltage driving for display to cause a change in appearance of the liquid-crystal layer as transparent/opaque. Unlike the liquid-crystal display element described above, however, there is a feature in which no retardation film or polarizing film is required in an actual element, thereby simplifying the element structure.

Meanwhile, the PDLC element adopts a structure in which liquid crystal microcapsulated in a polymer resin matrix is dispersed, and the PNLC element adopts a structure in which a netted portion of a resin netted network is packed with liquid crystal. In general, the PDLC element has a high resin content ratio in the liquid-crystal layer, and therefore an alternating current driving voltage equal to or higher than several tens of volts (for example, on the order of 80 V) is required. By contrast, the PNLC element, where the resin content ratio of the liquid-crystal layer can be low, has a feature in which it can be driven with an alternating current on the order of several V to 15 V.

Note that, to ensure display stability of the liquid-crystal element described above, it is required to prevent water vapor from being mixed into the liquid crystal. For example, the water vapor transmission rate is required to be equal to or lower than 0.01 g/m$^2$/day, and the inside of the liquid-crystal element (device) is configured to be completely sealed from outside.

The electronic paper element as a display device is an electronic display element of a non-light-emitting type, which does not emit light by itself, includes a memory effect in which a display is left as it is even if powered off, and is expected to be as a display for character display.

Examples of this display type that have been developed include an electrophoretic type in which coloring particles are moved in liquid between electrodes by electrophoresis; a twist ball type in which dichroic particles are rotated in an electric field for coloring; a liquid crystal type in which, for example, cholesteric liquid crystal is interposed between transparent electrodes for display; a powder base type in which coloring particles (toner) or electronic liquid powder (Quick Response Liquid Powder) are moved in the air for display; an electrochromic type in which coloring is performed based on electrochemical oxidation and reduction; and an electrodeposition type in which a metal is precipitated and dissolved by electrochemical oxidation and reduction and accompanying changes in color are used for display. In any of these types, the structure is such that a display layer is interposed between a transparent conductive film (transparent electrode) and a counter electrode.

Note that, to ensure display stability in the electronic paper elements of these various types, it is required to prevent water vapor from being mixed into the display layer. Although it depends on the type, for example, the water vapor transmission rate is required to be equal to or lower than 0.01 g/m$^2$/day to 0.1 g/m$^2$/day, and the inside of the electronic paper element (device) is configured to be completely sealed from outside.

The touch panel is a position input element, and there are a resistive type, a capacitive type, and others.

For example, the resistive type touch panel has a structure in which two transparent conductive substrates as coordinate-detection resistive films for detecting coordinates are laminated together via a dotted transparent spacer. In the transparent conductive substrates, hitting durability is required. In the transparent conductive film, flexibility without causing a crack is demanded. Also, in the capacitive type, with an increased resolution, a further improvement in conductivity of the transparent conductive film is demanded.

In any of the light-emitting device, the electric power generating device, the display device, the input device, and others described above, an improvement in device characteristics is demanded. By applying the transparent conductive film and the transparent conductive substrate according to the present invention to a transparent electrode of these devices, the basic device characteristics can be further improved, and therefore, such application can significantly contribute to, for example, energy saving and size reduction of the device and others.

The present invention is described in detail below by using examples, but the present invention is not meant to be restricted to these examples. Note that "%" of hydrogen-nitrogen mixed gas indicates "volume %".

Example 1

[Formulation of Solution Liquid A]

40 g of indium acetylacetonate (standard nomenclature: tris tris(acetylacetonato)indium) [In($C_5H_7O_2$)$_3$] (molecular weight=412.15), 42 g of p-tert-butylphenol, 14 g of dibasic acid ester (manufactured by Du Pont Japan), and 4 g of hydroxypropylcellulose (HPC) were mixed together, heated to 130° C., and agitated for ninety minutes for dissolution. Next, 25 g of the obtained solution, 25 g of cyclohexanone, 10 g of propylene glycol monomethyl ether (PGM), and 40 g of methyl ethyl ketone (MEK) were mixed together and agitated well until they became uniform, thereby formulating a solution (liquid A) containing indium acetylacetonate and hydroxypropylcellulose.

[Formulation of Solution Liquid B]

40 g of tin acetylacetonate (standard nomenclature: di-n-butyl bis(2, 4-pentanedionato) tin [Sn($C_4H_9$)$_2$($C_5H_7O_2$)$_2$]) (molecular weight=431.14), 42 g of p-tert-butylphenol, 14 g of dibasic acid ester (manufactured by Du Pont Japan), and 4 g of hydroxypropylcellulose (HPC) were mixed together, heated to 130° C., and agitated for ninety minutes for dissolution. Next, 25 g of the obtained solution, 25 g of cyclohexanone, 10 g of propylene glycol monomethyl ether (PGM), and 40 g of methyl ethyl ketone (MEK) were mixed together and agitated well until they became uniform, thereby formulating a solution (liquid B) containing tin acetylacetonate and hydroxypropylcellulose.

[Formulation of the Coating Liquid]

9.1 g of the formulated liquid A and 0.9 g of the formulated liquid B were agitated well until they become uniform, thereby formulating a coating liquid for forming transparent conductive film containing 10 weight % of indium acetylacetonate and tin acetylacetonate in total and 1 weight % of hydroxypropylcellulose.

[Fabrication of the Transparent Conductive Film]

Next, the transparent conductive film was fabricated by using this coating liquid for forming transparent conductive film, based on the manufacturing process flow shown in FIG. 4 (a heating process was not performed between the heat energy ray irradiating process and the reducing process).

That is, spin coating (500 rpm×60 sec) was first performed with the coating for forming transparent conductive film described above on an entire surface of a non-alkali glass substrate (10 cm×10 cm×thickness of 0.7 mm; visible light transmittance=91.2%, haze value=0.26%) at 25° C., and then the surface was dried in the atmosphere at 180° C. for ten minutes, thereby obtaining a dried coating film 3 (film thickness: 700 nm, surface resistivity: >1×10$^{13}$ Ω/sq (insulated)). The temperature of the substrate having this dried coating film was increased as shown in the schematic view FIG. 3 to 200° C. (temperature elevation rate: 40° C./minute) in the air at a dew-point temperature of −50° C. In the state where 200° C. was kept while low-humidity air having a dew-point temperature of −50° C. was being supplied between a ultraviolet ray irradiation window 5 (synthetic quartz plate having a thickness of 2 mm) and the substrate 2, irradiation of heat energy rays from the low-pressure mercury lamp 4 for twenty minutes was performed to promote mineralization of the dried coating film 3 (decomposition or burning of organic components) and densification (the film thickness at this stage: 170 nm). Note that the distance (irradiation distance) between the low-pressure mercury lamp 4 and the substrate 2 was 10.5 mm, illuminance of light of 254 nm was approximately 20 mW/cm$^2$, and estimated illuminance of light of 185 nm was approximately 5 mW/cm$^2$. Furthermore, a space between the substrate 2 and the ultraviolet ray irradiation window 5 was 3.5 mm, and the average velocity of flow of the atmospheric gas (low-humidity air at a dew-point temperature of −50° C.) flowing therebetween was approximately 0.29 m/sec).

Figure 11:
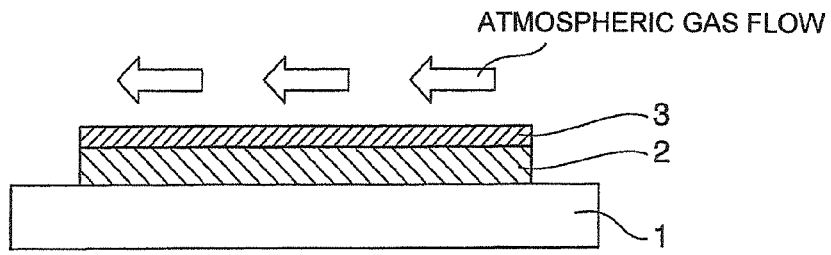
FIG. 11 is a schematic view of a baking process in the transparent conductive film manufacturing process with the conventional coating method (a heat energy ray irradiating process is not performed).

Next (as shown in a schematic view of FIG. 11, which will be described further below), as a heating process under the reducing atmosphere without performing energy ray irradiation, a heating process was performed under 1% hydrogen-99% nitrogen (3 litters/minute supply and the average velocity of flow of the gas over the substrate 2 was approximately 0.045 m/second) at 230° C. for sixty minutes to fabricate a transparent conductive film (film thickness: 155 nm) according to Example 1 having indium oxide ($In_2O_3$) containing a dopant tin oxide ($SnO_2$), as a main component.

Conditions of manufacturing a transparent conductive film and thicknesses of the dried coating film and the inorganic film are shown in Table 1. Also, various characteristics including surface resistivity, haze value, visible light transmittance, transparent conductive film thickness, specific resistance, crystallite size, and pencil hardness of the fabricated transparent conductive film were measured, and the results are shown in Table 2.

Furthermore, when a cross section of the transparent conductive film of Example 1 was observed with a transmission electron microscope, from its transmission electron microscope photographs (TEM images) and Z contrast image, it has been found that the transparent conductive film is configured of a conductive oxide fine-particle layer densely packed with conductive oxide fine particles formed mainly with ITO fine particles (amorphous microcrystals) on the order of 5 nm to 10 nm and those equal to or smaller than 3 nm mixed together.

Note that this Z contrast image is a high-angle annular dark field (HAADF) image, which is obtained by using an annular detector to detect inelastic scattering electrons scattered at a large angle when electrons pass through the sample for imaging, and the detection intensity is proportional to the square of the atomic number.

The surface resistivity of the transparent conductive film was measured by using a surface resistivity meter Loresta AP (MCP-T400) manufactured by Mitsubishi Chemical Corporation.

The haze value and the visible light transmittance were measured by using a haze meter (NDH 5000) manufactured by Nippon Denshoku Industries Co., Ltd., based on JIS K 7136 (stipulating a haze value measuring method) and JIS K 7361-1 (stipulating a transmittance measuring method).

The film thickness was measured by using a stylus-type film thickness meter (Alpha-Step IQ) manufactured by KLA-Tencor Corporation.

The crystallite size was found by performing an X-ray diffraction measurement, and the (222) peak of indium oxide ($In_2O_3$) was found by the Scherrer method.

The pencil hardness was measured based on JIS K 5400.

Note that the visible light transmittance and the haze value are values only for the transparent conductive film, and each was found from Equation 1 and Equation 2 below.

$$\text{Transmittance of a transparent conductive film (\%)} = \frac{\text{Transmittance of a substrate together with the transparent conductive film formed thereon}}{\text{Transmittance of only the substrate}} \times 100 \quad \text{[Equation 1]}$$

$$\text{Haze value(\%) of a transparent conductive film} = \text{Haze value of a substrate together with the transparent conductive film formed thereon} - \text{Haze value of only the substrate} \quad \text{[Equation 2]}$$

Example 2

[Formulation of Solution Liquid C]

40 g of indium acetylacetonate $In(C_5H_7O_2)_3$ (molecular weight=412.15), 43.5 g of p-tert-butylphenol, 14.5 g of dibasic acid ester (manufactured by Du Pont Japan), and 2 g of hydroxypropylcellulose (HPC) were mixed together, heated to 130° C., and agitated for ninety minutes for dissolution. Next, 25 g of the obtained solution, 25 g of cyclohexanone, 10 g of propylene glycol monomethyl ether (PGM), and 40 g of methyl ethyl ketone (MEK) were mixed together and agitated well until they became uniform, thereby formulating an solution (liquid C) containing indium acetylacetonate and hydroxypropylcellulose.

[Formulation of Solution Liquid D]

40 g of tin acetylacetonate (standard nomenclature: di-n-butyl bis(2,4-pentanedionato) tin: $[Sn(C_4H_9)_2(C_5H_7O_2)_2]$) (molecular weight=431.14), 43.5 g of p-tert-butylphenol, 14.5 g of dibasic acid ester (manufactured by Du Pont Japan), and 1 g of hydroxypropylcellulose (HPC) were mixed together, heated to 130° C., and agitated for ninety minutes for dissolution. Next, 25 g of the obtained aqueous solution, 25 g of cyclohexanone, 10 g of propylene glycol monomethyl ether (PGM), and 40 g of methyl ethyl ketone (MEK) were mixed together and agitated well until they became uniform, thereby formulating an aqueous solution (liquid D) containing tin acetylacetonate and hydroxypropylcellulose.

[Formulation of the Coating Liquid]

9.1 g of the formulated liquid C and 0.9 g of the formulated liquid D were agitated well until they become uniform, thereby formulating a coating liquid for forming transparent conductive film containing 10 weight % of indium acetylacetonate and tin acetylacetonate in total and 0.5 weight % of hydroxypropylcellulose.

[Fabrication of the Transparent Conductive Film]

Next, the transparent conductive film was fabricated by this coating liquid for forming transparent conductive film based on a manufacturing process flow shown in FIG. 5.

That is, spin coating (750 rpm×60 sec) was first performed with the coating for forming transparent conductive film described above on an entire surface of a non-alkali glass substrate (10 cm×10 cm×thickness of 0.7 mm; visible light transmittance=91.2%, haze value=0.26%) at 25° C., and then the surface was dried in the atmosphere at 150° C. for ten minutes, thereby obtaining a dried coating film 3 (film thickness: 380 nm, surface resistivity: >1×10$^{13}$ Ω/sq (insulated)). The temperature of the substrate having this dried coating film was increased as shown in the schematic view FIG. 3 to 150° C. (temperature elevation rate: 30° C./minute) in the air at a dew-point temperature of −50° C. In the state where 150° C. was kept while low-humidity air having a dew-point temperature of −50° C. was being supplied between the ultraviolet ray irradiation window 5 (synthetic quartz plate having a thickness of 2 mm) and the substrate 2, irradiation of heat energy rays from the low-pressure mercury lamp 4 for twenty minutes was performed to promote mineralization of the dried coating film 3 (decomposition or burning of organic components) and densification (the film thickness at this stage: 115 nm).

Next, with the apparatus structure being kept the same, the atmosphere was changed from the low-humidity air at a dew-point temperature of −50° C. to 1% hydrogen-99% nitrogen, and then the temperature was increased to 200° C. (temperature elevation rate: 40° C./minute). While energy ray irradiation with the low-pressure mercury lamp 4 described above was being performed, a reducing process was performed under 1% hydrogen-99% nitrogen at 200° C. for sixty minutes as a heating process (a reducing process) under the reducing atmosphere, thereby fabricating a transparent conductive film (film thickness: 105 nm) according to Example 2 having indium oxide ($In_2O_3$) containing dopant tin oxide ($SnO_2$), as a main component. Note that the distance (irradiation distance) between the low-pressure mercury lamp 4 and the substrate 2 was 10.5 mm, illuminance of light of 254 nm was approximately 20 mW/cm$^2$, and estimated illuminance of light of 185 nm was approximately 5 mW/cm$^2$. Furthermore, the space between the substrate 2 and the ultraviolet ray irradiation window 5 was 3.5 mm, and the average velocity of flow of the atmospheric gas (low-humidity air at a dew-point temperature of −50° C. and 1% hydrogen-99% nitrogen) flowing therebetween was approximately 0.29 m/sec).

Conditions of manufacturing a transparent conductive film and thicknesses of the dried coating film and the inorganic film are shown in Table 1. Also, various characteristics of the fabricated transparent conductive film were measured in a manner similar to that of Example 1, and the results are shown in Table 2.

Furthermore, when a cross section of the transparent conductive film of Example 2 was observed with a transmission electron microscope, from its transmission electron microscope photographs (TEM images) and Z contrast image, it has been found that the transparent conductive film is configured of a conductive oxide fine-particle layer densely packed with conductive oxide fine particles formed mainly with ITO fine particles (amorphous microcrystals) equal to or smaller than 3 nm.

Example 3

The transparent conductive film was fabricated by using the coating liquid for forming transparent conductive film used in Example 2 based on the manufacturing process flow shown in FIG. 4 (a heating process was performed between the heat energy ray irradiating process and the reducing process).

That is, a dried coating film (film thickness: approximately 380 nm, surface resistivity: >1×10$^{13}$ Ω/sq (insulated)) similar to that of Example 2 was obtained. The temperature of the substrate having this dried coating film was increased as shown in the schematic view FIG. 3 to 150° C. (temperature elevation rate: 30° C./minute) in the air at a dew-point temperature of −60° C. In the state where 150° C. was kept while low-humidity air having a dew-point temperature of −60° C. was being supplied between the ultraviolet ray irradiation window 5 (synthetic quartz plate having a thickness of 2 mm) and the substrate 2, irradiation of heat energy rays from the low-pressure mercury lamp 4 for twenty minutes was performed to promote mineralization of the dried coating film 3 (decomposition or burning of organic components) and densification (the film thickness at this stage: 110 nm). Note that the distance (irradiation distance) between the low-pressure mercury lamp 4 and the substrate 2 was 10.5 mm, illuminance of light of 254 nm was approximately 20 mW/cm$^2$, and estimated illuminance of light of 185 nm was approximately 5 mW/cm$^2$. Furthermore, the space between the substrate 2 and the ultraviolet ray irradiation window 5 was 3.5 mm, and the average velocity of flow of the atmospheric gas (low-humidity air at a dew-point temperature of −50° C.) flowing therebetween was approximately 0.29 m/sec.

Next (as shown in a schematic view of FIG. 11, which will be described further below), as a heating process in the low-humidity air at a dew-point temperature of −60° C. without performing energy ray irradiation, a heating process was performed at 500° C. for fifteen minutes (3 litters/minute supply and the average velocity of flow of the gas over the substrate 2 was approximately 0.045 m/second). Subsequently, as a heating process under the reducing atmosphere, a heating process was performed at 500° C. for fifteen minutes (3 litters/minute supply and the average velocity of flow of the gas over the substrate 2 was approximately 0.045 m/second) to fabricate a transparent conductive film (film thickness: 76 nm) according to Example 3 having indium oxide ($In_2O_3$) containing a dopant tin oxide ($SnO_2$) as a main component.

Conditions of manufacturing a transparent conductive film and thicknesses of the dried coating film and the inorganic film are shown in Table 1. Also, various characteristics of the fabricated transparent conductive film were measured in a manner similar to that of Example 1, and the results are shown in Table 2.

Furthermore, when a cross section of the transparent conductive film of Example 3 was observed with a transmission electron microscope, from its transmission electron microscope photographs (TEM images) and Z contrast image, it has been found that the transparent conductive film is configured of a conductive oxide fine-particle layer densely packed with conductive oxide fine particles formed mainly with ITO fine particles (microcrystal particles) on the order of 20 nm to 30 nm and having a special structure in which regions (oriented regions) having the conductive oxide fine particles oriented with the same crystal orientation are adjacent to each other.

Example 4

The transparent conductive film was fabricated by using the coating liquid for forming transparent conductive film used in Example 2 based on the manufacturing process flow shown in FIG. 4 (no heating process was performed between the heat energy ray irradiating process and the reducing process).

That is, in Example 3, a heating process in a low-humidity air at a dew-point temperature of −60° C. without heat energy ray irradiation (at 500° C. for fifteen minutes) was not performed after heat energy ray irradiation. Next (as shown in the schematic view of FIG. 11, which will be described further below), as a heating process under the reducing atmosphere, a heating process was performed under 1% hydrogen-99% nitrogen (3 litters/minute supply and the average velocity of flow of the gas over the substrate 2 was approximately 0.045 m/second) at 500° C. for fifteen minutes to fabricate a transparent conductive film (film thickness: 81 nm) according to Example 4 having indium oxide ($In_2O_3$) containing a dopant tin oxide ($SnO_2$), as a main component.

Conditions of manufacturing a transparent conductive film and thicknesses of the dried coating film and the inorganic film are shown in Table 1. Also, various characteristics of the fabricated transparent conductive film were measured in a manner similar to that of Example 1, and the results are shown in Table 2.

Furthermore, when a cross section of the transparent conductive film of Example 4 was observed with a transmission electron microscope, from its transmission electron microscope photographs (TEM images) and Z contrast image, it has been found that the transparent conductive film is configured of a conductive oxide fine-particle layer densely packed with conductive oxide fine particles formed mainly with ITO fine particles (microcrystal particles) on the order of 20 nm to 30 nm and having a special structure in which regions (oriented regions) having the conductive oxide fine particles oriented with the same crystal orientation are adjacent to each other.

Example 5

[Fabrication of the Coating Liquid]

9.9 g of tin acetylacetonate (standard nomenclature: di-n-butyl bis(2, 4-pentanedionato) tin [$Sn(C_4H_9)_2(C_5H_7O_2)_2$]) (molecular weight=431.14), 0.1 g of antimony(III)-n-butoxide [$Sb(C_4H_9O)_3$] (molecular weight=341.08), 10.5 g of p-tert-butylphenol, 3.5 g of dibasic acid ester (manufactured by Du Pont Japan), 1 g of hydroxypropylcellulose (HPC), and 75 g of acetylacetonate were mixed together, heated to 120° C., and agitated well for one hundred and twenty minutes until they became uniform, thereby formulating a coating liquid for forming transparent conductive film containing 10 weight % of tin acetylacetonate and antimony (III)-n-butoxide in total and 1 weight % of hydroxypropylcellulose.

[Fabrication of the Transparent Conductive Film]

The transparent conductive film was fabricated by this coating liquid for forming transparent conductive film based on a manufacturing process flow shown in FIG. 4 (a heating process was not performed between the heat energy ray irradiating process and the reducing process).

That is, spin coating (500 rpm×60 sec) was first performed with the coating for forming transparent conductive film described above on an entire surface of a soda lime glass substrate (10 cm×10 cm×thickness of 3 mm; haze value=0.26%, visible light transmittance=91.1%) at 25° C., and then the surface was dried in the atmosphere at 180° C. for ten minutes, thereby obtaining the dried coating film 3 (film thickness: approximately 300 nm, surface resistivity: >1×10$^{13}$ Ω/sq (insulated)). The temperature of the substrate having this dried coating film was increased as shown in the schematic view FIG. 3 to 150° C. (temperature elevation rate: 30° C./minute) in the air at a dew-point temperature of −40° C. In the state where 150° C. was kept while low-humidity air having a dew-point temperature of −40° C. was being supplied between the ultraviolet ray irradiation window 5 (synthetic quartz plate having a thickness of 2 mm) and the substrate 2, irradiation of heat energy rays from the low-pressure mercury lamp 4 for twenty minutes was performed to promote mineralization of the dried coating film 3 (decomposition or burning of organic components) and densification (the film thickness at this stage: 80 nm). Note that the distance (irradiation distance) between the low-pressure mercury lamp 4 and the substrate 2 was 10.5 mm, illuminance of light of 254 nm was approximately 20 mW/cm$^2$, and estimated illuminance of light of 185 nm was approximately 5 mW/cm$^2$. Furthermore, a space between the substrate 2 and the ultraviolet ray irradiation window 5 was 3.5 mm, and the average velocity of flow of the atmospheric gas (low-humidity air at a dew-point temperature of −40° C.) flowing therebetween was approximately 0.29 m/sec).

Next (as shown in the schematic view of FIG. 11, which will be described further below), as a heating process in the low-humidity air at a dew-point temperature of −40° C. without performing energy ray irradiation, a heating process was performed under at 500° C. for fifteen minutes (3 litters/minute supply and the average velocity of flow of the gas over the substrate 2 was approximately 0.045 m/second). Subsequently, as a heating process under the reducing atmosphere, a heating process was performed under 1% hydrogen-99% nitrogen (3 litters/minute supply and the average velocity of flow of the gas over the substrate 2 was approximately 0.045 m/second) at 500° C. for fifteen minutes to fabricate a transparent conductive film (film thickness: 60 nm) according to Example 5 having tin oxide ($SnO_2$) containing a dopant antimony oxide, as a main component.

Conditions of manufacturing a transparent conductive film and thicknesses of the dried coating film and the inorganic film are shown in Table 1. Also, various characteristics of the fabricated transparent conductive film were next measured in a manner similar to that of Example 1, and the results are shown in Table 2.

Furthermore, when a cross section of the transparent conductive film of Example 5 was observed with a transmission electron microscope, from its transmission electron microscope photographs (TEM images) and Z contrast image, it has been found that the transparent conductive film is configured of a conductive oxide fine-particle layer densely packed with conductive oxide fine particles formed mainly with ATO fine particles (microcrystal particles) on the order of 5 nm to 10 nm and having a special structure in which regions (oriented regions) having the conductive oxide fine particles oriented with the same crystal orientation are adjacent to each other.

Example 6|[o4]

[Formulation of Solution Liquid E]

10 g of zinc acetylacetonate (standard nomenclature: zinc-2,4-pentanedionate) [$Zn(C_5H_7O_2)_2$] (molecular weight=263.59), 49.99 g of γ-butyrolactone, 38 g of acetylacetonate, 2 g of hydroxypropylcellulose (HPC), and 0.01 g of a surface-active agent were mixed together, heated to 120° C., and agitated for ninety minutes for dissolution well until they became uniform, thereby formulating a solution (liquid E) containing zinc acetylacetonate and hydroxypropylcellulose.

[Formulation of Solution Liquid F]

10 g of aluminum acetylacetonate (standard nomenclature: aluminum-2, 4-pentanedionate) [$Al(C_5H_7O_2)_3$] (molecular weight=324.29), 28.5 g of p-tert-butylphenol, 9.5 g of dibasic acid ester (manufactured by Du Pont Japan), 49.99 g of acetylacetonate, 2 g of hydroxypropylcellulose (HPC), and 0.01 g of a surface-active agent were mixed together, heated to 120° C., and agitated for ninety minutes for dissolution well until they became uniform, thereby formulating a solution (liquid F) containing aluminum acetylacetonate and hydroxypropylcellulose.

[Formulation of the Coating Liquid]

9.5 g of the formulated liquid E and 0.5 g of the formulated liquid B were agitated well until they become uniform, thereby formulating a coating liquid for forming transparent conductive film containing 10 weight % of zinc acetylacetonate and aluminum acetylacetonate in total and 2 weight % of hydroxypropylcellulose.

[Fabrication of the Transparent Conductive Film]

The transparent conductive film was fabricated by using this coating liquid for forming transparent conductive film, based on the manufacturing process flow shown in FIG. 4 (a heating process was not performed between the heat energy ray irradiating process and the reducing process).

That is, spin coating (500 rpm×60 sec) was first performed with the coating for forming transparent conductive film described above on an entire surface of a soda lime glass substrate (10 cm×10 cm×thickness of 3 mm; haze value=0.26%, visible light transmittance=91.1%) at 25° C., and then the surface was dried in the atmosphere at 180° C. for ten minutes, thereby obtaining the dried coating film 3 (film thickness: approximately 560 nm, surface resistivity: >1×10$^{13}$ Ω/sq (insulated)). The temperature of the substrate having this dried coating film was increased as shown in the schematic view FIG. 3 to 150° C. (temperature elevation rate: 30° C./minute) in the air at a dew-point temperature of −40° C. In the state where 150° C. was kept while low-humidity air having a dew-point temperature of −40° C. was being supplied between the ultraviolet ray irradiation window 5 (synthetic quartz plate having a thickness of 2 mm) and the substrate 2, irradiation of heat energy rays from the low-pressure mercury lamp 4 for ten minutes was performed to promote mineralization of the dried coating film 3 (decomposition or burning of organic components) and densification (the film thickness at this stage: 180 nm). Note that the distance (irradiation distance) between the low-pressure mercury lamp 4 and the substrate 2 was 10.5 mm, illuminance of light of 254 nm was approximately 20 mW/cm$^2$, and estimated illuminance of light of 185 nm was approximately 5 mW/cm$^2$. Furthermore, a space between the substrate 2 and the ultraviolet ray irradiation window 5 was 3.5 mm, and the average velocity of flow of the atmospheric gas (low-humidity air at a dew-point temperature of −40° C.) flowing therebetween was approximately 0.29 m/sec).

Next (as shown in the schematic view of FIG. 11, which will be described further below), as a heating process in the low-humidity air at a dew-point temperature of −40° C. without performing energy ray irradiation, a heating process was performed under at 500° C. for fifteen minutes (3 litters/minute supply and the average velocity of flow of the gas over the substrate 2 was approximately 0.045 m/second). Subsequently, as a heating process under the reducing atmosphere, a heating process was performed under 1% hydrogen-99% nitrogen (3 litters/minute supply and the average velocity of flow of the gas over the substrate 2 was approximately 0.045 m/second) at 500° C. for fifteen minutes to fabricate a transparent conductive film (film thickness: 140 nm) according to Example 6 having zinc oxide (ZnO$_2$) containing a dopant aluminum oxide (Al$_2$O$_3$) (that is, AZO), as a main component.

Conditions of manufacturing a transparent conductive film and thicknesses of the dried coating film and the inorganic film are shown in Table 1. Also, various characteristics of the fabricated transparent conductive film were measured in a manner similar to that of Example 1, and the results are shown in Table 2.

Furthermore, when a cross section of the transparent conductive film of Example 6 was observed with a transmission electron microscope, from its transmission electron microscope photographs (TEM images) and Z contrast image, it has been found that the transparent conductive film is configured of a conductive oxide fine-particle layer densely packed with conductive oxide fine particles formed mainly with AZO fine particles (microcrystal particles) on the order of 20 nm to 30 nm and having a special structure in which regions (oriented regions) having the conductive oxide fine particles oriented with the same crystal orientation are adjacent to each other.

Example 7

[Formulation of the Coating Liquid]

9.5 g of the liquid C and 0.5 g of the liquid D formulated in Example 2 were agitated well until they become uniform, thereby formulating a coating liquid for forming transparent conductive film containing 10 weight % of indium acetylacetonate and tin acetylacetonate in total and 0.5 weight % of hydroxypropylcellulose.

[Fabrication of the Transparent Conductive Film]

Next, the transparent conductive film was fabricated by using this coating liquid for forming transparent conductive film, based on the manufacturing process flow shown in FIG. 4.

Figure 6:
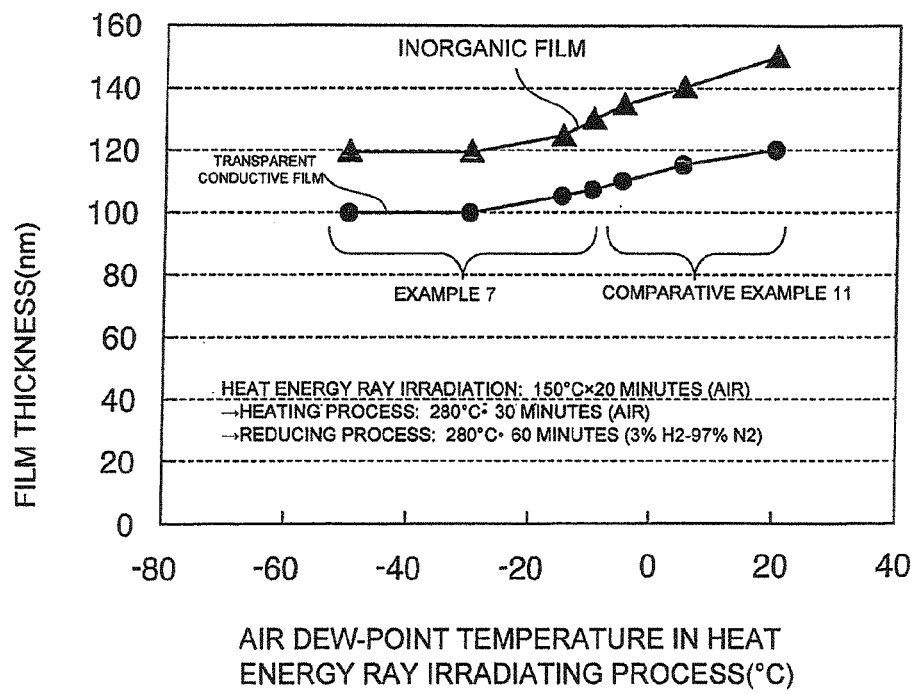
FIG. 6 is a drawing that shows film thicknesses of an inorganic film and a transparent conductive film according to Example 7 and Comparative Example 11.
Figure 7:
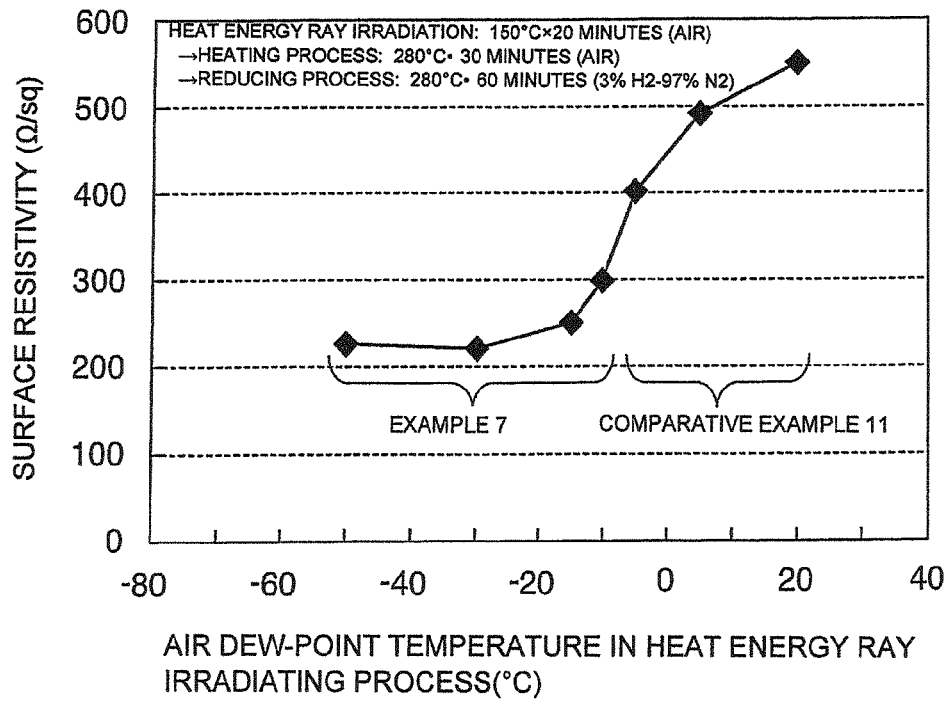
FIG. 7 is a drawing that shows a surface resistivity of the transparent conductive film according to Example 7 and Comparative Example 11.
Figure 8:
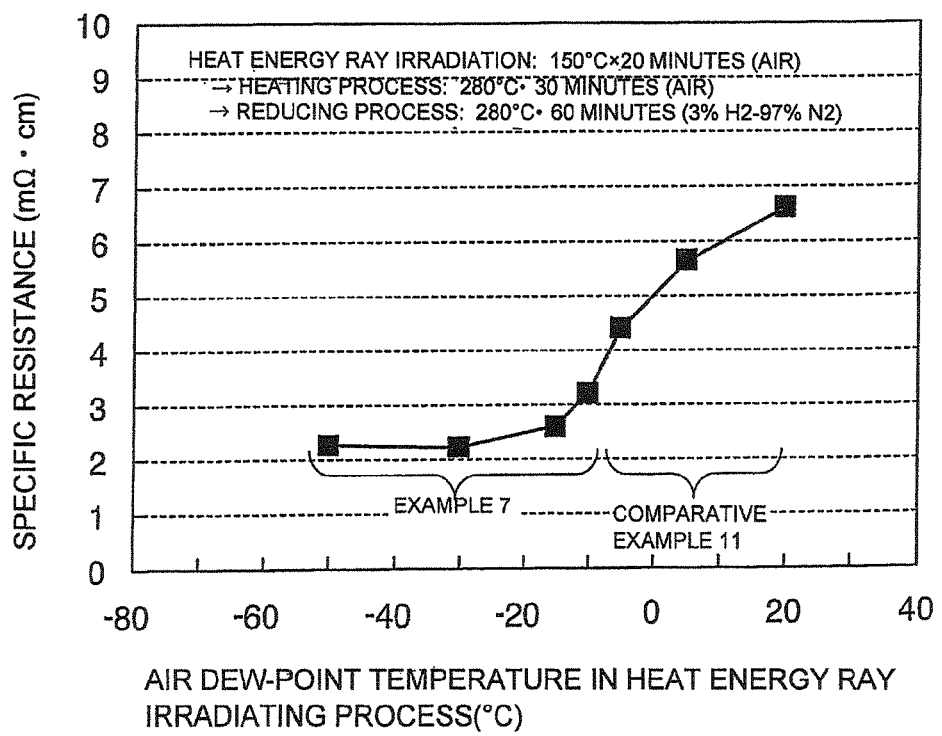
FIG. 8 is a drawing that shows a specific resistance of the transparent conductive film according to Example 7 and Comparative Example 11.
Figure 9:
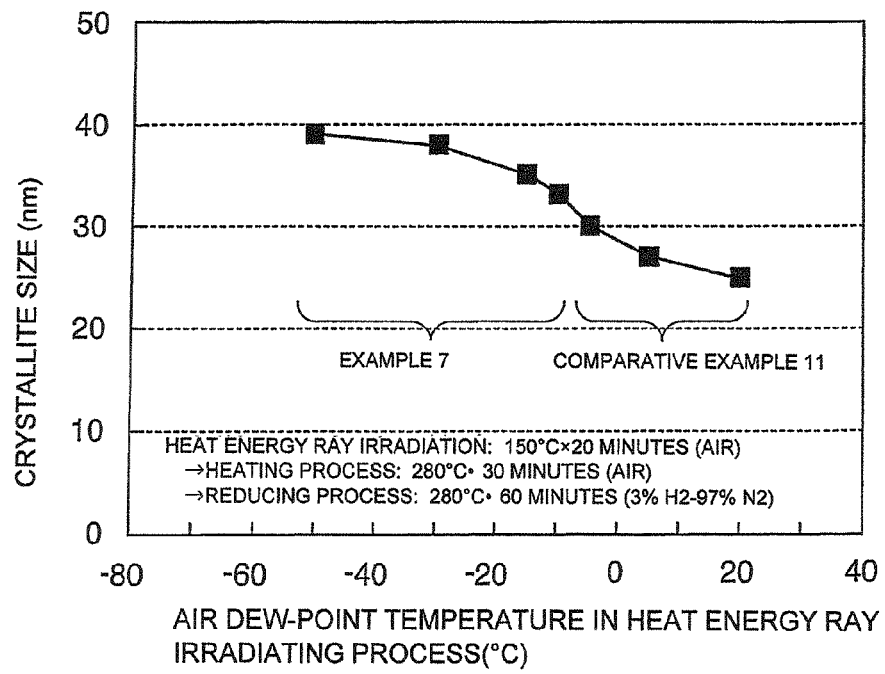
FIG. 9 is a drawing that shows a crystalline size of the transparent conductive film according to Example 7 and Comparative Example 11.

That is, spin coating (750 rpm×60 sec) was first performed with the coating for forming transparent conductive film described above on an entire surface of a non-alkali glass substrate (10 cm×10 cm×thickness of 0.7 mm; visible light transmittance=91.2%, haze value=0.26%) at 25° C., and then the surface was dried in the atmosphere at 150° C. for ten minutes, thereby obtaining the dried coating film 3 (film thickness: 415 nm, surface resistivity: >1×10$^{13}$ Ω/sq (insulated)). The temperature of the substrate having this dried coating film was increased as shown in the schematic view FIG. 3 to 150° C. (temperature elevation rate: 30° C./minute) in the air having various dew-point temperatures of −10° C., −15° C., −30° C., and −50° C. Subsequently, in the state where heating was performed at 150° C. while low-humidity air having each dew-point temperature was being supplied between the ultraviolet ray irradiation window 5 (synthetic quartz plate having a thickness of 2 mm) and the substrate 2, irradiation of heat energy rays from the low-pressure mercury lamp 4 for twenty minutes was performed to promote mineralization of the dried coating film 3 (decomposition or burning of organic components) and densification, thereby obtaining various inorganic films each having a metal oxide as a main component. The film thickness of these various inorganic films are shown in FIG. 6. Note that the distance (irradiation distance) between the low-pressure mercury lamp 4 and the substrate 2 was 10.5 mm, illuminance of light of 254 nm was approximately 20 mW/cm$^2$, and estimated illuminance of light of 185 nm was approximately 5 mW/cm$^2$. Furthermore, a space between the substrate 2 and the ultraviolet ray irradiation window 5 was 3.5 mm, and the average velocity of flow of the atmospheric gas (low-humidity air at the respective dew-point temperatures of −10° C., −15° C., −30° C., and −50° C.) flowing therebetween was approximately 0.29 m/sec).

Next (as shown in the schematic view of FIG. 11, which will be described further below), the atmosphere was switched from the low-humidity air having various dew-point temperatures of −10° C., −15° C., −30° C., and −50° C. to low-humidity air at a dew-point temperature of −60° C. As a heating process in the low-humidity air at a dew-point temperature of −60° C. without performing energy ray irradiation, a heating process was performed under at 280°

C. for thirty minutes (3 litters/minute supply and the average velocity of flow of the gas over the substrate 2 was approximately 0.045 m/second). Subsequently, as a heating process under the reducing atmosphere, a heating process was performed under 3% hydrogen-97% nitrogen (3 litters/minute supply and the average velocity of flow of the gas over the substrate 2 was approximately 0.045 m/second) at 280° C. for sixty minutes to fabricate various transparent conductive films according to Example 7 having indium oxide ($In_2O_3$) containing a dopant tin oxide ($SnO_2$), as a main component.

The air atmospheres having various dew-point temperatures of −10° C., −15° C., −30° C., and −50° C. described above are each obtained by supplying a predetermined rate of flow of air having a dew-point temperature of 20° C. and a predetermined rate of flow of air having a dew-point temperature of −60° C. and mixing these airs well.

Conditions of manufacturing various transparent conductive films and thicknesses of the dried coating film and various inorganic film are shown in Table 1. Also, various characteristics of the fabricated various transparent conductive films were measured in a manner similar to that of Example 1, and the results are shown in Table 2. Note that the results of film thickness, surface resistivity, specific resistance, and crystallite size of each of the various transparent conductive films are shown in FIG. 6, FIG. 7, FIG. 8, and FIG. 9, respectively.

Furthermore, when a cross section of each of the various transparent conductive films of Example 7 was observed with a transmission electron microscope, from its transmission electron microscope photographs (TEM images) and Z contrast image, it has been found that the transparent conductive film is configured of a conductive oxide fine-particle layer densely packed with conductive oxide fine particles formed mainly with ITO fine particles (microcrystal particles) on the order of 20 nm to 30 nm and having a special structure in which regions (oriented regions) having the conductive oxide fine particles oriented with the same crystal orientation are adjacent to each other.

Example 8

[Fabrication of the Transparent Conductive Film]

The transparent conductive film was fabricated by using the coating liquid for forming transparent conductive film used in Example 1, based on the manufacturing process flow shown in FIG. 4 (a heating process was performed between the heat energy ray irradiating process and the reducing process).

That is, spin coating (1000 rpm×60 sec) was first performed with the coating for forming transparent conductive film described above on an entire surface of a non-alkali glass substrate (10 cm×10 cm×thickness of 0.7 mm; visible light transmittance=91.2%, haze value=0.26%) at 25° C., and then the surface was dried in the atmosphere at 150° C. for ten minutes, thereby obtaining the dried coating film 3 (film thickness: approximately 540 nm, surface resistivity: >1×10$^{13}$ Ω/sq (insulated)). The substrate having this dried coating film was subjected to heat energy ray irradiation from the low-pressure mercury lamp 4 for twenty minutes, as shown in the schematic view FIG. 3, while low-humidity air having a dew-point temperature of −55° C. was being supplied between the ultraviolet ray irradiation window 5 (synthetic quartz plate having a thickness of 2 mm) and the substrate 2 without heating by a heating apparatus (a hot plate), thereby promoting mineralization of the dried coating film 3 (decomposition or burning of organic components) and densification (the film thickness at this stage: 160 nm).

Note that the distance (irradiation distance) between the low-pressure mercury lamp 4 and the substrate 2 was 10.5 mm, illuminance of light of 254 nm was approximately 20 mW/cm$^2$, and estimated illuminance of light of 185 nm was approximately 5 mW/cm$^2$. Furthermore, a space between the substrate 2 and the ultraviolet ray irradiation window 5 was 3.5 mm, and the average velocity of flow of the atmospheric gas (low-humidity air at a dew-point temperature of −55° C.) flowing therebetween was approximately 0.29 m/sec). In heat energy ray irradiation of the low-pressure mercury lamp 4 described above, the substrate temperature was increased to approximately 40° C. with heat rays in the heat energy rays.

Next (as shown in the schematic view of FIG. 11, which will be described further below), as a heating process in the low-humidity air having a dew-point temperature of −55° C. without performing energy ray irradiation, a heating process was performed at 250° C. for thirty minutes (5 litters/minute supply and the average velocity of flow of the gas over the substrate 2 was approximately 0.075 m/second). Subsequently, as a heating process under the reducing atmosphere, a heating process was performed under 3% hydrogen-97% nitrogen (5 litters/minute supply and the average velocity of flow of the gas over the substrate 2 was approximately 0.075 m/second) at 250° C. for thirty minutes to fabricate a transparent conductive film (film thickness: 90 nm) according to Example 8 having indium oxide ($In_2O_3$) containing a dopant tin oxide ($SnO_2$), as a main component.

Conditions of manufacturing a transparent conductive film and thicknesses of the dried coating film and the inorganic film are shown in Table 1. Also, various characteristics of the fabricated transparent conductive film were measured in a manner similar to that of Example 1, and the results are shown in Table 2.

Furthermore, when a cross section of the transparent conductive film of Example 3 was observed with a transmission electron microscope, from its transmission electron microscope photographs (TEM images) and Z contrast image, it has been found that the transparent conductive film is configured of a conductive oxide fine-particle layer densely packed with conductive oxide fine particles formed mainly with ITO fine particles (amorphous microcrystals) equal to or smaller than 3 nm.

Example 9

The transparent conductive film was fabricated by using the coating liquid for forming transparent conductive film used in Example 1, based on the manufacturing process flow shown in FIG. 4 (a heating process was performed between the heat energy ray irradiating process and the reducing process).

That is, spin coating (1000 rpm×60 sec) was first performed with the coating for forming transparent conductive film described above on an entire surface of a non-alkali glass substrate (10 cm×10 cm×thickness of 0.7 mm; visible light transmittance=91.2%, haze value=0.26%) at 25° C., and then the surface was dried in the atmosphere at 150° C. for ten minutes, thereby obtaining the dried coating film 3 (film thickness: approximately 540 nm, surface resistivity: >1×10$^{13}$ Ω/sq (insulated)). The temperature of the substrate having this dried coating film was increased as shown in the schematic view FIG. 3 to 150° C. (temperature elevation rate: 30° C./minute) in the air having a dew-point temperature of −55° C., while low-humidity air having a dew-point temperature of −55° C. In the state where 150° C. was kept while low-humidity air having a dew-point temperature of −55° C. was being supplied between the ultraviolet ray irradiation window 5 (synthetic quartz plate having a thickness of 2 mm) and the substrate 2, irradiation of heat energy rays from the low-pressure mercury lamp 4 for twenty minutes was performed to promote mineralization of the dried coating film 3 (decomposition or burning of organic components) and densification (the film thickness at this stage: 108 nm).

Note that the distance (irradiation distance) between the low-pressure mercury lamp 4 and the substrate 2 was 10.5 mm, illuminance of light of 254 nm was approximately 20 mW/cm$^2$, and estimated illuminance of light of 185 nm was approximately 5 mW/cm$^2$. Furthermore, a space between the substrate 2 and the ultraviolet ray irradiation window 5 was 3.5 mm, and the average velocity of flow of the atmospheric gas (low-humidity air at a dew-point temperature of −55° C.) flowing therebetween was approximately 0.29 m/sec).

Next (as shown in the schematic view of FIG. 11, which will be described further below), as a heating process in the low-humidity air having a dew-point temperature of −55° C. without performing energy ray irradiation, a heating process was performed at 290° C. for thirty minutes (5 litters/minute supply and the average velocity of flow of the gas over the substrate 2 was approximately 0.075 m/second). Subsequently, as a heating process under the reducing atmosphere, a heating process was performed under 1% hydrogen-99% nitrogen (5 litters/minute supply and the average velocity of flow of the gas over the substrate 2 was approximately 0.075 m/second) at 290° C. for thirty minutes to fabricate a transparent conductive film (film thickness: 86 nm) according to Example 9 having indium oxide ($In_2O_3$) containing a dopant tin oxide ($SnO_2$), as a main component.

Conditions of manufacturing a transparent conductive film and thicknesses of the dried coating film and the inorganic film are shown in Table 1. Also, various characteristics of the fabricated transparent conductive film were measured in a manner similar to that of Example 1, and the results are shown in Table 2.

Furthermore, when a cross section of the transparent conductive film of Example 9 was observed with a transmission electron microscope, from its transmission electron microscope photographs (TEM images) and Z contrast image, it has been found that the transparent conductive film is configured of a conductive oxide fine-particle layer densely packed with conductive oxide fine particles formed mainly with ITO fine particles (amorphous microcrystals) equal to or smaller than 3 nm.

Comparative Example 1

Figure 10:
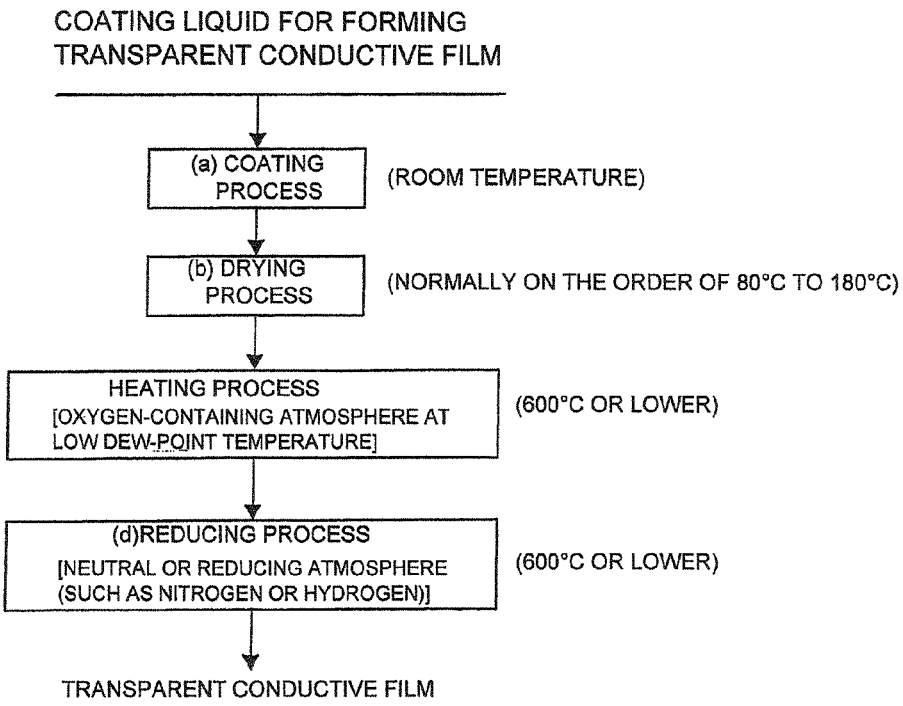
FIG. 10 is a drawing that shows an example of the transparent conductive film manufacturing process flow with the coating method (a heat energy ray irradiating process is not performed).

The transparent conductive film was fabricated by using the coating liquid for forming transparent conductive film used in Example 1, based on a manufacturing process flow shown in FIG. 10 (without a heat energy ray irradiating process).

After obtaining the dried coating film (film thickness: 700 nm, surface resistivity: >1×10$^{13}$ Ω/sq (insulated)) similar to that of Example 1, a heat energy ray irradiating process of heating the film to 200° C. and irradiating the film with the low-pressure mercury lamp for twenty minutes was not performed. As shown in the schematic view of FIG. 11, a heating process was simply performed in the air having a dew-point temperature of −50° C. (in a low-humidity air atmosphere) at 200° C. for twenty minutes. Next, as a heating process under the reducing atmosphere without performing energy ray irradiation, a heating process was performed under 1% hydrogen-99% nitrogen (3 litters/minute supply and the average velocity of flow of the gas over the substrate was approximately 0.045 m/second) at 230° C. for sixty minutes to fabricate a transparent insulating film (film thickness: 600 nm) according to Comparative Example 1.

Conditions of manufacturing a transparent insulating film and thickness of the dried coating film are shown in Table 1. Also, various characteristics of the fabricated transparent insulating film were measured in a manner similar to that of Example 1, and the results are shown in Table 2.

Furthermore, when a cross section of the transparent conductive film of Comparative Example 1 was observed with a transmission electron microscope, mineralization of the film had hardly proceed, and conductive oxide fine particles were not observed.

Comparative Example 2

Figure 12:
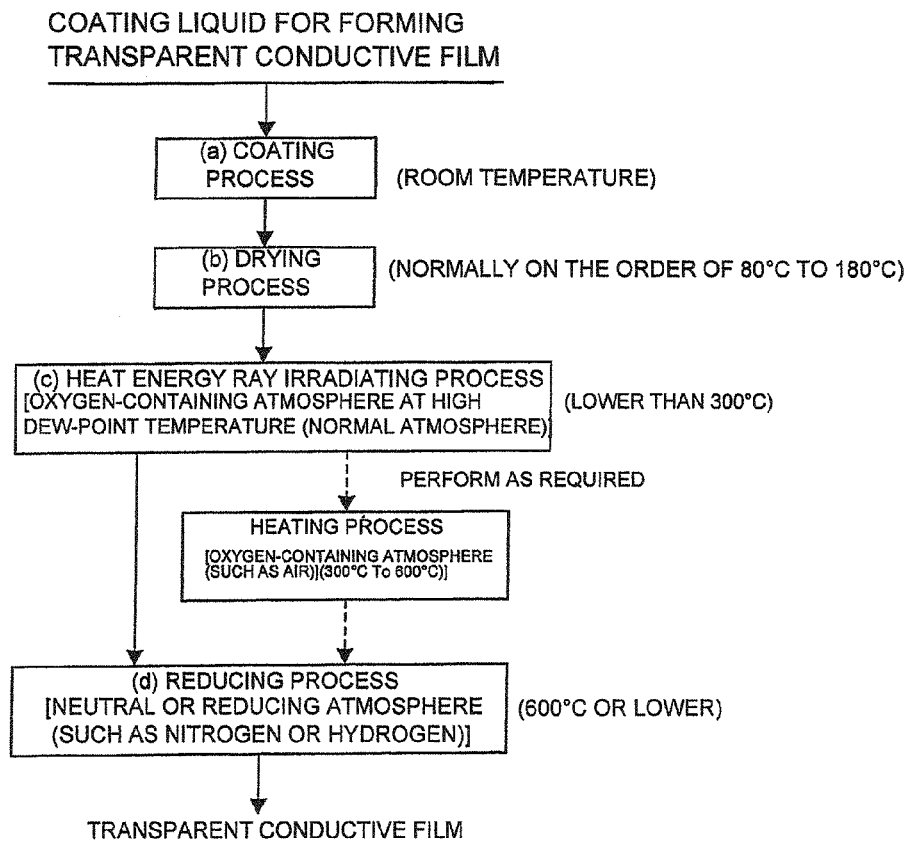
FIG. 12 is a drawing that shows an example of a transparent conductive film manufacturing process flow with the conventional coating method (a heat energy ray irradiating process is performed under an oxygen-containing atmosphere at high dew-point temperature).

The transparent conductive film was fabricated by using the coating liquid for forming transparent conductive film used in Example 1, based on a manufacturing process flow shown in FIG. 12 (a heating process was not performed between the heat energy ray irradiating process and the reducing process).

Figure 2:
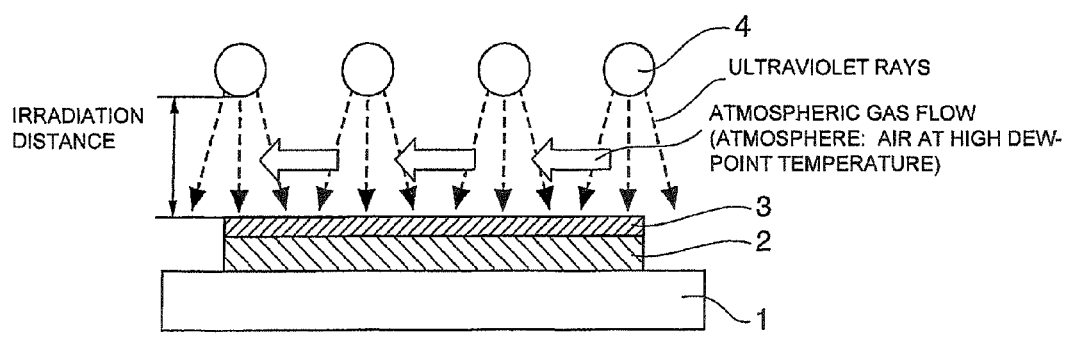
FIG. 2 is a schematic view showing an example of a heat energy ray irradiating process in a transparent conductive film manufacturing process in a conventional coating method.
Figure 3:
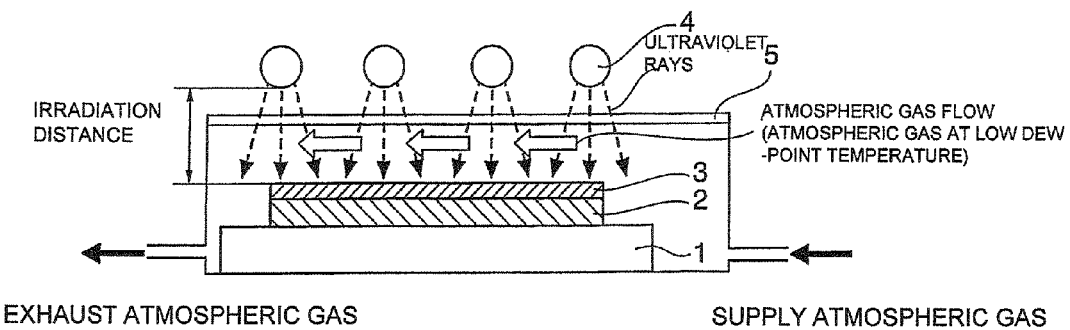
FIG. 3 is a schematic view showing another example of a heat energy ray irradiating process in a transparent conductive film manufacturing process with a coating method according to the present invention.

After obtaining the dried coating film (film thickness: 700 nm, surface resistivity: >1×10$^{13}$ Ω/sq (insulated)) similar to that of Example 1, as shown in the schematic view of FIG. 2, the temperature was increased to 200° C. (temperature elevation rate: 40° C./minute). While the temperature was being heated to 200° C. in the normal atmosphere (a dew-point temperature of 18° C.), irradiation of heat energy rays from the low-pressure mercury lamp 4 for twenty minutes was performed (the distance between the low-pressure mercury lamp 4 and the substrate 2, that is, the irradiation distance, was 20 mm, illuminance of light of 254 nm was approximately 17 mW/cm$^2$, estimated illuminance of light of 185 nm was approximately 5 mW/cm$^2$, and the average velocity of flow of air flowing between the substrate 2 and the low-pressure mercury lamp 4 [normal atmosphere: a dew-point temperature of 18° C.]=approximately 0.2 m/second) to promote mineralization of the dried coating film 3 (decomposition or burning of organic components) (the film thickness at this stage: 205 nm). Next, as in the schematic view of FIG. 11, as a heating process under the reducing atmosphere without performing energy ray irradiation, a heating process was performed at 230° C. for sixty minutes under 1% hydrogen-99% nitrogen (3 litters/minute supply and the average velocity of flow of the gas over the substrate was approximately 0.045 m/second) thereby fabricating a transparent conductive film (film thickness: 185 nm) according to Comparative Example 2.

Conditions of manufacturing a transparent conductive film and thicknesses of the dried coating film and the inorganic film are shown in Table 1. Also, various characteristics of the fabricated transparent insulating film were measured in a manner similar to that of Example 1, and the results are shown in Table 2.

Furthermore, when a cross section of the transparent conductive film of Comparative Example 2 was observed with a transmission electron microscope, from its transmission electron microscope photographs (TEM images) and Z contrast image, it has been found that the transparent conductive film is configured of a conductive oxide fine-particle layer packed with conductive oxide fine particles formed mainly with ITO fine particles (amorphous microcrystals) equal to or smaller than 3 nm. However, the conductive oxide fine-particle layer had a lower degree of density compared with the conductive oxide fine-particle layer obtained by using air having a low dew-point temperature in the heat energy ray irradiating process.

Comparative Example 3

The transparent conductive film was fabricated by using the coating liquid for forming transparent conductive film used in Example 2, based on the manufacturing process flow shown in FIG. 10 (without a heat energy ray irradiating process).

After obtaining the dried coating film (film thickness: 380 nm, surface resistivity: >1×10$^{13}$ Ω/sq (insulated)) similar to that of Example 2, a heat energy ray irradiating process of heating the film to 150° C. and irradiating the film with the low-pressure mercury lamp for twenty minutes was not performed. As shown in the schematic view of FIG. 11, a heating process was simply performed in the air having a dew-point temperature of −50° C. at 150° C. for twenty minutes. Next, as a heating process under the reducing atmosphere without performing energy ray irradiation, a heating process was performed under 1% hydrogen-99% nitrogen (3 litters/minute supply and the average velocity of flow of the gas over the substrate 2 was approximately 0.045 m/second) at 200° C. for sixty minutes to fabricate a transparent insulating film (film thickness: 330 nm) according to Comparative Example 3.

Conditions of manufacturing a transparent conductive film and thickness of the dried coating film are shown in Table 1. Also, various characteristics of the fabricated transparent insulating film were measured in a manner similar to that of Example 1, and the results are shown in Table 2.

Furthermore, when a cross section of the transparent insulating film of Comparative Example 2 was observed with a transmission electron microscope, mineralization of the film had hardly proceed, and conductive oxide fine particles were not observed.

Comparative Example 4

Figure 13:
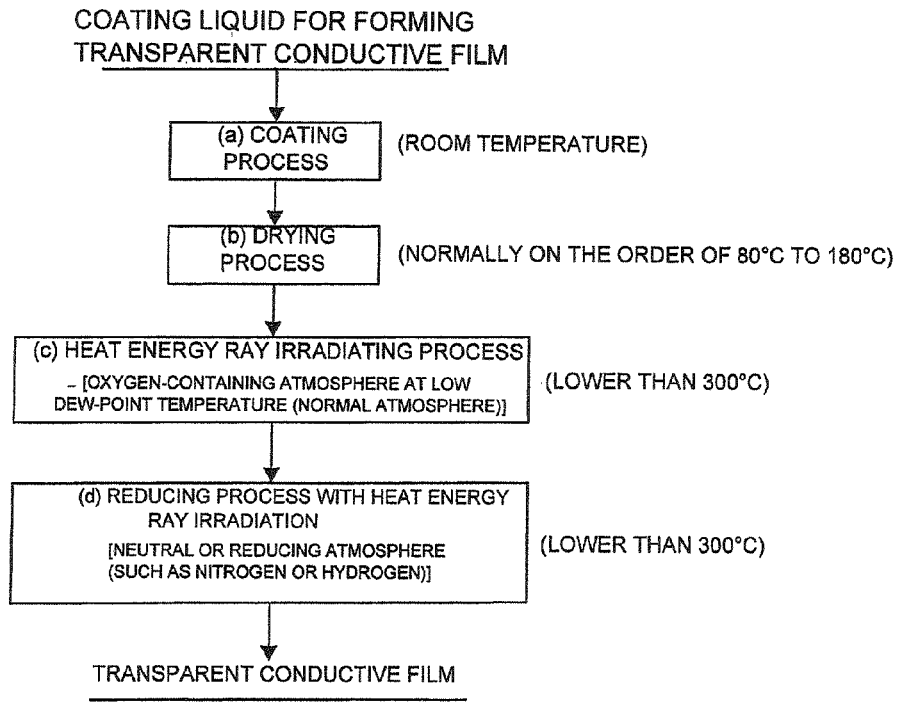
FIG. 13 is a drawing that shows another example of the transparent conductive film manufacturing process flow with the coating method (a heat energy ray irradiating process is performed under an oxygen-containing atmosphere at high dew-point temperature).

The transparent conductive film was fabricated by using the coating liquid for forming transparent conductive film used in Example 2, based on a manufacturing process flow shown in FIG. 13.

After obtaining the dried coating film (film thickness: 380 nm, surface resistivity: >1×10$^{13}$ Ω/sq (insulated)) similar to that of Example 2, as shown in the schematic view of FIG. 2, the temperature was increased to 150° C. (temperature elevation rate: 30° C./minute). In the state where 150° C. was kept in the normal atmosphere (dew-point temperature was 18° C.), irradiation of heat energy rays from the low-pressure mercury lamp 4 for twenty minutes was performed (the distance between the low-pressure mercury lamp 4 and the substrate 2, that is, the irradiation distance, was 20 mm, illuminance of light of 254 nm was approximately 17 mW/cm$^2$, estimated illuminance of light of 185 nm was approximately 5 mW/cm$^2$, and the average velocity of flow of air flowing between the substrate 2 and the low-pressure mercury lamp 4 [normal atmosphere; a dew-point temperature of 18° C.]=approximately 0.2 m/second) to promote mineralization of the dried coating film 3 (decomposition or burning of organic components) (the film thickness at this stage: 137 nm).

Next, the apparatus structure was changed as shown in the schematic view of FIG. 3 to switch the atmosphere from the normal atmosphere (dew-point temperature of 18° C.) to 1% hydrogen-99% nitrogen. Then, the temperature was increased to 200° C. (temperature elevation rate: 40° C./minute). While energy ray irradiation by the low-pressure mercury lamp was being performed, as a heating process (a reducing process) under the reducing atmosphere, a reducing treatment was performed under 1% hydrogen-99% nitrogen at a temperature of 200° C. for sixty minutes, thereby fabricating a transparent conductive film (film thickness: 125 nm) according to Comparative Example 4 having indium oxide (In$_2$O$_3$) containing dopant tin oxide (SnO$_2$), as a main component.

Note that, in the reducing treatment described above, the distance (irradiation distance) between the low-pressure mercury lamp 4 and the substrate 2 was 10.5 mm, illuminance of light of 254 nm was approximately 20 mW/cm$^2$, and estimated illuminance of light of 185 nm was approximately 5 mW/cm$^2$. Furthermore, the space between the substrate 2 and the ultraviolet ray irradiation window 5 was 3.5 mm, and the average velocity of flow of the atmospheric gas (1% hydrogen-99% nitrogen) flowing therebetween was approximately 0.29 m/sec).

Conditions of manufacturing a transparent conductive film and thicknesses of the dried coating film and the inorganic film are shown in Table 1. Also, various characteristics of the fabricated transparent insulating film were measured in a manner similar to that of Example 1, and the results are shown in Table 2.

Furthermore, when a cross section of the transparent conductive film of Comparative Example 4 was observed with a transmission electron microscope, from its transmission electron microscope photographs (TEM images) and Z contrast image, it has been found that the transparent conductive film is configured of a conductive oxide fine-particle layer packed with conductive oxide fine particles formed mainly with ITO fine particles (amorphous microcrystals) equal to or smaller than 3 nm. However, the conductive oxide fine-particle layer had a lower degree of density compared with the conductive oxide fine-particle layer obtained by using air having a low dew-point temperature in the heat energy ray irradiating process.

Comparative Example 5

Figure 14:
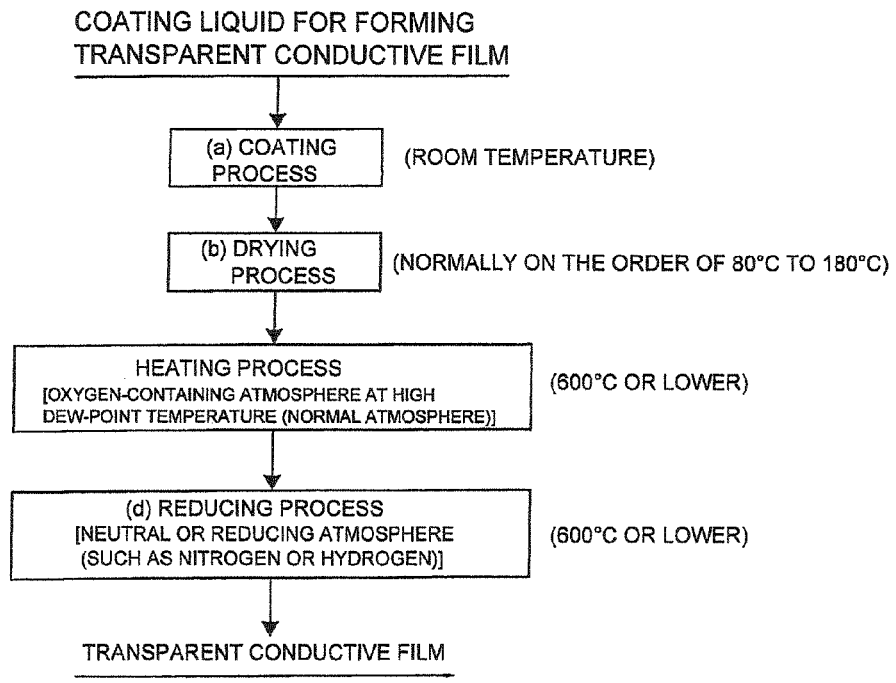
FIG. 14 is a drawing that shows an example of the transparent conductive film manufacturing process flow with the conventional coating method (a heat energy ray irradiating process is not performed).

The transparent conductive film was fabricated by using the coating liquid for forming transparent conductive film used in Example 3, based on a manufacturing process flow shown in FIG. 14 (without a heat energy ray irradiating process).

That is, after obtaining the dried coating film (film thickness: approximately 380 nm, surface resistivity: >1×10$^{13}$ Ω/sq (insulated)) similar to that of Example 3, a heat energy ray irradiating process of heating the film to 150° C. and irradiating the film with the low-pressure mercury lamp for twenty minutes was not performed. As shown in the schematic view of FIG. 11, as a heating process simply in the normal atmosphere (a dew-point temperature of 11° C.), a heating process was performed at 500° C. for fifteen minutes (3 litters/minute supply and the average velocity of flow of the gas over the substrate 2 was approximately 0.045 m/second). Subsequently, as a heating process under the reducing atmosphere, a heating process was performed under 1% hydrogen-99% nitrogen (3 litters/minute supply and the average velocity of flow of the gas over the substrate 2 was approximately 0.045 m/second) at 500° C. for fifteen minutes to fabricate a transparent conductive film (film thickness: 105 nm) according to Comparative Example 5 having indium oxide (In$_2$O$_3$) containing dopant tin oxide (SnO$_2$), as a main component.

Conditions of manufacturing a transparent conductive film and thickness of the dried coating film are shown in Table 1. Also, various characteristics of the fabricated transparent insulating film were measured in a manner similar to that of Example 1, and the results are shown in Table 2.

Furthermore, when a cross section of the transparent conductive film of Comparative Example 5 was observed with a transmission electron microscope, from its transmission electron microscope photographs (TEM images) and Z contrast image, it has been found that the transparent conductive film is configured of a conductive oxide fine-particle layer packed with conductive oxide fine particles formed mainly with ITO fine particles (microcrystal particles) on the order of 20 nm to 30 nm. However, the conductive oxide fine-particle layer had a lower degree of density compared with the conductive oxide fine-particle layer obtained by using air having a low dew-point temperature in the heat energy ray irradiating process.

Comparative Example 6

The transparent conductive film was fabricated by using the coating liquid for forming transparent conductive film used in Example 3, based on the manufacturing process flow shown in FIG. 10 (without a heat energy ray irradiating process).

That is, after obtaining the dried coating film (film thickness: approximately 380 nm, surface resistivity: >1×10$^{13}$ Ω/sq (insulated)) similar to that of Example 3, a heat energy ray irradiating process of heating the film to 150° C. and irradiating the film with the low-pressure mercury lamp for twenty minutes was not performed. As shown in the schematic view of FIG. 11, as a heating process simply in a low-humidity air having a dew-point temperature of −60° C., a heating process was performed at 500° C. for fifteen minutes (3 litters/minute supply and the average velocity of flow of the gas over the substrate 2 was approximately 0.045 m/second). Subsequently, as a heating process under the reducing atmosphere, a heating process was performed under 1% hydrogen-99% nitrogen (3 litters/minute supply and the average velocity of flow of the gas over the substrate 2 was approximately 0.045 m/second) at 500° C. for fifteen minutes to fabricate a transparent conductive film (film thickness: 85 nm) according to Comparative Example 5 having indium oxide (In$_2$O$_3$) containing dopant tin oxide (SnO$_2$), as a main component.

Conditions of manufacturing a transparent conductive film and thickness of the dried coating film are shown in Table 1. Also, various characteristics of the fabricated transparent insulating film were measured in a manner similar to that of Example 1, and the results are shown in Table 2.

Furthermore, when a cross section of the transparent conductive film of Comparative Example 6 was observed with a transmission electron microscope, from its transmission electron microscope photographs (TEM images) and Z contrast image, it has been found that the transparent conductive film is configured of a conductive oxide fine-particle layer packed with conductive oxide fine particles formed mainly with ITO fine particles (microcrystal particles) on the order of 20 nm to 30 nm. However, the conductive oxide fine-particle layer had a lower degree of density compared with the conductive oxide fine-particle layer obtained by using air having a low dew-point temperature in the heat energy ray irradiating process.

Comparative Example 7

The transparent conductive film was fabricated by using the coating liquid for forming transparent conductive film used in Example 3, based on the manufacturing process flow shown in FIG. 12 (a heating process was performed between the heat energy ray irradiating process and the reducing process).

That is, after obtaining the dried coating film (film thickness: approximately 380 nm, surface resistivity: >1×10$^{13}$ Ω/sq (insulated)) similar to that of Example 3, in the heat energy ray irradiating process, in place of low-humidity air having a dew-point temperature of −60° C., high-humidity air [normal atmosphere; a dew-point temperature of 11° C.] was used to promote mineralization of the dried coating film 3 (decomposition or burning of organic components) (the film thickness at this stage: 132 nm). Other than this, the procedure was performed in a manner similar to that of Example 3 to fabricate a transparent conductive film (film thickness: 90 nm) according to Comparative Example 7 having indium oxide (In$_2$O$_3$) containing dopant tin oxide (SnO$_2$), as a main component.

Conditions of manufacturing a transparent conductive film and thicknesses of the dried coating film and the inorganic film are shown in Table 1. Also, various characteristics of the fabricated transparent insulating film were measured in a manner similar to that of Example 1, and the results are shown in Table 2.

Furthermore, when a cross section of the transparent conductive film of Comparative Example 7 was observed with a transmission electron microscope, from its transmission electron microscope photographs (TEM images) and Z contrast image, it has been found that the transparent conductive film is configured of a conductive oxide fine-particle layer densely packed with conductive oxide fine particles formed mainly with ITO fine particles (microcrystal particles) on the order of 20 nm to 30 nm and having a special structure in which regions (oriented regions) having the conductive oxide fine particles oriented with the same crystal orientation are adjacent to each other. However, the conductive oxide fine-particle layer had a lower degree of density compared with the conductive oxide fine-particle layer obtained by using air having a low dew-point temperature in the heat energy ray irradiating process.

Comparative Example 8

The transparent conductive film was fabricated by using the coating liquid for forming transparent conductive film used in Example 4, based on the manufacturing process flow shown in FIG. 12 (a heating process was not performed between the heat energy ray irradiating process and the reducing process).

That is, after obtaining the dried coating film (film thickness: approximately 380 nm, surface resistivity: >1×10$^{13}$ Ω/sq (insulated)) similar to that of Example 4, in the heat energy ray irradiating process, in place of low-humidity air having a dew-point temperature of −60° C., high-humidity air [normal atmosphere; a dew-point temperature of 11° C.] was used to promote mineralization of the dried coating film 3 (decomposition or burning of organic components) (the film thickness at this stage: 132 nm). Other than this, the procedure was performed in a manner similar to that of Example 4 to fabricate a transparent conductive film (film thickness: 92 nm) according to Comparative Example 8 having indium oxide (In$_2$O$_3$) containing dopant tin oxide (SnO$_2$), as a main component.

Conditions of manufacturing a transparent conductive film and thicknesses of the dried coating film and the inorganic film are shown in Table 1. Also, various characteristics of the fabricated transparent insulating film were measured in a manner similar to that of Example 1, and the results are shown in Table 2.

Furthermore, when a cross section of the transparent conductive film of Comparative Example 8 was observed with a transmission electron microscope, from its transmission electron microscope photographs (TEM images) and Z contrast image, it has been found that the transparent conductive film is configured of a conductive oxide fine-particle layer densely packed with conductive oxide fine particles formed mainly with ITO fine particles (microcrystal particles) on the order of 20 nm to 30 nm and having a special structure in which regions (oriented regions) having the conductive oxide fine particles oriented with the same crystal orientation are adjacent to each other. However, the conductive oxide fine-particle layer had a lower degree of density compared with the conductive oxide fine-particle layer obtained by using air having a low dew-point temperature in the heat energy ray irradiating process.

Comparative Example 9

The transparent conductive film was fabricated by using the coating liquid for forming transparent conductive film used in Example 5, based on the manufacturing process flow shown in FIG. 12 (a heating process was performed between the heat energy ray irradiating process and the reducing process).

That is, after obtaining the dried coating film (film thickness: approximately 300 nm, surface resistivity: >1×10$^{13}$ Ω/sq (insulated)) similar to that of Example 5, in the heat energy ray irradiating process, in place of low-humidity air having a dew-point temperature of −40° C., high-humidity air [normal atmosphere; a dew-point temperature of 15° C.] was used to promote mineralization of the dried coating film 3 (decomposition or burning of organic components) (the film thickness at this stage: 100 nm). Next, energy ray irradiation was not performed and, in a heating process in the air at 500° C. for fifteen minutes, in place of a low-humidity air having a dew-point temperature of −40° C., high-humidity air [normal atmosphere; a dew-point temperature of 15° C.] was used. Other that that, the procedure was performed in a manner similar to that of Example 5 to fabricate a transparent conductive film (film thickness: 75 nm) according to Comparative Example 9 having tin oxide (SnO$_2$) containing dopant antimony oxide, as a main component.

Conditions of manufacturing a transparent conductive film and thicknesses of the dried coating film and the inorganic film are shown in Table 1. Also, various characteristics of the fabricated transparent conductive film were next measured in a manner similar to that of Example 1, and the results are shown in Table 2.

Note that, when a cross section of the transparent conductive film of Comparative Example 9 was observed with a transmission electron microscope, from its transmission electron microscope photographs (TEM images) and Z contrast image, it has been found that the transparent conductive film is configured of a conductive oxide fine-particle layer densely packed with conductive oxide fine particles formed mainly with ATO fine particles (microcrystal particles) on the order of 5 nm to 10 nm and having a special structure in which regions (oriented regions) having the conductive oxide fine particles oriented with the same crystal orientation are adjacent to each other. However, the conductive oxide fine-particle layer had a lower degree of density compared with the conductive oxide fine-particle layer obtained by using air having a low dew-point temperature in the heat energy ray irradiating process.

Comparative Example 10

The transparent conductive film was fabricated by using the coating liquid for forming transparent conductive film used in Example 6, based on the manufacturing process flow shown in FIG. 12 (a heating process was performed between the heat energy ray irradiating process and the reducing process).

That is, after obtaining the dried coating film (film thickness: approximately 560 nm, surface resistivity: >1×1013 Ω/sq (insulated)) similar to that of Example 6, in the heat energy ray irradiating process, in place of low-humidity air having a dew-point temperature of −40° C., high-humidity air [normal atmosphere; a dew-point temperature of 15° C.] was used to promote mineralization of the dried coating film 3 (decomposition or burning of organic components) (the film thickness at this stage: 220 nm). Next, energy ray irradiation was not performed and, in a heating process in the air at 500° C. for fifteen minutes, in place of a low-humidity air having a dew-point temperature of −40° C., high-humidity air [normal atmosphere; a dew-point temperature of 15° C.] was used. Other than that, the procedure was performed in a manner similar to that of Example 6 to fabricate a transparent conductive film (film thickness: 170 nm) according to Comparative Example 10 having zinc oxide (ZnO$_2$) containing dopant aluminum oxide (Al$_2$O$_3$), as a main component.

Conditions of manufacturing a transparent conductive film and thickness of the dried coating film are shown in Table 1. Also, various characteristics of the fabricated transparent conductive film were next measured in a manner similar to that of Example 1, and the results are shown in Table 2.

Note that, when a cross section of the transparent conductive film of Comparative Example 10 was observed with a transmission electron microscope, from its transmission electron microscope photographs (TEM images) and Z contrast image, it has been found that the transparent conductive film is configured of a conductive oxide fine-particle layer densely packed with conductive oxide fine particles formed mainly with AZO fine particles (microcrystal particles) on the order of 20 nm to 30 nm and having a special structure in which regions (oriented regions) having the conductive oxide fine particles oriented with the same crystal orientation are adjacent to each other. However, the conductive oxide fine-particle layer had a lower degree of density compared with the conductive oxide fine-particle layer obtained by using air having a low dew-point temperature in the heat energy ray irradiating process.

Comparative Example 11

[Fabrication of the Transparent Conductive Film]

The transparent conductive film was fabricated by using the coating liquid for forming transparent conductive film used in Example 7, based on the manufacturing process flow shown in FIG. 4.

That is, in Example 7, in place of low-humidity airs having various dew-point temperatures of −10° C., −15° C., −30° C., and −50° C., high-humidity airs having various dew-point temperatures of 20° C., 5° C., and −5° C. were used. Other than that, a film was formed in a manner similar to that of Example 7 to fabricate a transparent conductive film according to Comparative Example 11 having indium oxide (In$_2$O$_3$) containing dopant tin oxide (SnO$_2$), as a main component.

Note that the air atmospheres having various dew-point temperatures of 20° C., 5° C., and −5° C. described above are each obtained by supplying a predetermined rate of flow of air having a dew-point temperature of 20° C. and a predetermined rate of flow of air having a dew-point temperature of −60° C. and mixing these airs well.

Conditions of manufacturing a transparent conductive film and thicknesses of the dried coating film and the various inorganic films are shown in Table 1. Also, various characteristics of the fabricated various transparent conductive films were measured in a manner similar to that of Example 1, and the results are shown in Table 2. Note that the results of film thickness, surface resistivity, specific resistance, and crystallite size of each of the various transparent conductive films are shown in FIG. 6, FIG. 7, FIG. 8, and FIG. 9, respectively.

Furthermore, when a cross section of each of the various transparent conductive films of Comparative Example 11 was observed with a transmission electron microscope, from its transmission electron microscope photographs (TEM images) and Z contrast image, it has been found that the transparent conductive film is configured of a conductive oxide fine-particle layer packed with conductive oxide fine particles formed mainly with ITO fine particles (microcrystal particles) on the order of 20 nm to 30 nm. However, the conductive oxide fine-particle layer had a lower degree of density compared with the conductive oxide fine-particle layer obtained by using air having a low dew-point temperature in the heat energy ray irradiating process.

Comparative Example 12

The transparent conductive film was fabricated by using the coating liquid for forming transparent conductive film used in Example 1, based on the manufacturing process flow shown in FIG. 10 (without the heat energy ray irradiating process).

That is, after obtaining the dried coating film 3 (film thickness: approximately 540 nm, surface resistivity: >1×10$^{13}$ Ω/sq (insulated)) similar to that of Example 9, a heat energy ray irradiating process of heating the film to 150° C. and irradiating the film with the low-pressure mercury lamp for twenty minutes was not performed. As shown in the schematic view of FIG. 11, as a heating process simply in the low-humidity air having a dew-point temperature of −55° C., a heating process was performed at 290° C. for thirty minutes (5 litters/minute supply and the average velocity of flow of the gas over the substrate 2 was approximately 0.075 m/second). Subsequently, as a heating process under the reducing atmosphere, a heating process was performed under 1% hydrogen-99% nitrogen (5 litters/minute supply and the average velocity of flow of the gas over the substrate 2 was approximately 0.075 m/second) at 290° C. for thirty minutes to fabricate a transparent conductive film (film thickness: 95 nm) according to Comparative Example 12 having indium oxide (In$_2$O$_3$) containing a dopant tin oxide (SnO$_2$), as a main component.

Conditions of manufacturing a transparent conductive film and thickness of the dried coating film are shown in Table 1. Also, various characteristics of the fabricated transparent conductive film were next measured in a manner similar to that of Example 1, and the results are shown in Table 2.

Furthermore, when a cross section of the transparent conductive film of Comparative Example 12 was observed with a transmission electron microscope, from its transmission electron microscope photographs (TEM images) and Z contrast image, it has been found that the transparent conductive film is configured of a conductive oxide fine-particle layer packed with conductive oxide fine particles formed mainly with ITO fine particles (microcrystal particles) on the order of 20 nm to 30 nm. However, the conductive oxide fine-particle layer had a lower degree of density compared with the conductive oxide fine-particle layer obtained by using air having a low dew-point temperature in the heat energy ray irradiating process.

TABLE 1

| | DRYING PROCESS | | HEAT ENERGY RAY IRRADIATING PROCESS | | | |
|---|---|---|---|---|---|---|
| | DRYING TEMPERATURE [° C.] | FILM THICKNESS OF DRIED COATING FILM [nm] | PRESENT OR ABSENT | DEW-POINT TEMPERATURE [° C.] | HEATING TEMPERATURE [° C.] | FILM THICKNESS OF INORGANIC FILM [nm] |
| EXAMPLE 1 | 180 | 700 | PRESENT | −50 | 200 | 170 |
| EXAMPLE 2 | 150 | 380 | PRESENT | −50 | 150 | 115 |
| EXAMPLE 3 | 150 | 380 | PRESENT | −60 | 150 | 110 |
| EXAMPLE 4 | 150 | 380 | PRESENT | −60 | 150 | 110 |
| EXAMPLE 5 | 180 | 300 | PRESENT | −40 | 150 | 80 |
| EXAMPLE 6 | 180 | 560 | PRESENT | −40 | 150 | 180 |
| EXAMPLE 7 | 150 | 415 | PRESENT | −10 | 150 | 130 |
| | | | | −15 | 150 | 125 |
| | | | | −30 | 150 | 120 |
| | | | | −50 | 150 | 120 |
| EXAMPLE 8 | 150 | 540 | PRESENT | −55 | 40 (NO HEATING BY HEATING APPARATUS) | 160 |
| EXAMPLE 9 | 150 | 540 | PRESENT | −55 | 150 | 108 |
| COMPARATIVE EXAMPLE 1 | 180 | 700 | ABSENT | — | — | — |

TABLE 1-continued

| | | | | | | |
|---|---|---|---|---|---|---|
| COMPARATIVE EXAMPLE 2 | 180 | 700 | PRESENT | 18 | 200 | 205 |
| COMPARATIVE EXAMPLE 3 | 150 | 380 | ABSENT | — | — | — |
| COMPARATIVE EXAMPLE 4 | 150 | 380 | PRESENT | 18 | 150 | 137 |
| COMPARATIVE EXAMPLE 5 | 150 | 380 | ABSENT | — | — | — |
| COMPARATIVE EXAMPLE 6 | 150 | 380 | ABSENT | — | — | — |
| COMPARATIVE EXAMPLE 7 | 150 | 380 | PRESENT | 11 | 150 | 132 |
| COMPARATIVE EXAMPLE 8 | 150 | 380 | PRESENT | 11 | 150 | 132 |
| COMPARATIVE EXAMPLE 9 | 180 | 300 | PRESENT | 15 | 150 | 100 |
| COMPARATIVE EXAMPLE 10 | 180 | 560 | PRESENT | 15 | 150 | 220 |
| COMPARATIVE EXAMPLE 11 | 150 | 415 | PRESENT | 20 | 150 | 150 |
| | | | | 5 | 150 | 140 |
| | | | | −5 | 150 | 135 |
| COMPARATIVE EXAMPLE 12 | 150 | 540 | ABSENT | — | — | — |

| | HEATING PROCESS | | | REDUCING PROCESS | |
|---|---|---|---|---|---|
| | PRESENT OR ABSENT | DEW-POINT TEMPERATURE [° C.] | HEATING TEMPERATURE [° C.] | HEAT ENERGY RAY IRRADIATION | HEATING TEMPERATURE [° C.] |
| EXAMPLE 1 | ABSENT | — | — | ABSENT | 230 |
| EXAMPLE 2 | ABSENT | — | — | PRESENT | 200 |
| EXAMPLE 3 | PRESENT | −60 | 500 | ABSENT | 500 |
| EXAMPLE 4 | ABSENT | — | — | ABSENT | 500 |
| EXAMPLE 5 | PRESENT | −40 | 500 | ABSENT | 500 |
| EXAMPLE 6 | PRESENT | −40 | 500 | ABSENT | 500 |
| EXAMPLE 7 | PRESENT | −60 | 280 | ABSENT | 280 |
| EXAMPLE 8 | PRESENT | −55 | 250 | ABSENT | 250 |
| EXAMPLE 9 | PRESENT | −55 | 290 | ABSENT | 290 |
| COMPARATIVE EXAMPLE 1 | PRESENT | −50 | 200 | ABSENT | 230 |
| COMPARATIVE EXAMPLE 2 | ABSENT | — | — | ABSENT | 230 |
| COMPARATIVE EXAMPLE 3 | PRESENT | −50 | 150 | ABSENT | 200 |
| COMPARATIVE EXAMPLE 4 | ABSENT | — | — | PRESENT | 200 |
| COMPARATIVE EXAMPLE 5 | PRESENT | 11 | 500 | ABSENT | 500 |
| COMPARATIVE EXAMPLE 6 | PRESENT | −60 | 500 | ABSENT | 500 |
| COMPARATIVE EXAMPLE 7 | PRESENT | −60 | 500 | ABSENT | 500 |
| COMPARATIVE EXAMPLE 8 | ABSENT | — | — | ABSENT | 500 |
| COMPARATIVE EXAMPLE 9 | PRESENT | 15 | 500 | ABSENT | 500 |
| COMPARATIVE EXAMPLE 10 | PRESENT | 15 | 500 | ABSENT | 500 |
| COMPARATIVE EXAMPLE 11 | PRESENT | −60 | 280 | ABSENT | 280 |
| COMPARATIVE EXAMPLE 12 | PRESENT | −55 | 290 | ABSENT | 290 |

TABLE 2

| | SURFACE RESISTIVITY [Ω/sq] | VISIBLE LIGHT TRANSMITTANCE (NOTE 1) | HAZE VALUE [%] | FILM THICKNESS [nm] | SPECIFIC RESISTANCE (NOTE 2) [mΩ · cm] | CRYSTALLITE SIZE [nm] | PENCIL HARDNESS |
|---|---|---|---|---|---|---|---|
| EXAMPLE 1 | 800 | 99.0 | 0.35 | 155 | 12.4 | 11 | EQUAL TO OR HARDER THAN 5H |

TABLE 2-continued

|  | SURFACE RESISTIVITY [Ω/sq] | VISIBLE LIGHT TRANSMITTANCE (NOTE 1) | HAZE VALUE [%] | FILM THICKNESS [nm] | SPECIFIC RESISTANCE (NOTE 2) [mΩ·cm] | CRYSTALLITE SIZE [nm] | PENCIL HARDNESS |
|---|---|---|---|---|---|---|---|
| EXAMPLE 2 | 1300 | 95.0 | 0.26 | 105 | 13.9 | <3 (AMORPHOUS) | EQUAL TO OR HARDER THAN 5H |
| EXAMPLE 3 | 80 | 94.4 | 0.2 | 76 | 0.61 | 64.5 | EQUAL TO OR HARDER THAN 5H |
| EXAMPLE 4 | 90 | 97.4 | 0.22 | 81 | 0.73 | 59.5 | EQUAL TO OR HARDER THAN 5H |
| EXAMPLE 5 | 3500 | 93.2 | 0.26 | 60 | 21 | 17.5 | EQUAL TO OR HARDER THAN 5H |
| EXAMPLE 6 | 9800 | 96.3 | 0.53 | 140 | 137.2 | 59 | EQUAL TO OR HARDER THAN 5H |
| EXAMPLE 7 | 300 | 95.5 | 0.26 | 107 | 3.21 | 33 | 2H |
|  | 250 | 95.1 | 0.23 | 105 | 2.63 | 35 | 4H |
|  | 220 | 94.4 | 0.35 | 100 | 2.2 | 38 | EQUAL TO OR HARDER THAN 5H |
|  | 225 | 93.9 | 0.27 | 100 | 2.25 | 39 | EQUAL TO OR HARDER THAN 5H |
| EXAMPLE 8 | 400 | 91.3 | 0.23 | 90 | 3.6 | <3 (AMORPHOUS) | EQUAL TO OR HARDER THAN 5H |
| EXAMPLE 9 | 190 | 91.4 | 0.28 | 86 | 1.6 | <3 (AMORPHOUS) | EQUAL TO OR HARDER THAN 5H |
| COMPARATIVE EXAMPLE 1 | >10$^{13}$ | 99.0 | 0.73 | 600 | — | <3 (AMORPHOUS) | SOFTER THAN HB |
| COMPARATIVE EXAMPLE 2 | 5 × 10$^5$ | 98.3 | 0.27 | 185 | 9250 | <3 (AMORPHOUS) | SOFTER THAN HB |
| COMPARATIVE EXAMPLE 3 | >10$^{13}$ | 99.7 | 0.66 | 330 | — | <3 (AMORPHOUS) | SOFTER THAN HB |
| COMPARATIVE EXAMPLE 4 | 6 × 10$^5$ | 96.5 | 0.3 | 125 | 7500 | <3 (AMORPHOUS) | SOFTER THAN HB |
| COMPARATIVE EXAMPLE 5 | 295 | 99.0 | 0.3 | 105 | 3.1 | 17 | SOFTER THAN HB |
| COMPARATIVE EXAMPLE 6 | 135 | 96.5 | 0.28 | 85 | 1.15 | 26.5 | EQUAL TO OR HARDER THAN 5H |
| COMPARATIVE EXAMPLE 7 | 120 | 97.4 | 0.1 | 90 | 1.08 | 38 | SOFTER THAN HB |
| COMPARATIVE EXAMPLE 8 | 140 | 98.0 | 0.29 | 92 | 1.29 | 34.5 | SOFTER THAN HB |
| COMPARATIVE EXAMPLE 9 | 4 × 10$^5$ | 95.0 | 0.32 | 75 | 3000 | 10.5 | SOFTER THAN HB |
| COMPARATIVE EXAMPLE 10 | 6 × 10$^5$ | 98.9 | 0.61 | 170 | 10200 | 35.5 | SOFTER THAN HB |
| COMPARATIVE EXAMPLE 11 | 550 | 97.0 | 0.32 | 120 | 6.6 | 25 | SOFTER THAN HB |
|  | 490 | 96.2 | 0.28 | 115 | 5.64 | 27 | SOFTER THAN HB |
|  | 400 | 95.8 | 0.25 | 110 | 4.4 | 30 | SOFTER THAN HB |
| COMPARATIVE EXAMPLE 12 | 240 | 96.0 | 0.21 | 95 | 2.3 | <3 (AMORPHOUS) | EQUAL TO OR HARDER THAN 5H |

(NOTE 1): WHEN TRANSPARENT CONDUCTIVE FILM IS FORMED ON SURFACE OF BASE MATERIAL AND REFLECTIVITY OF SURFACE WHERE TRANSPARENT CONDUCTIVE FILM IS BE FORMED BECOMES LOWER THAN REFLECTIVITY OF SURFACE OF BASE MATERIAL (WHEN A LOW REFLECTIVE FUNCTION IS PROVIDED DUE TO FORMATION OF TRANSPARENT CONDUCTIVE FILM), APPARENT TRANSMITTANCE OF TRANSPARENT CONDUCTIVE FILM MAY EXCEED 100%.
(NOTE 2): SPECIFIC RESISTANCE (Ω·cm) = SURFACE RESISTIVITY VALUE (Ω/sq) × FILM THICKNESS (cm)

Figure 15:
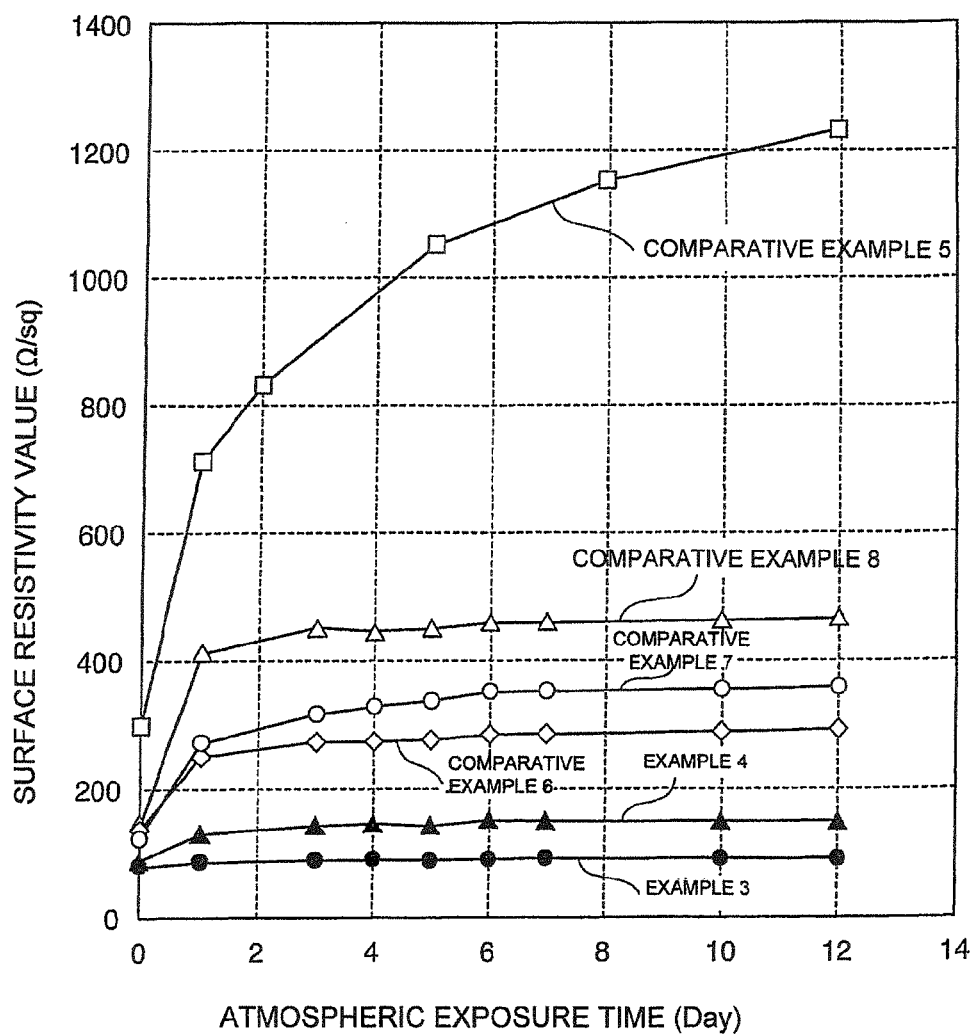
FIG. 15 is a drawing that shows changes with time in surface resistivity value of transparent conductive films of Examples 3 and 4 and Comparative Examples 5 to 8 of the present invention as being exposed in the atmosphere.

Furthermore, stability of resistance values was evaluated for each of the transparent conductive films of Examples 3 and 4 and Comparative Examples 5 to 8, and the results are shown in FIG. 15.

The evaluations of stability of the resistance value are represented by examining changes in surface resistivity with time, with the transparent conductive substrates having the transparent conductive films according to Examples 3 and 4 and the transparent conductive substrates having the transparent conductive films according to Comparative Examples 5 to 8 being exposed indoors (in the atmosphere) at a temperature of 23° C. to 25° C. and a relative humidity of 50% to 70% for approximately two weeks.

Figure 16:
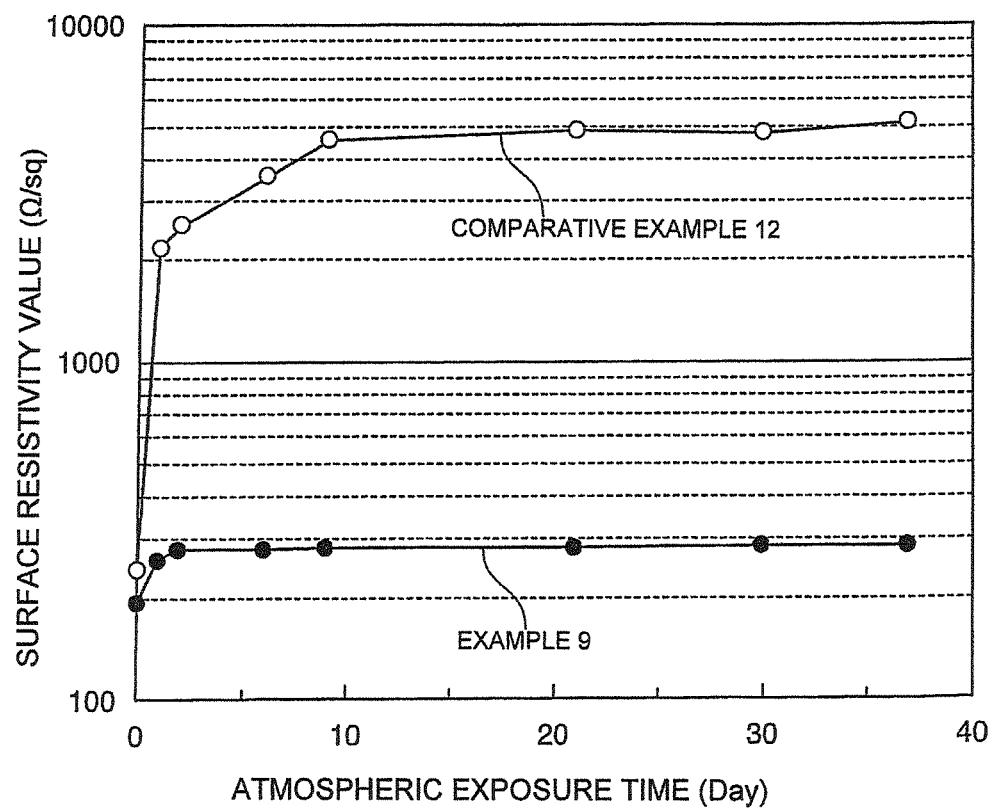
FIG. 16 is a drawing that shows changes with time in surface resistivity value of transparent conductive films of Example 9 and Comparative Example 12 of the present invention as being exposed in the atmosphere.

Also, stability of resistance values was evaluated for each of the transparent conductive films of Example 9 and Comparative Example 12, and the results are shown in FIG. 16.

The evaluations of stability of the resistance value are represented by examining changes in surface resistivity with time, with the transparent conductive substrates having the transparent conductive film according to Example 9 and the transparent conductive substrate having the transparent conductive film according to Comparative Example 12 being exposed indoors (in the atmosphere) at a temperature of 23° C. to 25° C. and a relative humidity of 50% to 70% for approximately five weeks.

When Example 1 and Comparative Examples 1 and 2, and Example 2 Comparative Example 3 and 4 in Table 1 are compared with each other, the following can be found. In Examples 1 and 2, since the heat energy ray irradiating process was performed in the air having a low dew-point temperature, mineralization of the film proceeded to produce a conductive oxide fine-particle layer formed of conductive oxide fine particles. Also, in the course of formation (mineralization) of the conductive oxide fine-particle layer, densification was promoted to produce a transparent conductive film having the conductive oxide fine-particle layer densely packed with conductive oxide fine particles, and achieve excellent film strength (pencil hardness). By contrast, in Comparative Examples 1 and 3, since the heat energy ray irradiating process was not performed, mineralization of the film hardly proceeded to produce a transparent insulating film without densification, and its film strength (pencil hardness) was significantly low.

It can also be found that, in Comparative Examples 2 and 4, since the heat energy ray irradiating process was performed in the air atmosphere having a high dew-point temperature, mineralization of the film proceeded to produce a conductive oxide fine-particle layer formed of conductive oxide fine particles. However, in the course of formation (mineralization) of the conductive oxide fine-particle layer, densification was not promoted, and a transparent conductive film having the conductive oxide fine-particle layer packed with conductive oxide fine particles has a significantly low film strength (pencil hardness).

Furthermore, when Examples 3, 4, 5, and 6 and Comparative Examples 5, 7, 8, 9, and 10 in Table 1 are compared with each other, the following can be found. In any of these, the heating conditions in the reducing process are 500° C. for fifteen minutes (1 volume % hydrogen-99 volume % nitrogen atmosphere). In Examples 3, 4, 5, and 6, since the heat energy ray irradiating process was performed in the air atmosphere having a low dew-point temperature before the reducing process, mineralization of the film proceeded to produce a conductive oxide fine-particle layer formed of conductive oxide fine particles. Also, in the course of formation (mineralization) of the conductive oxide fine-particle layer, densification was promoted to produce a transparent conductive film having the conductive oxide fine-particle layer densely packed with conductive oxide fine particles, and achieve excellent film strength (pencil hardness).

By contrast, since the heating process was performed in the air atmosphere having a high dew-point temperature before the reducing process in Comparative Example 5 and since the heat energy ray irradiating process was performed in the air atmosphere having a high dew-point temperature before the reducing process in Comparative Examples 7, 8, 9, and 10, mineralization of the film proceeded to produce a conductive oxide fine-particle layer formed of conductive oxide fine particles. However, in the course of formation (mineralization) of the conductive oxide fine-particle layer, densification was not promoted, and a transparent conductive film having the conductive oxide fine-particle layer packed with conductive oxide fine particles has a significantly low film strength (pencil hardness).

When Example 7 and Comparative Example 11 in Table 1 are compared with each other, the following can be found. In Example 7, since the heat energy ray irradiating process was performed in the air atmosphere having a low dew-point temperature, mineralization of the film proceeded to produce a conductive oxide fine-particle layer formed of conductive oxide fine particles. Also, in the course of formation (mineralization) of the conductive oxide fine-particle layer, densification was promoted to produce a transparent conductive film having the conductive oxide fine-particle layer densely packed with conductive oxide fine particles, and achieve excellent film strength (pencil hardness). By contrast, in Comparative Example 11, since the heat energy ray irradiating process was performed in the air atmosphere having a high dew-point temperature, mineralization of the film proceeded to produce a conductive oxide fine-particle layer formed of conductive oxide fine particles. However, in the course of formation (mineralization) of the conductive oxide fine-particle layer, densification was not promoted, and a transparent conductive film having the conductive oxide fine-particle layer packed with conductive oxide fine particles has a significantly low film strength (pencil hardness).

Also, when Examples 1 and 2 and Comparative Examples 1 to 4 are compared with each other, the following can be found. In any of these, the heating process after the drying process was performed at 150° C. to 200° C. for twenty minutes (air atmosphere) and 200° C. to 230° C. for sixty minutes (1% hydrogen-99% nitrogen atmosphere). In Examples 1 and 2 where heat energy ray irradiation was performed in the air atmosphere having a low dew-point temperature (−50° C. and −60° C.), a low-resistant transparent conductive film of 800 Ω/sq (it reads ohm per square) to 1300 Ω/sq was obtained. By contrast, In Comparative Examples 2 and 4 where the heat energy ray irradiating process was performed in the air atmosphere having a high dew-point temperature (18° C. and 11° C.), a high-resistant transparent conductive film of $5 \times 10^5$ Ω/sq to $6 \times 10^5$ Ω/sq was obtained. In Comparative Examples 1 and 3 where the heat energy ray irradiating process was not performed, a transparent insulating film equal to or higher than $10^{13}$ Ω/sq was obtained.

When Examples 3 and 4 and Comparative Examples 5 to 8 are compared with each other, the following can be found. In any of these, the heating conditions in the reducing process are 500° C. for sixty minutes (1 volume % hydrogen-99 volume % nitrogen atmosphere). In Examples 3 and 4 where heat energy ray irradiation was performed in the air atmosphere having a low dew-point temperature before the reducing process, the transparent conductive film was obtained having low resistance of 80 Ω/sq (it reads ohm per square) to 90 Ω/sq and excellent in stability of the resistance value when exposed in the atmosphere. By contrast, in Comparative Examples 5 and 6 where the heat energy ray irradiating process was not performed before the reducing process and Comparative Examples 7 and 8 where the heat energy ray irradiating process was performed in the air atmosphere having a high dew-point temperature before the reducing process, the transparent conductive film has low conductivity of 120 Ω/sq to 295 Ω/sq and is also inferior in stability of the resistance value when exposed in the atmosphere.

Also, when Examples 5 and 6 and Comparative Examples 9 and 10 are compared with each other, the following can be found. In any of these, the heating conditions in the reducing process are 500° C. for sixty minutes (1 volume % hydrogen-99 volume % nitrogen atmosphere). In Examples 5 and 6 where heat energy ray irradiation was performed in the air atmosphere having a low dew-point temperature before the reducing process, a transparent conductive film of relatively low resistance of 3500 Ω/sq (it reads ohm per square) to 9800 Ω/sq was obtained. By contrast, in Comparative Examples 9 and 10 where the heat energy ray irradiating process was performed in the air atmosphere having a high dew-point temperature before the reducing process, the transparent conductive film has low conductivity of $4 \times 10^5$ Ω/sq to $6 \times 10^5$ Ω/sq.

Furthermore, when Example 7 and Comparative Example 11 are compared with each other, in any of these, the condition in the heating process is a temperature of 280° C. for thirty minutes (air atmosphere) and the condition in the reducing treatment is a temperature of 280° C. for sixty minutes (3 volume % hydrogen-97 volume % nitrogen atmosphere). In Comparative Example 7 where heat energy ray irradiation was performed in the air atmosphere having a low dew-point temperature before the heating process, a transparent conductive film having relatively low resistance of 220 Ω/sq (it reads ohm per square) to 300 Ω/sq was obtained. By contrast, in Comparative Example 11 where the heat energy ray irradiating process was performed in the air atmosphere having a high dew-point temperature before the reducing process, the transparent conductive film is inferior in conductivity of 400 Ω/sq to 550 Ω/sq.

Also, when Examples 1 and 2 and Comparative Examples 1 to 4 are compared with each other, the following can be found. The inorganic films of Examples 1 and 2 where heat energy ray irradiation was performed in the air atmosphere having a low dew-point temperature have film thicknesses of 170 nm and 115 nm, respectively, indicating that densification of the film proceeded in the course of mineralization in the heat energy ray irradiating process. By contrast, the inorganic films of Comparative Examples 2 and 4 where the process was performed in the air atmosphere having a high dew-point temperature have film thicknesses of 205 nm and 137 nm, respectively, indicating that densification of the film did not proceed in the course of mineralization in the heat energy ray irradiating process. From this, it can be found that, in mineralization of the dried coating film in the heat energy ray irradiating process, to obtain a dense inorganic film, heat energy ray irradiation in the air atmosphere having a low dew-point temperature is extremely effective.

And, as for the transparent conductive films finally obtained by performing the reducing treatment on the inorganic film described above, the mineralized transparent conductive films in Examples 1 and 2 where heat energy ray irradiation was performed in the air atmosphere having a low dew-point temperature have film thicknesses 155 nm and 105 nm, respectively, indicating that these films have been densified. By contrast, the mineralized transparent conductive films in Comparative Examples 2 and 4 where heat energy ray irradiation was performed in the air atmosphere having a high dew-point temperature have film thicknesses 185 nm and 125 nm, respectively, indicating that these films have not been densified. Furthermore, the transparent conductive films in Comparative Examples 1 and 3 where the heat energy ray irradiating process was not performed are transparent insulating films insufficient in mineralization, and have film thicknesses of 600 nm and 300 nm, respectively, indicating that these films are thick and have not been densified at all.

Still further, when Examples 3 and 4 and Comparative Examples 5, 7, and 8 are compared with each other, the following can be found. The inorganic films of Examples 3 and 4 where heat energy ray irradiation was performed in the air atmosphere having a low dew-point temperature have a film thickness of 110 nm, indicating that densification of the film proceeded in the course of mineralization in the heat energy ray irradiating process. By contrast, the inorganic films of Comparative Examples 7 and 8 where the process was performed in the air atmosphere having a high dew-point temperature have a film thickness of 132 nm, indicating that densification of the film did not proceed in the course of mineralization in the heat energy ray irradiating process. From this, it can be found that, in mineralization of the dried coating film in the heat energy ray irradiating process, to obtain a dense inorganic film, heat energy ray irradiation in the air atmosphere having a low dew-point temperature is extremely effective.

And, as for the transparent conductive films finally obtained by performing the reducing process on the inorganic film described above, the mineralized transparent conductive films in Examples 3 and 4 where heat energy ray irradiation was performed in the air atmosphere having a low dew-point temperature have film thicknesses 76 nm and 81 nm, respectively, indicating that these films have been densified. By contrast, the mineralized transparent conductive films in Comparative Examples 7 and 8 where heat energy ray irradiation was performed in the air atmosphere having a high dew-point temperature have film thicknesses 90 nm and 92 nm, respectively, indicating that these films have not been densified. Furthermore, the mineralized transparent conductive films in Comparative Example 5 where the heat energy ray irradiating process was not performed has a film thickness of 105 nm, indicating that the film has not been densified.

Still further, when Examples 5 and 6 and Comparative Examples 9 and 10 are compared with each other, the following can be found. The inorganic films of Examples 5 and 6 where heat energy ray irradiation was performed in the air atmosphere having a low dew-point temperature have film thicknesses of 80 nm and 180 nm, respectively, indicating that densification of the film proceeded in the course of mineralization in the heat energy ray irradiating process. By contrast, the inorganic films of Comparative Examples 9 and 10 where the process was performed in the air atmosphere having a high dew-point temperature have film thicknesses of 100 nm and 220 nm, respectively, indicating that densification of the film did not proceed in the course of mineralization in the heat energy ray irradiating process. From this, it can be found that, in mineralization of the dried coating film in the heat energy ray irradiating process, to obtain a dense inorganic film, heat energy ray irradiation in the air atmosphere having a low dew-point temperature is extremely effective.

And, as for the transparent conductive films finally obtained by performing the reducing treatment on the inorganic film described above, the mineralized transparent conductive films in Examples 5 and 6 where heat energy ray irradiation was performed in the air atmosphere having a low dew-point temperature have film thicknesses 60 nm and 140 nm, respectively, indicating that these films have been densified. By contrast, the mineralized transparent conductive films in Comparative Examples 9 and 10 where heat energy ray irradiation was performed in the air atmosphere having a high dew-point temperature have film thicknesses 75 nm and 170 nm, respectively, indicating that these films have not been densified.

Still further, when Example 7 and Comparative Example 11 are compared with each other, the following can be found. The various inorganic films of Example 7 where heat energy ray irradiation was performed in the air atmosphere having a low dew-point temperature have film thicknesses of 120 nm to 130 nm, indicating that densification of the film proceeded in the course of mineralization in the heat energy ray irradiating process. By contrast, the various inorganic films of Comparative Example 11 where the process was performed in the air atmosphere having a high dew-point temperature have film thicknesses of 135 nm to 150 nm, indicating that densification of the film did not proceed in the course of mineralization in the heat energy ray irradiating process. From this, it can be found that, in mineralization of the dried coating film in the heat energy ray irradiating process, to obtain a dense inorganic film, heat energy ray irradiation in the air atmosphere having a low dew-point temperature is extremely effective.

And, as for the transparent conductive films finally obtained by performing the reducing treatment on the inorganic film described above, the mineralized various transparent conductive films in Example 7 where heat energy ray irradiation was performed in the air atmosphere having a low dew-point temperature have film thicknesses 100 nm to 107 nm, indicating that these films have been densified. By contrast, the mineralized various transparent conductive films in Comparative Example 11 where heat energy ray irradiation was performed in the air atmosphere having a high dew-point temperature have film thicknesses 110 nm to 120 nm, indicating that these films have not been densified.

Furthermore, when Example 9 and Comparative Example 12 are compared with each other, in any of these, the condition in the heating process is a temperature of 290° C. for thirty minutes (air atmosphere) and the condition in the reducing treatment is a temperature of 290° C. for thirty minutes (1 volume % hydrogen-99 volume % nitrogen atmosphere). In Comparative Example 9 where heat energy ray irradiation was performed in the air atmosphere having a low dew-point temperature before the heating process, a transparent conductive film having relatively low resistance of 190 Ω/sq (it reads ohm per square) and excellent in stability of the resistance value was obtained. By contrast, in Comparative Example 12 where the heat energy ray irradiating process was not performed before the heating process, the transparent conductive film is inferior in conductivity of 240 Ω/sq and also in stability of the resistance value when exposed in the atmosphere.

INDUSTRIAL APPLICABILITY

The transparent conductive film according to the present invention can be formed on a substrate by using any of various inexpensive coating methods with heating at a low temperature particularly lower than 300° C. with a simple manner at low cost. The obtained transparent conductive film has both of excellent transparency and high conductivity and also is excellent in film strength. Therefore, a transparent conductive substrate having this transparent conductive film formed on a heat-resistant substrate can be expected to be used for a transparent electrode of light-emitting devices such as an LED element, an electroluminescent lamp (an electroluminescent element), and a field emission lamp; electric power generating devices such as a solar cell; display devices such as a liquid-crystal display (a liquid-crystal element), an electroluminescent display (an electroluminescent element), a plasma display, and an electronic paper element; and input devices such as a touch panel.

DESCRIPTION OF THE REFERENCE NUMERALS 1 heating apparatus (such as hot plate)
2 substrate
3 dried coating film of a coating liquid for forming transparent conductive film formed by a coating method
4 energy ray irradiation lamp (ultraviolet ray irradiation lamp)
5 ultraviolet ray irradiation window (such as a synthetic quartz plate)

What is claimed is:

1. A method of manufacturing a transparent conductive film comprising:
   coating a substrate with a coating liquid containing an organometallic compound selected from an acetylacetonate of indium, tin, or zinc and a dopant organometallic compound thereby forming a coating film;
   drying the coating film to form a dried coating film; and then
   mineralizing the dried coating film by irradiating the dried coating film with ultraviolet light while heating the dried coating film to a temperature of 100° C. to 200° C. under an air atmosphere having a dew point temperature equal to or lower than −10° C. thereby forming an inorganic film that includes a metal oxide and a dopant; and then
   flowing a reducing atmosphere over the inorganic film at a temperature of 150° C. to 600° C. thereby reducing the inorganic film and forming the transparent conductive film; wherein the reducing atmosphere includes hydrogen gas, wherein the hydrogen gas has an amount of 0.1 to 7 vol. %;
   wherein the transparent conductive film includes a metal selected from the group consisting of indium, tin, and zinc.

2. The method of manufacturing the transparent conductive film according to claim 1, wherein
   the coating liquid includes a content molar ratio between the organometallic compound and the dopant organometallic compound in a range of 99.9:0.1 to 66.7:33.3.

3. The method of manufacturing the transparent conductive film according to claim 2, wherein
   the organometallic compound is an acetylacetonate of indium, and
   the dopant organometallic compound and the dopant formed therefrom include a metal selected from the group consisting of tin, titanium, germanium, zinc, tungsten, zirconium, tantalum, niobium, hafnium, vanadium, and a mixture thereof.

4. The method of manufacturing the transparent conductive film according to claim 2, wherein
the organometallic compound is an acetylacetonate of tin, and
wherein the dopant organometallic compound is selected from the group consisting of an organic indium compound, an organic antimony compound, an organic phosphorus compound, and a mixture thereof.

5. The method of manufacturing the transparent conductive film according to claim 2, wherein
the organometallic compound is an acetylacetonate of zinc, and
wherein the dopant organometallic compound is selected from the group consisting of an organic aluminum compound, an organic indium compound, an organic gallium compound, and a mixture thereof.

6. The method of manufacturing the transparent conductive film according to claim 1, wherein
irradiating the dried coating film with ultraviolet light includes applying the ultraviolet light in a pattern shape thereby forming the inorganic film having the pattern shape.

7. The method of manufacturing the transparent conductive film according to claim 1, wherein
the inorganic film is reduced under the reducing atmosphere at the temperature of 150° C. to 300° C.

8. The method of manufacturing the transparent conductive film according to claim 7, further comprising
irradiating the inorganic film while the inorganic film is reduced under the reducing atmosphere at the temperature of 150° C. to 300° C.

9. The method of manufacturing the transparent conductive film according to claim 1, wherein
the dew-point temperature is equal to or lower than −30° C.

10. The method of manufacturing the transparent conductive film according to claim 1, wherein
the ultraviolet light has a wavelength equal to or smaller than 200 nm.

11. The method of manufacturing the transparent conductive film according to claim 10, wherein
the ultraviolet light is emitted from a low-pressure mercury lamp, an amalgam lamp, or an excimer lamp.

12. The method of manufacturing the transparent conductive film according to claim 1, wherein
the organometallic compound is indium acetylacetonate.

13. The method of manufacturing the transparent conductive film according to claim 1, wherein
coating the substrate with the coating liquid includes a method selected from an inkjet printing method, a screen printing method, a gravure printing method, an offset printing method, a flexor printing method, a dispenser printing method, a slit coating method, a die coating method, a doctor blade coating method, a wire bar coating method, a spin coating method, a dip coating method, or a spray coating method.

14. The method of manufacturing the transparent conductive film according to claim 1, wherein the amount of the hydrogen gas is 1 to 3 vol. % hydrogen gas.

* * * * *